(12) United States Patent
Hasegawa et al.

(10) Patent No.: US 10,412,842 B2
(45) Date of Patent: Sep. 10, 2019

(54) IMAGE DISPLAY DEVICE

(71) Applicant: Panasonic Intellectual Property Management Co., Ltd., Osaka (JP)

(72) Inventors: Yuichi Hasegawa, Hyogo (JP); Katsumasa Ando, Osaka (JP); Masakatsu Itou, Osaka (JP); Michael Shadovitz, Osaka (JP); Akihiro Adachi, Tokyo (JP); Yuki Sugiyama, Osaka (JP); Hirotoshi Hada, Osaka (JP); Kazuhiko Maeda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/767,727

(22) PCT Filed: Dec. 2, 2016

(86) PCT No.: PCT/JP2016/005047
§ 371 (c)(1),
(2) Date: Apr. 12, 2018

(87) PCT Pub. No.: WO2017/098711
PCT Pub. Date: Jun. 15, 2017

(65) Prior Publication Data
US 2018/0302995 A1 Oct. 18, 2018

(30) Foreign Application Priority Data
Dec. 7, 2015 (JP) .................................. 2015-238979

(51) Int. Cl.
*H05K 5/00* (2006.01)
*G09F 9/00* (2006.01)
(Continued)

(52) U.S. Cl.
CPC ........... *H05K 5/0017* (2013.01); *F16M 11/04* (2013.01); *F16M 11/046* (2013.01);
(Continued)

(58) Field of Classification Search
CPC .. H05K 5/0017; H05K 5/0008; G06F 1/1601; F16M 11/04; F16M 11/22; F16M 11/046; F16M 2200/08; H04N 5/64; G09F 9/00
(Continued)

(56) References Cited

U.S. PATENT DOCUMENTS

| 8,390,996 B2* | 3/2013 | Park ..................... F16M 11/24 |
| | | 248/917 |
| 2005/0050784 A1* | 3/2005 | Bang ..................... F16M 11/22 |
| | | 40/607.01 |

(Continued)

FOREIGN PATENT DOCUMENTS

| JP | 2007-156176 | 6/2007 |
| JP | 2015-130619 | 7/2015 |
| JP | 2016-176980 | 10/2016 |

OTHER PUBLICATIONS

International Search Report of PCT application No. PCT/JP2016/005047 dated Jan. 17, 2017.
(Continued)

*Primary Examiner* — Muhammad Ijaz
(74) *Attorney, Agent, or Firm* — McDermott Will & Emery LLP

(57) ABSTRACT

An image display device includes: a display panel displaying an image; a first support member and a second support member that support the display panel in an erected state; a first mounting member interposed by fitting between the display panel and one of the first support member and the second support member; a second mounting member interposed by fitting between the display panel and another of the
(Continued)

first support member and the second support member; and a first attachment part, a second attachment part, a third attachment part, and a fourth attachment part provided on a back surface of the display panel and having structures fitted to at least one of the first mounting member and the second mounting member. The first attachment part, the second attachment part, the fourth attachment part, and the third attachment part are provided in this order from one end to another end in a width direction of the back surface of the display panel.

4 Claims, 59 Drawing Sheets

(51) Int. Cl.
  *H04N 5/64* (2006.01)
  *F16M 11/04* (2006.01)
  *F16M 11/22* (2006.01)
  *G06F 1/16* (2006.01)
(52) U.S. Cl.
  CPC ........... *F16M 11/22* (2013.01); *G06F 1/1601* (2013.01); *G09F 9/00* (2013.01); *H04N 5/64* (2013.01); *H05K 5/0008* (2013.01); *F16M 2200/08* (2013.01)
(58) Field of Classification Search
  USPC ................. 248/121, 122.1, 176.1, 188.8; 361/679.01
  See application file for complete search history.

(56) References Cited

U.S. PATENT DOCUMENTS

| | | | |
|---|---|---|---|
| 2007/0047188 A1* | 3/2007 | Kim | F16M 11/22 361/679.22 |
| 2007/0080270 A1* | 4/2007 | Choi | F16M 11/38 248/188.8 |
| 2007/0080271 A1* | 4/2007 | Oh | F16M 11/38 248/220.21 |
| 2007/0145212 A1* | 6/2007 | Yamanaka | F16M 11/22 248/176.1 |
| 2008/0239643 A1* | 10/2008 | Min | F16M 11/22 361/679.05 |
| 2009/0095870 A1* | 4/2009 | Chang | F16M 11/22 248/440 |
| 2011/0188186 A1 | 8/2011 | Sakamoto et al. | |
| 2014/0239133 A1* | 8/2014 | Burns | F16M 11/04 248/121 |
| 2017/0150088 A1* | 5/2017 | Niina | H04N 5/64 |
| 2017/0155869 A1* | 6/2017 | Ikemoto | H04N 5/64 |
| 2017/0257962 A1* | 9/2017 | Huang | F16M 11/041 |
| 2018/0184534 A1* | 6/2018 | Na | F16B 5/07 |
| 2018/0302995 A1* | 10/2018 | Hasegawa | F16M 11/04 |

OTHER PUBLICATIONS

The Extended European Search Report dated Nov. 27, 2018 for the related European Patent Application No. 16872613.1.

* cited by examiner

FIG. 1
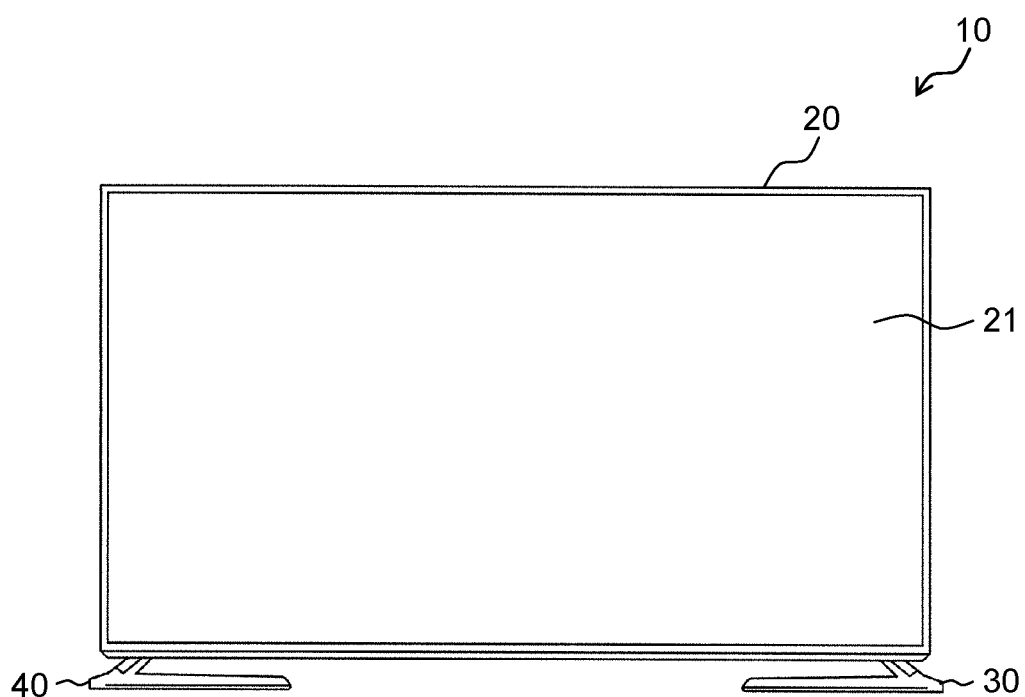
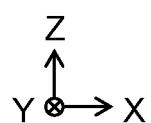

FIG. 3
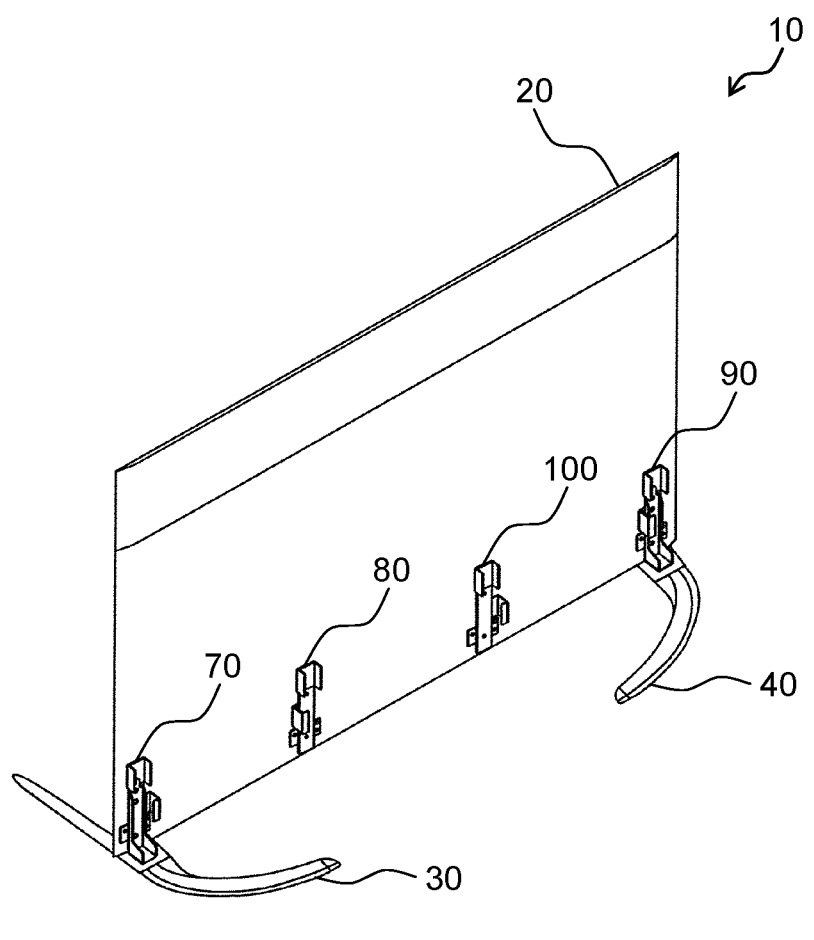
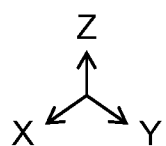

FIG. 5
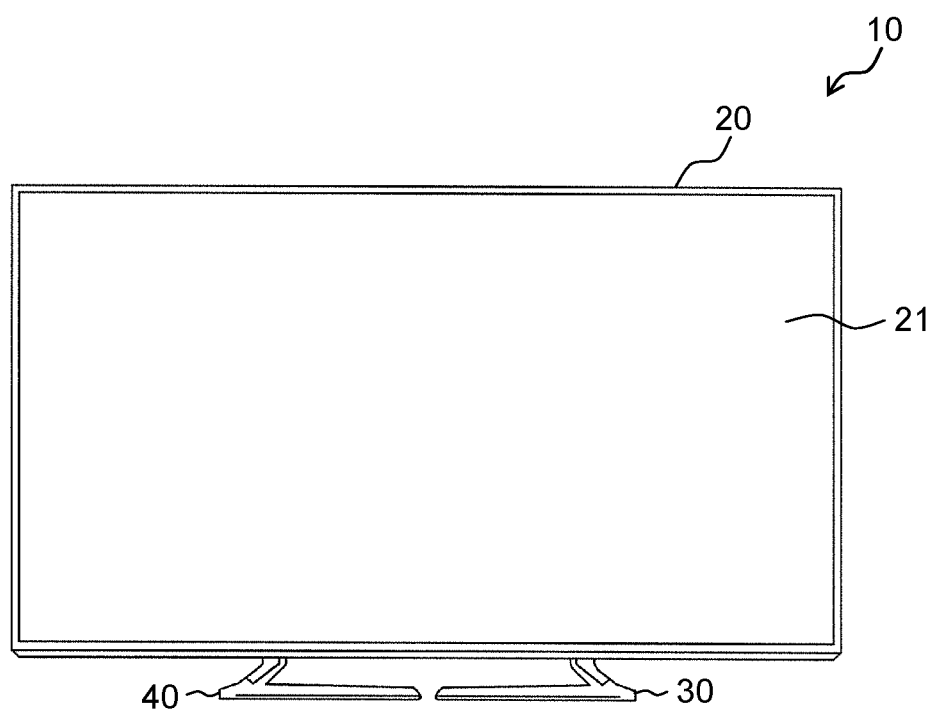
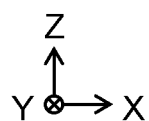

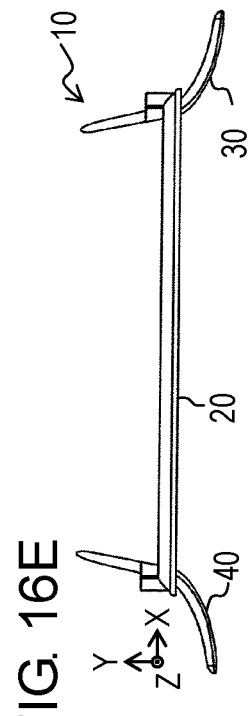
FIG. 16A
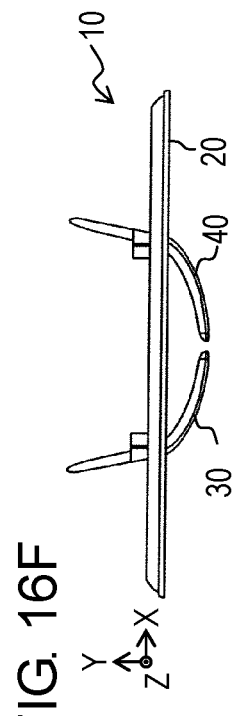
FIG. 16B
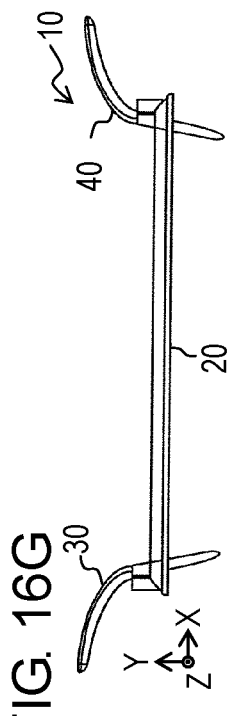
FIG. 16C
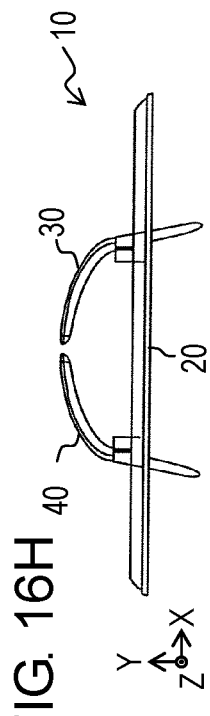
FIG. 16D
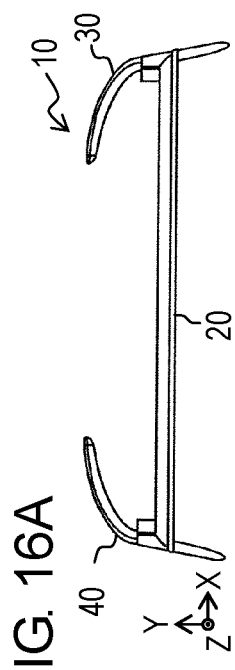
FIG. 16E
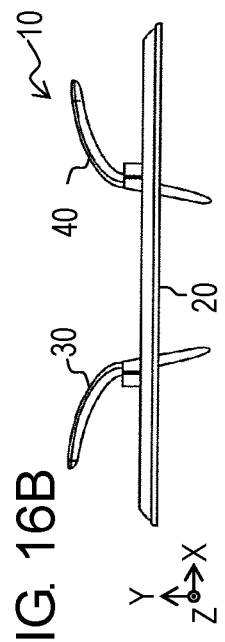
FIG. 16F
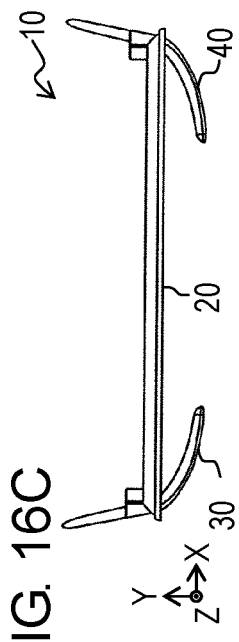
FIG. 16G
FIG. 16H FIG. 17G
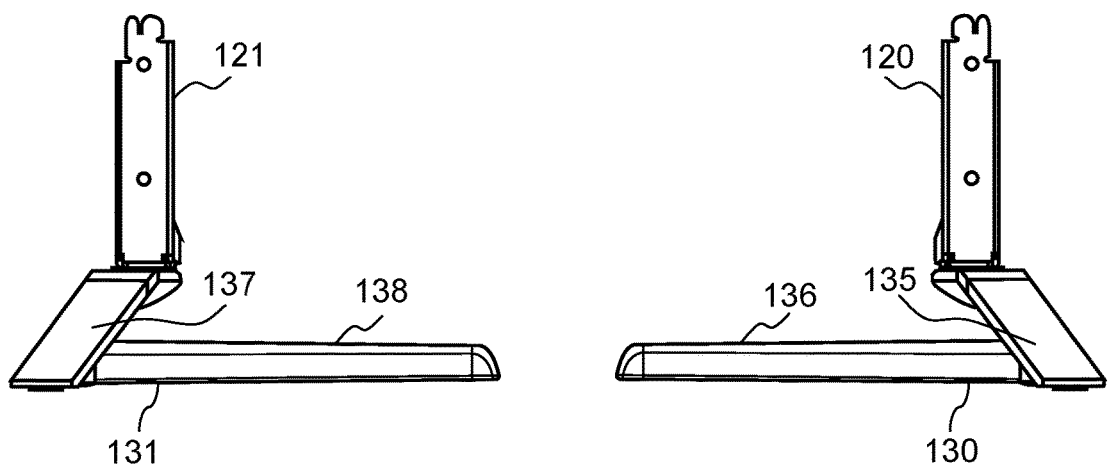
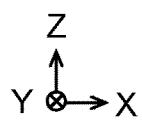

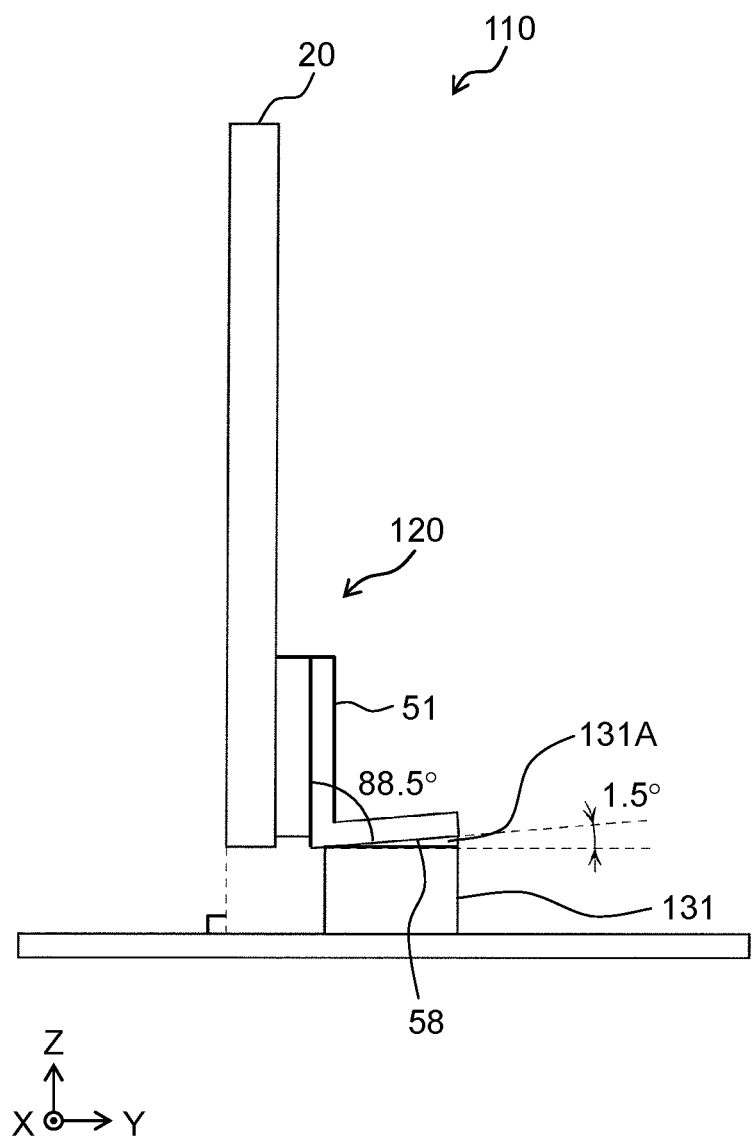

FIG. 22
<Mirror-image symmetry>
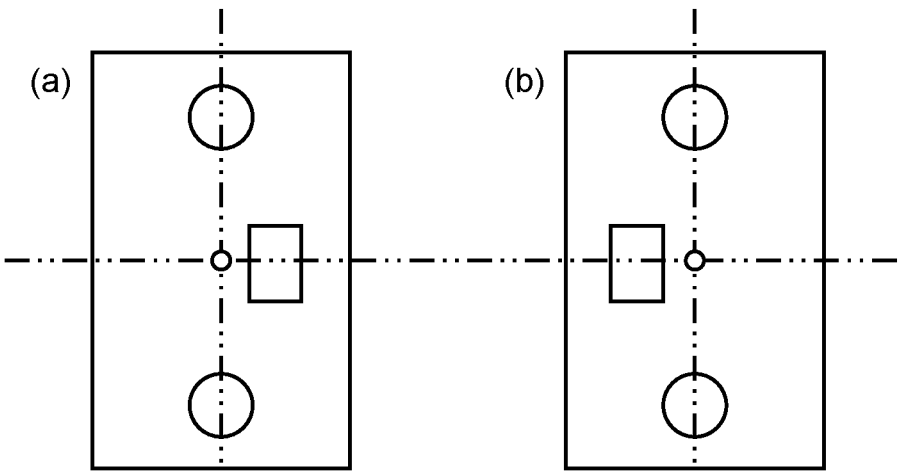
<Point symmetry>
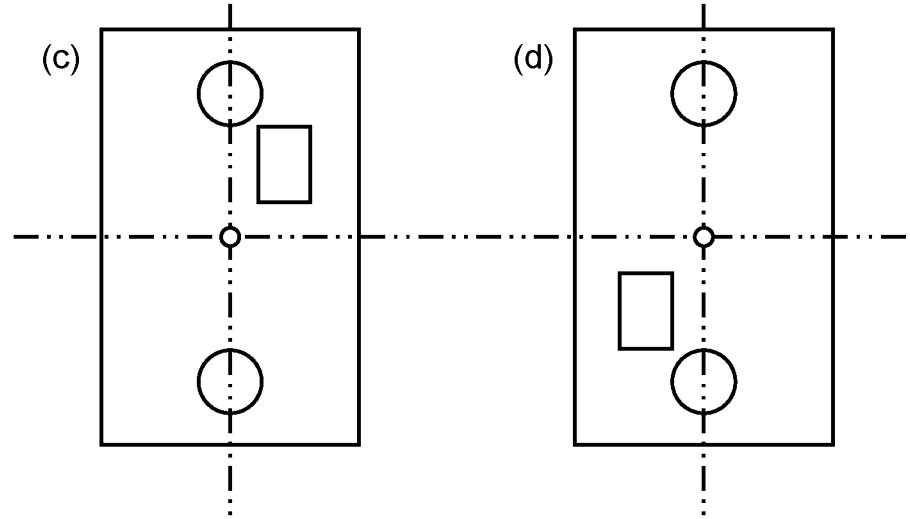

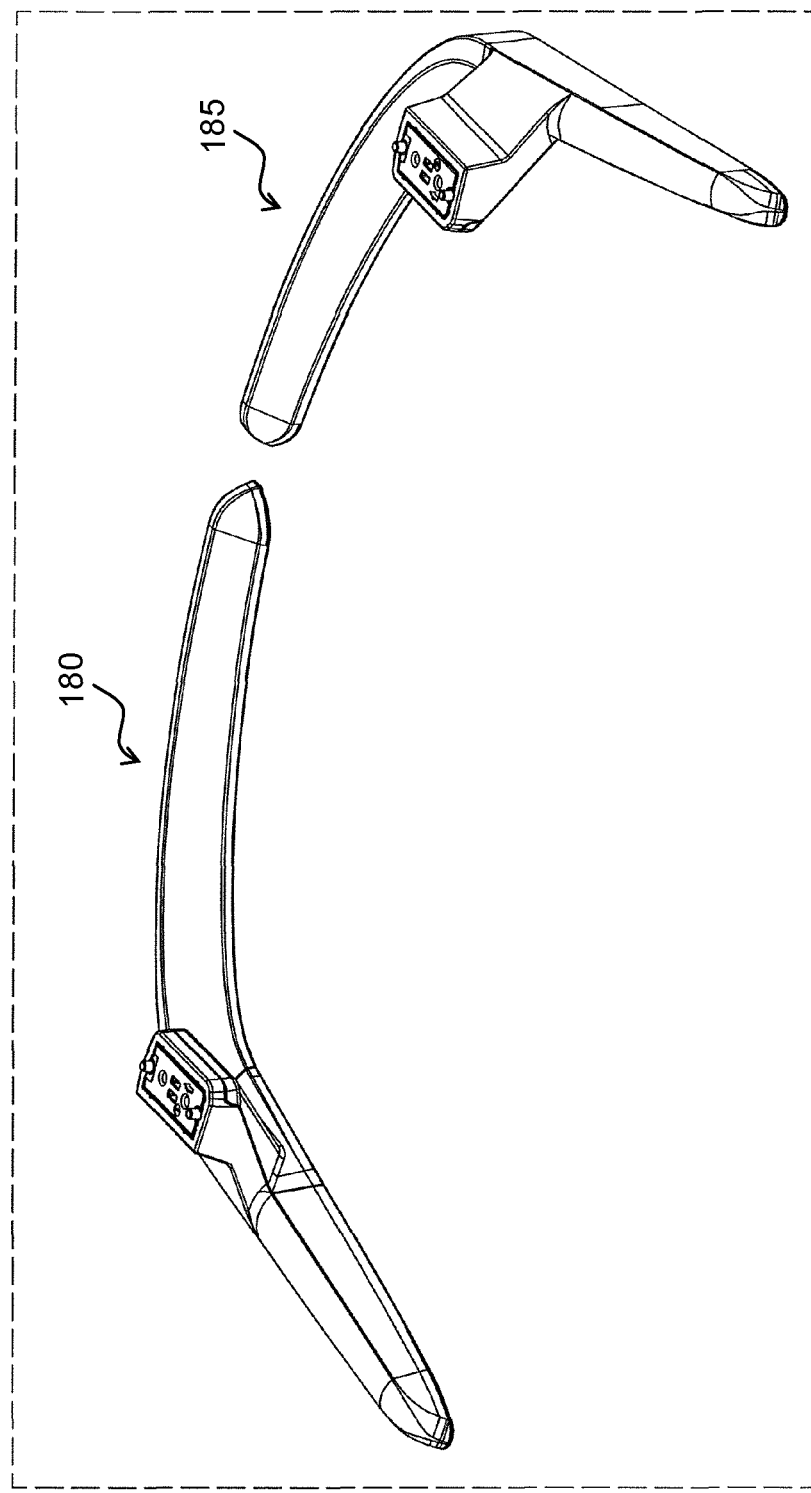

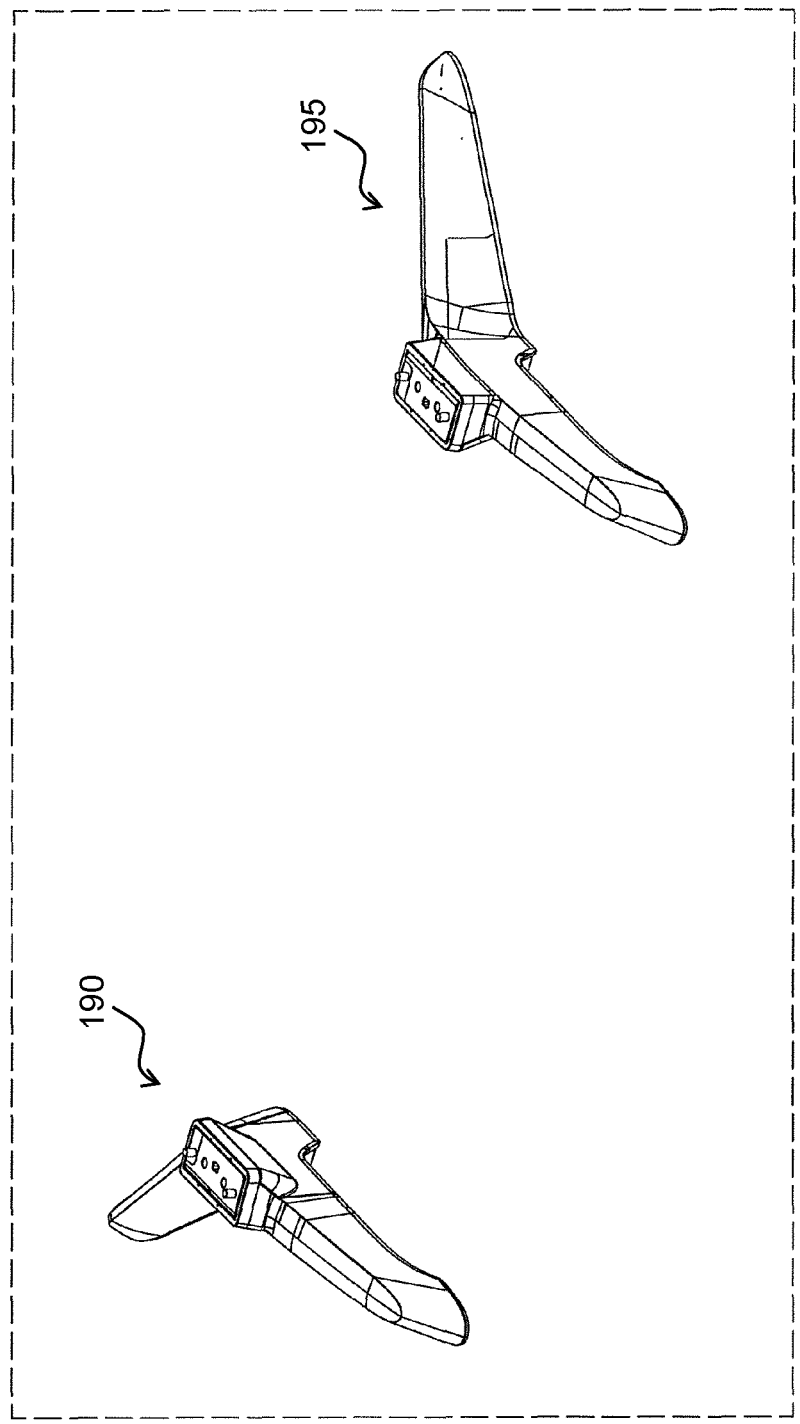

IMAGE DISPLAY DEVICE

This application is a U.S. national stage application of the PCT International Application No. PCT/JP2016/005047 filed on Dec. 2, 2016, which claims the benefit of foreign priority of Japanese patent application No. 2015-238979 filed on Dec. 7, 2015, the contents all of which are incorporated herein by reference.

TECHNICAL FIELD

The present disclosure relates to an image display device.

BACKGROUND ART

PTL 1 discloses a display device provided with a stand. The stand is provided for supporting a panel-shaped display unit having a display screen from below. A conventional stand, such as the stand disclosed in PTL 1, has a plate-shaped pedestal and a support that extends upward from the pedestal. An upper end of the support is fixed to a back surface of the display unit by screws or the like.

CITATION LIST

Patent Literature

PTL 1: Unexamined Japanese Patent Publication No. 2007-156176

SUMMARY

The present disclosure provides an image display device that allows a user to easily change a design.

The image display device in the present disclosure includes: a display panel displaying an image; a first support member and a second support member that support the display panel in an erected state; a first mounting member interposed by fitting between the display panel and one of the first support member and the second support member; a second mounting member interposed by fitting between the display panel and another of the first support member and the second support member; and a first attachment part, a second attachment part, a third attachment part, and a fourth attachment part provided on a back surface of the display panel and having structures fitted to at least one of the first mounting member and the second mounting member. The first attachment part, the second attachment part, the fourth attachment part, and the third attachment part are provided in this order from one end to another end in a width direction of the back surface of the display panel.

According to the image display device in the present disclosure, the user can easily change the design.

BRIEF DESCRIPTION OF DRAWINGS

FIG. 1 is a front view schematically showing one example of an external appearance of an image display device according to a first exemplary embodiment.

FIG. 3 is a perspective view schematically showing one example of an external appearance on a back side of the image display device according to the first exemplary embodiment.

FIG. 5 is a front view schematically showing one example of an external appearance of the image display device after a design change according to the first exemplary embodiment.

FIG. 16A is a top view schematically showing one example of an external appearance of the image display device according to the first exemplary embodiment.

FIG. 16B is a top view schematically showing another example of an external appearance of the image display device according to the first exemplary embodiment.

FIG. 16C is a top view schematically showing still another example of an external appearance of the image display device according to the first exemplary embodiment.

FIG. 16D is a top view schematically showing still another example of an external appearance of the image display device according to the first exemplary embodiment.

FIG. 16E is a top view schematically showing still another example of an external appearance of the image display device according to the first exemplary embodiment.

FIG. 16F is a top view schematically showing still another example of an external appearance of the image display device according to the first exemplary embodiment.

FIG. 16G is a top view schematically showing still another example of an external appearance of the image display device according to the first exemplary embodiment.

FIG. 16H is a top view schematically showing still another example of an external appearance of the image display device according to the first exemplary embodiment.

FIG. 17G is a front view schematically showing one example of an external appearance when the first support member has been mounted to the first mounting member and the second support member has been mounted to the second mounting member according to the modified example of the first exemplary embodiment.

FIG. 17L is a side view schematically showing another example of an external appearance of the image display device according to the modified example of the first exemplary embodiment.

FIG. 22 is a view schematically showing variations (mirror-image symmetry and point symmetry) of a relation between the fifth fitting part of the first mounting member and a sixth fitting part of a second mounting member and of a relation between the seventh fitting part of the first support member and an eighth fitting part of a second support member in the second exemplary embodiment.

FIG. 26G is a perspective view schematically showing one example of an external appearance of the first support member shown in FIG. 26A and a second support member.

FIG. 27G is a perspective view schematically showing one example of an external appearance of the first support member shown in FIG. 27A and a second support member.

DESCRIPTION OF EMBODIMENTS

Figure 2:
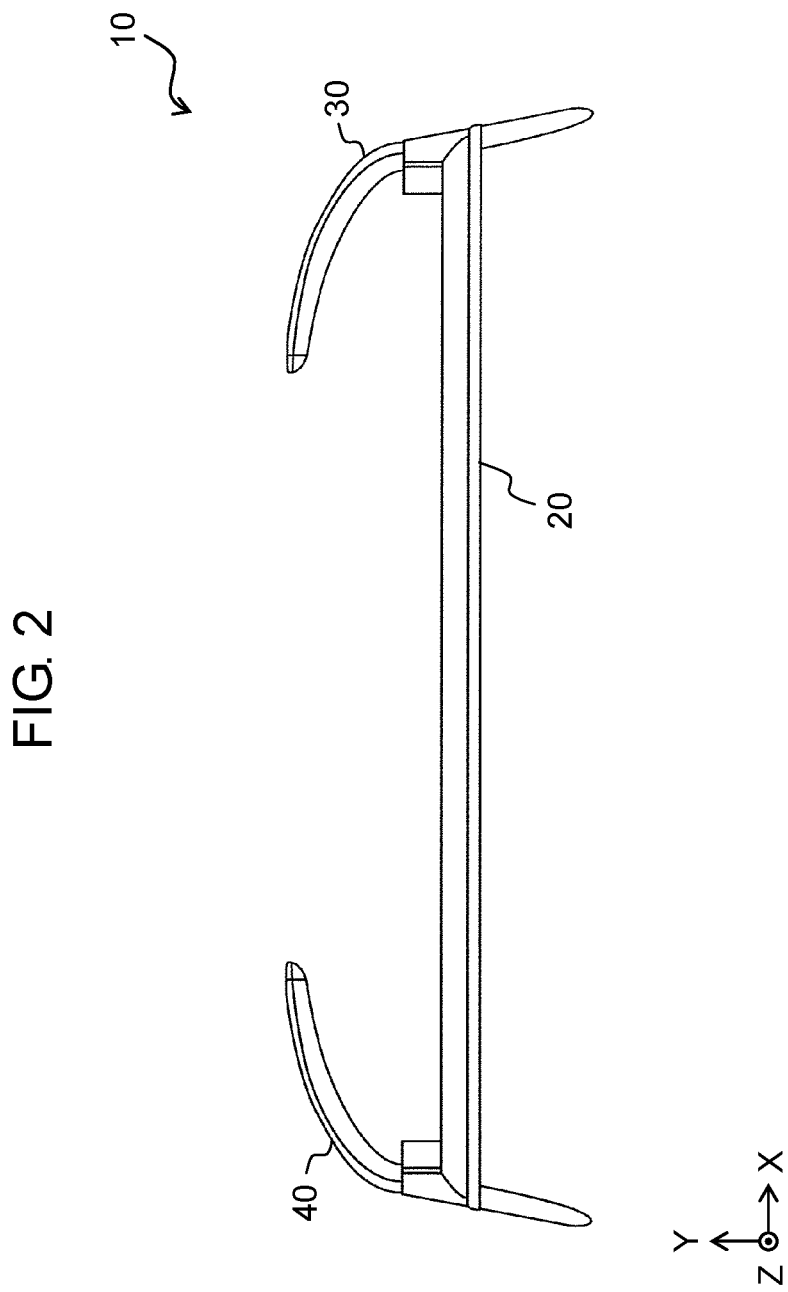
FIG. 2 is a top view schematically showing one example of an external appearance of the image display device according to the first exemplary embodiment.

Hereinafter, exemplary embodiments are described in detail with reference to the drawings appropriately. However, detailed descriptions that are more than necessary may be omitted. For example, a detailed description of a matter that has been already well-known, or an overlapped description for a substantially identical configuration may be omitted. This is intended to avoid unnecessary redundancy of the following description and to facilitate understanding by those skilled in the art.

Note that the attached drawings and the following description are provided for those skilled in the art to fully understand the present disclosure, and are not intended to limit the subject matter as described in the appended claims.

Further, the respective drawings are schematic views, and are not always exactly shown. Further, in the respective drawings, substantially identical components are denoted by identical reference marks, and descriptions of those components may be omitted or simplified.

First Exemplary Embodiment

A first exemplary embodiment is described below with reference to FIGS. 1 to 15.

[1-1. Entire Configuration of Image Display Device]

First, an entire configuration of image display device 10 according to the first exemplary embodiment is described with reference to FIGS. 1 to 4. It should be noted that, in the present exemplary embodiment, it is assumed that an image display surface side of display panel 20 included in image display device 10 is a front and that a back side of the image display surface is a back. Further, it is assumed that image display device 10 is installed on a horizontal plane (an installation surface). It is assumed that a side relatively closer to the installation surface is a bottom, and a side relatively farther from the installation surface is a top.

Further, three axes of an X-axis, a Y-axis, and a Z-axis are conveniently used to describe the present exemplary embodiment. Hereinafter, it is assumed that an axis parallel to a direction perpendicular to the installation surface (an up and down direction) is the Z-axis, and a direction from the bottom to the top is a Z-axis positive direction. Further, it is assumed that an axis orthogonal to the Z-axis and parallel to a right and left direction of display panel 20 is the X-axis, and a direction from left to right of display panel 20 is an X-axis positive direction. Further, it is assumed that an axis orthogonal to the X-axis and the Z-axis and parallel to a front and rear direction of display panel 20 is the Y-axis, and a direction from a front surface (a front side) to the back surface (a back side) of display panel 20 is a Y-axis positive direction.

It should be noted that these axes and directions are relative axes and directions shown conveniently. The present disclosure is not limited to these axes and directions.

FIG. 1 is a front view schematically showing one example of an external appearance of image display device 10 according to the first exemplary embodiment.

FIG. 2 is a top view schematically showing one example of an external appearance of image display device 10 according to the first exemplary embodiment.

FIG. 3 is a perspective view schematically showing one example of an external appearance on a back side of image display device 10 according to the first exemplary embodiment.

Figure 4:
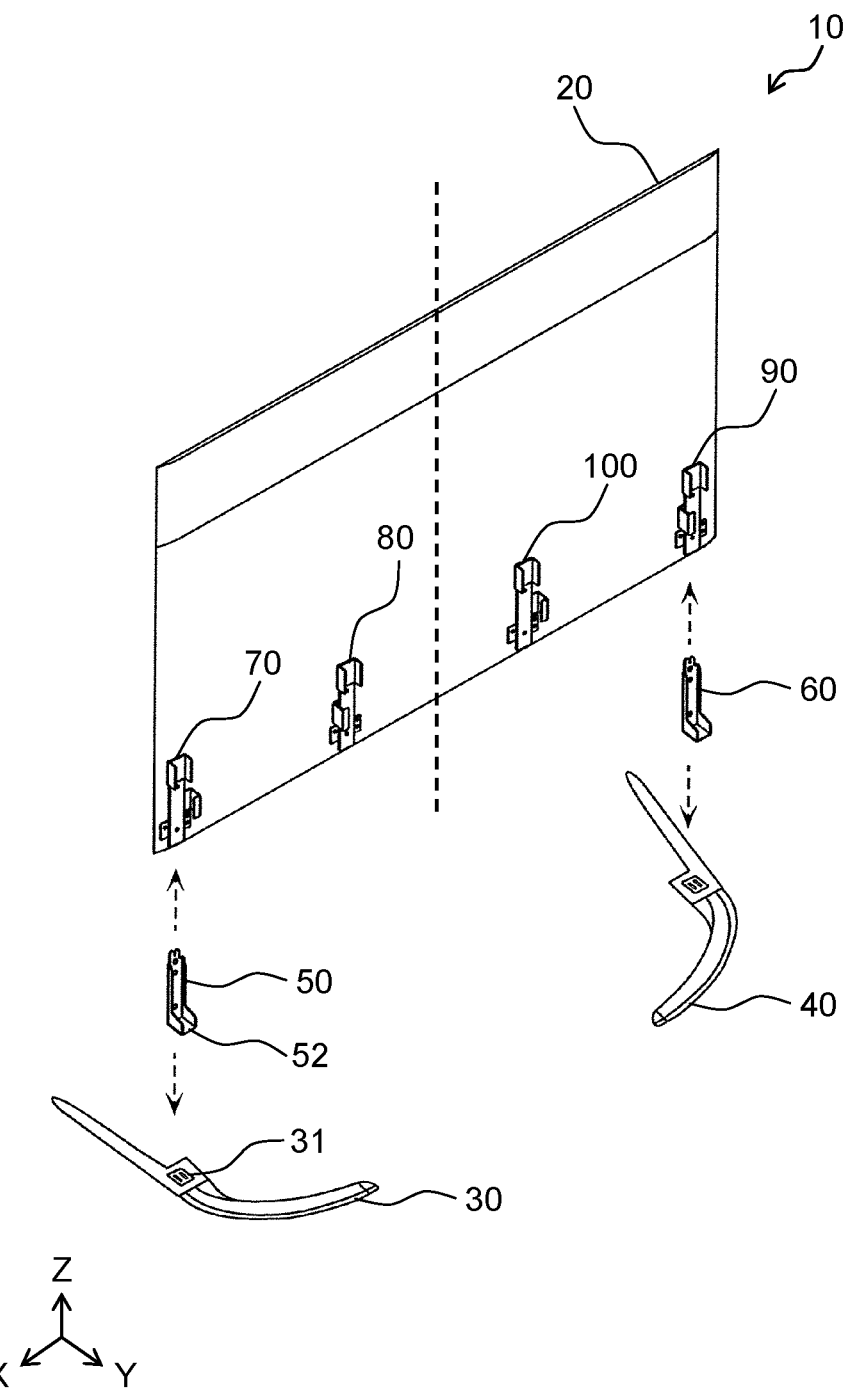
FIG. 4 is an exploded perspective view schematically showing one example of a structure on the back side of the image display device according to the first exemplary embodiment.

FIG. 4 is an exploded perspective view schematically showing one example of a structure on the back side of image display device 10 according to the first exemplary embodiment.

As shown in FIG. 1, image display device 10 includes display panel 20. Image display device 10 is, for example, a liquid crystal television receiver of a flat panel display type.

Display panel 20 is formed in a rectangular flat panel shape. Liquid crystal panel 21 is disposed inside display panel 20. A display screen of liquid crystal panel 21 is disposed on a front surface of display panel 20.

It should be noted that image display device 10 may include an EL (Electro Luminescence) panel or the like instead of liquid crystal panel 21. Further, display panel 20 may be gently curved in the right and left direction (the direction orthogonal to the up and down direction).

As shown in FIGS. 1 to 3, image display device 10 includes first support member 30 and second support member 40 that support display panel 20 in an erected state (an upright state relative to the installation surface). First support member 30 and second support member 40 are disposed in image display device 10 so as to cross a lower part of display panel 20 in a front and back direction (a Y-axis direction).

It should be noted that image display device 10 according to the present exemplary embodiment is configured so that a user can change arrangement positions and arrangement directions of first support member 30 and second support member 40 relative to display panel 20 (details of the arrangement positions and the arrangement directions are described below). In other words, arrangement positions and arrangement directions of first support member 30 and second support member 40 in image display device 10 shown in FIGS. 1 to 3 are one example.

Hereinafter, an external appearance of first support member 30 and second support member 40 is described using, as an example, a case where first support member 30 and second support member 40 are disposed in image display device 10 as shown in FIGS. 1 to 3. However, in image display device 10 described in the present exemplary embodiment, for example, first support member 30 and second support member 40 can be disposed so that front and rear arrangement directions become opposite (that is, reversed) to the arrangement directions shown in FIGS. 1 to 3. Alternatively, first support member 30 and second support member 40 can also be replaced with each other from the arrangement positions shown in FIGS. 1 to 3. In this case, in the following description, "front" may be appropriately replaced with "back", and "back" with "front", respectively. Alternatively, "inward" may be appropriately replaced with "outward", and "outward" with "inward", respectively.

For example, when first support member 30 and second support member 40 are disposed in image display device 10 as shown in FIGS. 1 to 3, as shown in FIG. 2, first support member 30 and second support member 40 have shapes curved in an arch-shaped manner toward an inward side of display panel 20 as a distance from the back surface of display panel 20 increases. Further, first support member 30 and second support member 40 have linear shapes on the front side of display panel 20. Therefore, first support member 30 and second support member 40 have an asymmetric shape in the front and back direction (the Y-axis direction) of display panel 20. Further, first support member 30 and second support member 40 have a shape of mirror-image symmetry (plane symmetry) to each other in a width direction (an X-axis direction) of display panel 20.

It should be noted that first support member 30 and second support member 40 can be also disposed in image display device 10 so as not to be in mirror-image symmetry to each other in the width direction (the X-axis direction) of display panel 20 (not shown). Further, the mirror-image symmetry of first support member 30 and second support member 40 is not essential in the present exemplary embodiment. The shape of first support member 30 and the shape of second support member 40 are not required to be in mirror-image symmetry to each other in the width direction (the X-axis direction) of display panel 20.

As shown in FIG. 4, image display device 10 includes first mounting member 50 and second mounting member 60. First mounting member 50 is interposed by fitting between display panel 20 and first support member 30. Second mounting member 60 is interposed by fitting between display panel 20 and second support member 40. Details of the fitting of first mounting member 50 and second mounting member 60 are described below.

The back surface of display panel 20 is divided into four regions (not shown). Specifically, an outward side on one side in the width direction (the X-axis direction) of display panel 20 (a region on an X-axis positive direction side relative to a center line (shown by a broken line in FIG. 4) parallel to the Z-axis that passes through a center of display panel 20) is a first region. An inward side on the one side in the width direction (the X-axis direction) of display panel 20 is a second region. It should be noted that the outward side is a region relatively away from the center line of display panel 20 and that the inward side is a region relatively close to the center line of display panel 20. Further, an outward side on another side in the width direction (the X-axis direction) of display panel 20 (a region on an X-axis negative direction side relative to the center line of display panel 20) is a third region. An inward side on the other side in the width direction (the X-axis direction) of display panel 20 is a fourth region. Therefore, the first region to the fourth region are arranged on the back surface of display panel 20 in an order of the first region, the second region, the fourth region, and the third region in the X-axis negative direction. It should be noted that, although not shown, for example, these first region to fourth region may be set by equally dividing the back surface of display panel 20 into four in the width direction (the X-axis direction). It should be noted that the first region to the fourth region are not limited to the regions where the back surface of display panel 20 is equally divided into four. For example, on the back surface of display panel 20, as long as the respective regions are set so as to be arranged in the order of the first region, the second region, the fourth region, and the third region from one end in the width direction (the X-axis direction), the back surface of display panel 20 is not required to be divided equally.

As shown in FIGS. 3 and 4, first attachment part 70 is provided in the first region, second attachment part 80 is provided in the second region, third attachment part 90 is provided in the third region, and fourth attachment part 100 is provided in the fourth region on the back surface of display panel 20. First attachment part 70, second attachment part 80, third attachment part 90, and fourth attachment part 100 are provided at a lower part on the back surface of display panel 20. Moreover, first attachment part 70 is provided near an edge on the X-axis positive direction side on the back surface of display panel 20. Second attachment part 80 is provided near a boundary with the first region in the second region on the back surface of display panel 20 (for example, at a location one fourth of a width of display panel 20 from the edge on the X-axis positive direction side of display panel 20). Third attachment part 90 is provided near an edge on the X-axis negative direction side on the back surface of display panel 20. Fourth attachment part 100 is provided near a boundary with the third region in the fourth region on the back surface of display panel 20 (for example, at a location one fourth of the width of display panel 20 from the edge on the X-axis negative direction side of display panel 20).

It should be noted that first attachment part 70 may be provided at any position in the first region. Similarly, second attachment part 80, third attachment part 90, and fourth attachment part 100 may be provided at any positions in the second region, the third region, and the fourth region, respectively. Further, a plurality of attachment parts may be provided in each region. For example, two or more first attachment parts 70 may be provided in the first region.

First attachment part 70, second attachment part 80, third attachment part 90, and fourth attachment part 100 are fitted to either of first mounting member 50 and second mounting member 60.

In image display device 10 according to the first exemplary embodiment, each of first mounting member 50 and second mounting member 60 has a structure capable of fitting to any of first attachment part 70, second attachment part 80, third attachment part 90, and fourth attachment part 100. Details of this fitting is described below.

It should be noted that each of first mounting member 50 and second mounting member 60 may be capable to be fitted only to specific one of first attachment part 70, second attachment part 80, third attachment part 90, and fourth attachment part 100. Details of this case are described below.

It should be noted that FIG. 4 shows, as one example, an exploded perspective view of a case where first mounting member 50 is fitted to first attachment part 70 and second mounting member 60 is fitted to third attachment part 90.

FIG. 5 is a front view schematically showing one example of an external appearance of image display device 10 after a design change according to the first exemplary embodiment.

Figure 6:
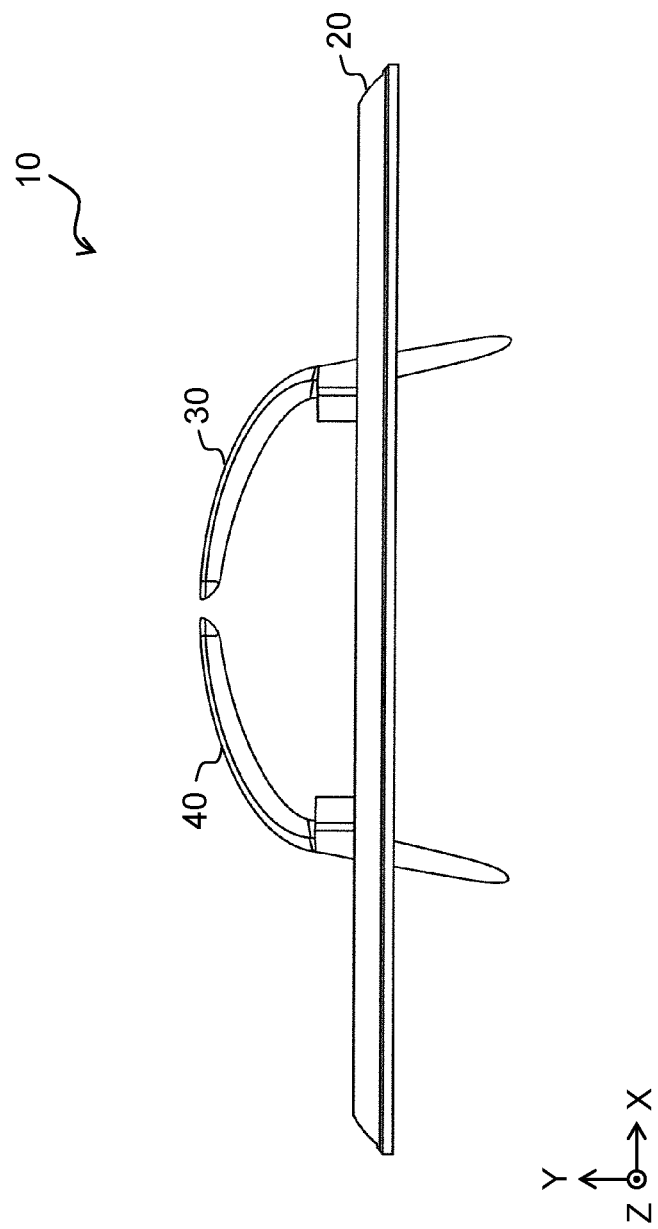
FIG. 6 is a top view schematically showing one example of an external appearance of the image display device after the design change according to the first exemplary embodiment.

FIG. 6 is a top view schematically showing one example of an external appearance of image display device 10 after the design change according to the first exemplary embodiment.

As mentioned above, in image display device 10, each of first mounting member 50 and second mounting member 60 can be fitted to any of first attachment part 70, second attachment part 80, third attachment part 90, and fourth attachment part 100. FIGS. 5 and 6 show the one example of the external appearance of image display device 10 in a case where first mounting member 50 is fitted to second attachment part 80 and second mounting member 60 is fitted to fourth attachment part 100. It should be noted that in the example shown in FIGS. 5 and 6, as with the example shown in FIGS. 1 to 4, first support member 30 is fitted to first mounting member 50, and second support member 40 is fitted to second mounting member 60.

As can be seen from a comparison between FIGS. 1 and 5 and a comparison between FIGS. 2 and 6, mounting positions of first mounting member 50 and second mounting member 60 are changed, thereby greatly changing the design (the external appearance) of image display device 10. For example, image display device 10 having the external appearance shown in FIGS. 1 and 2 can give a broad and massive impression to a user. On the other hand, image display device 10 having the external appearance shown in FIGS. 5 and 6 can give a slim impression to the user. Further, image display device 10 can give an impression as if display panel 20 were floating to the user.

Moreover, in image display device 10 according to the present exemplary embodiment, the user can easily change the mounting positions of first mounting member 50 and second mounting member 60.

[1-2. Configurations of First Attachment Part to Fourth Attachment Part]

Next, configurations of first attachment part 70, second attachment part 80, third attachment part 90, and fourth attachment part 100 of image display device 10 according to the first exemplary embodiment are described with reference to FIGS. 7 to 9. It should be noted that the configurations of second attachment part 80, third attachment part 90, and fourth attachment part 100 are substantially identical to the configuration of first attachment part 70. Accordingly, the configuration of first attachment part 70 is described herein, and descriptions of the other attachment parts are omitted (about second attachment part 80, see FIG. 23B below).

Figure 7:
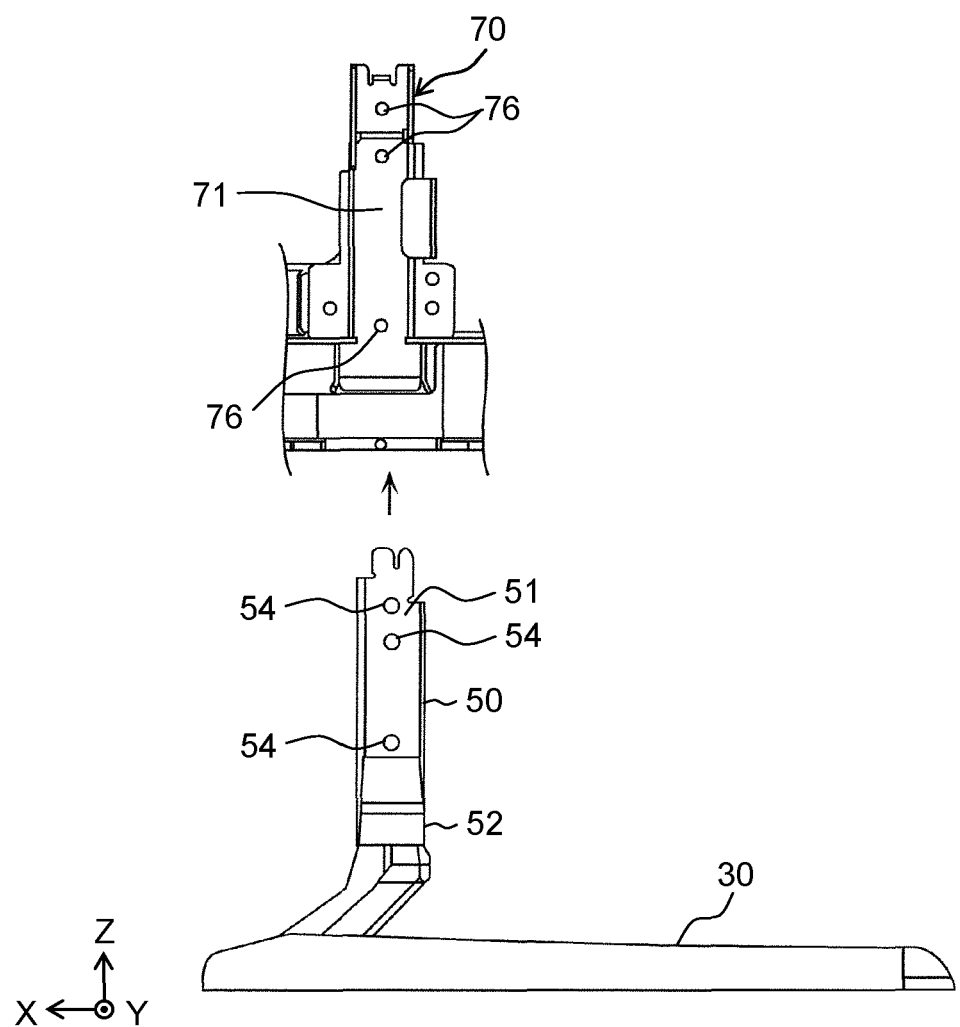
FIG. 7 is an exploded view schematically showing one example of a state in which a first attachment part is detached from a first mounting member fixed to a first support member in the image display device according to the first exemplary embodiment.

FIG. 7 is an exploded view schematically showing one example of a state in which first attachment part 70 is detached from first mounting member 50 fixed to first support member 30 in image display device 10 according to the first exemplary embodiment. It should be noted that FIG. 7 shows first attachment part 70 as seen from the back side.

Figure 8:
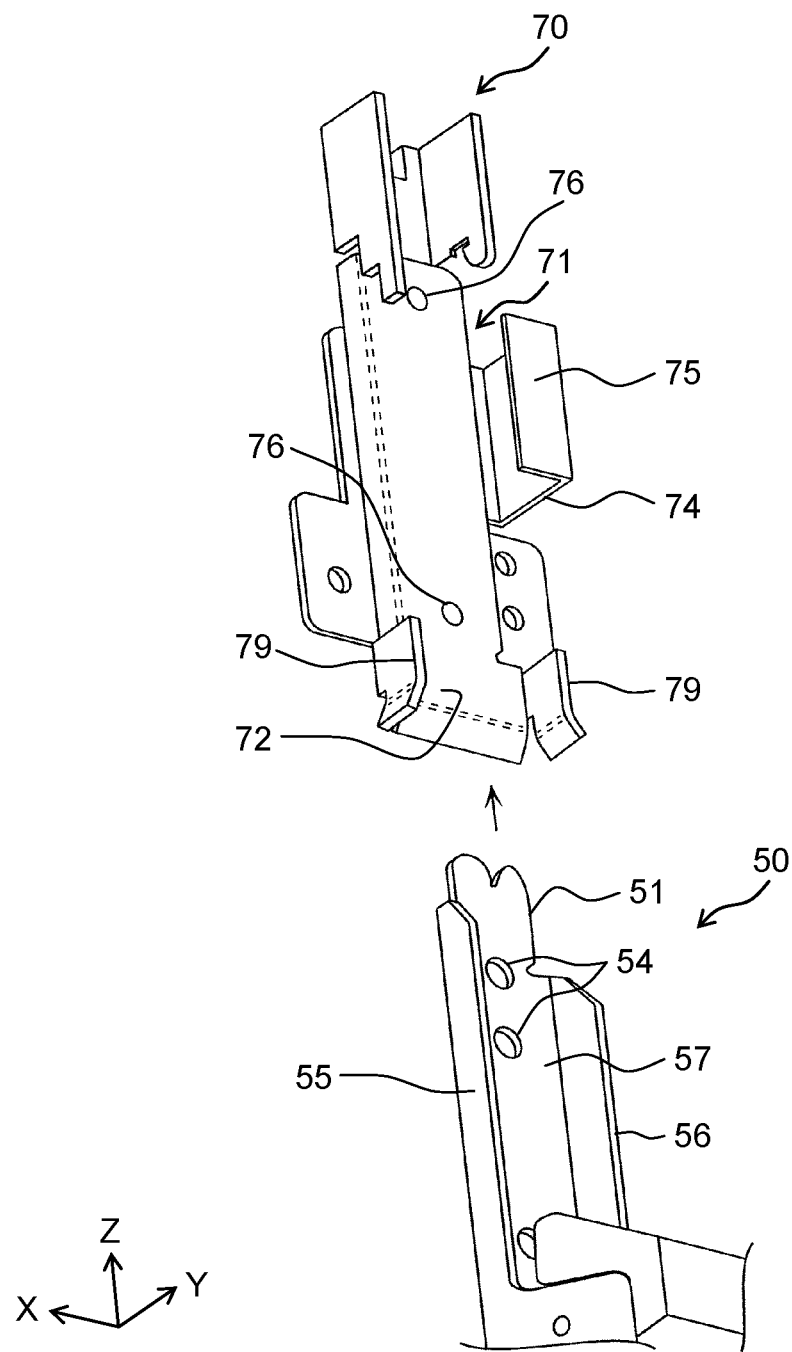
FIG. 8 is a perspective view showing by enlarging the first attachment part and the first mounting member shown in FIG. 7.

FIG. 8 is a perspective view showing by enlarging first attachment part 70 and first mounting member 50 shown in FIG. 7.

Figure 9:
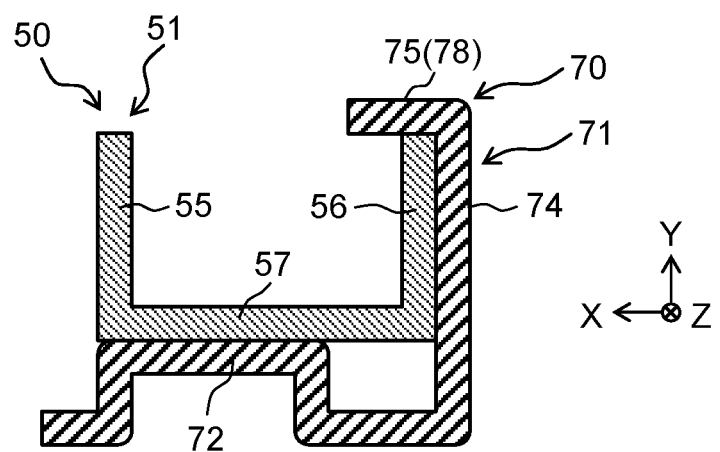
FIG. 9 is a horizontal sectional view schematically showing one example of a fit state between the first attachment part and the first mounting member in the image display device according to the first exemplary embodiment.

FIG. 9 is a horizontal sectional view schematically showing one example of a fit state between first attachment part 70 and first mounting member 50 in image display device 10 according to the first exemplary embodiment.

As shown in FIGS. 7 and 8, first attachment part 70 is provided with groove 71. Also, insertion part 51 of first mounting member 50 is inserted in groove 71, and groove 71 and insertion part 51 are fitted to each other (see FIG. 9).

Further, as shown in FIGS. 8 and 9, groove 71 is configured to include bottom wall 72, side wall 74, and top wall 75. Bottom wall 72 is parallel to the width direction (the X-axis direction) of display panel 20, and elongated in the up and down direction (a Z-axis direction). Side wall 74 extends along a side edge on the X-axis negative direction side of bottom wall 72, and is erected in a direction toward the back side of display panel 20 (the Y-axis positive direction). It should be noted that side wall 74 extends along a portion of the side edge of bottom wall 72 in the example shown in FIG. 8. However, side wall 74 may extend along the entire side edge of bottom wall 72. Top wall 75 extends along an upper edge of side wall 74, and is erected toward inside of side wall 74 (in the X-axis positive direction). It should be noted that top wall 75 extends along the entire upper edge of side wall 74 in the example shown in FIG. 8. However, top wall 75 may extend along a portion of the upper edge of side wall 74.

Moreover, insertion part 51 of first mounting member 50 is inserted in a space surrounded by bottom wall 72, side wall 74, and top wall 75 (see FIG. 9).

Further, as shown in FIGS. 7 and 8, bottom wall 72 of groove 71 is provided with screw holes 76 for fixing first mounting member 50 to bottom wall 72 in a state in which first mounting member 50 is fitted to groove 71.

As shown in FIG. 8, a pair of guide plates 79 is provided at a lower part of first attachment part 70 so that insertion part 51 of first mounting member 50 can be easily inserted in groove 71. Guide plate 79 extends along each side of a lower part of bottom wall 72, and is erected in the direction toward the back side of display panel 20 (the Y-axis positive direction). A lower part of guide plate 79 is bent outward so as to enlarge a width between guide plate 79 and guide plate 79.

First attachment part 70 is fixed to the back surface of a body of display panel 20 by screwing.

It should be noted that a structure of groove 71 is not limited to the structure shown in FIG. 8. Groove 71 can have any structure as long as insertion parts 51 of first mounting member 50 and second mounting member 60 are formed to be inserted and fitted.

It should be noted that a material for first attachment part 70, second attachment part 80, third attachment part 90, and fourth attachment part 100 is not particularly limited. Any material may be used as long as the material has proper strength, such as metal or resin.

[1-3. Configurations of First Mounting Member and Second Mounting Member]

Next, configurations of first mounting member 50 and second mounting member 60 in image display device 10 according to the first exemplary embodiment are described with reference to FIGS. 7 to 11. It should be noted that the configuration of second mounting member 60 is substantially identical to the configuration of first mounting member 50. Accordingly, the configuration of first mounting member 50 is described herein, and a description of second mounting member 60 is omitted.

Figure 10:
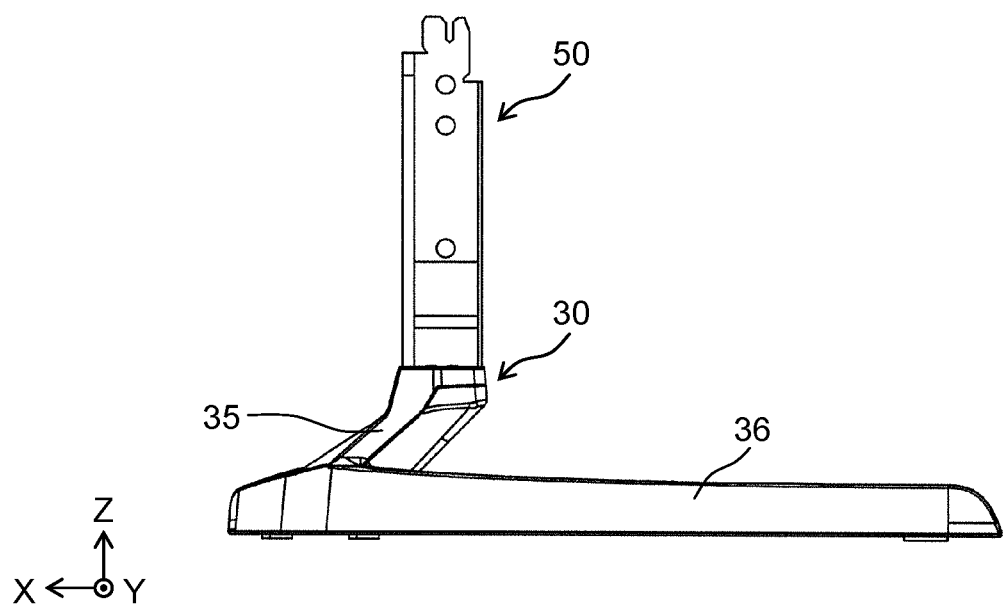
FIG. 10 is a back view schematically showing one example of a direction in which the first support member is combined with the first mounting member in the image display device according to the first exemplary embodiment.

FIG. 10 is a back view schematically showing one example of a direction in which first support member 30 is combined with first mounting member 50 in image display device 10 according to the first exemplary embodiment.

Figure 11:
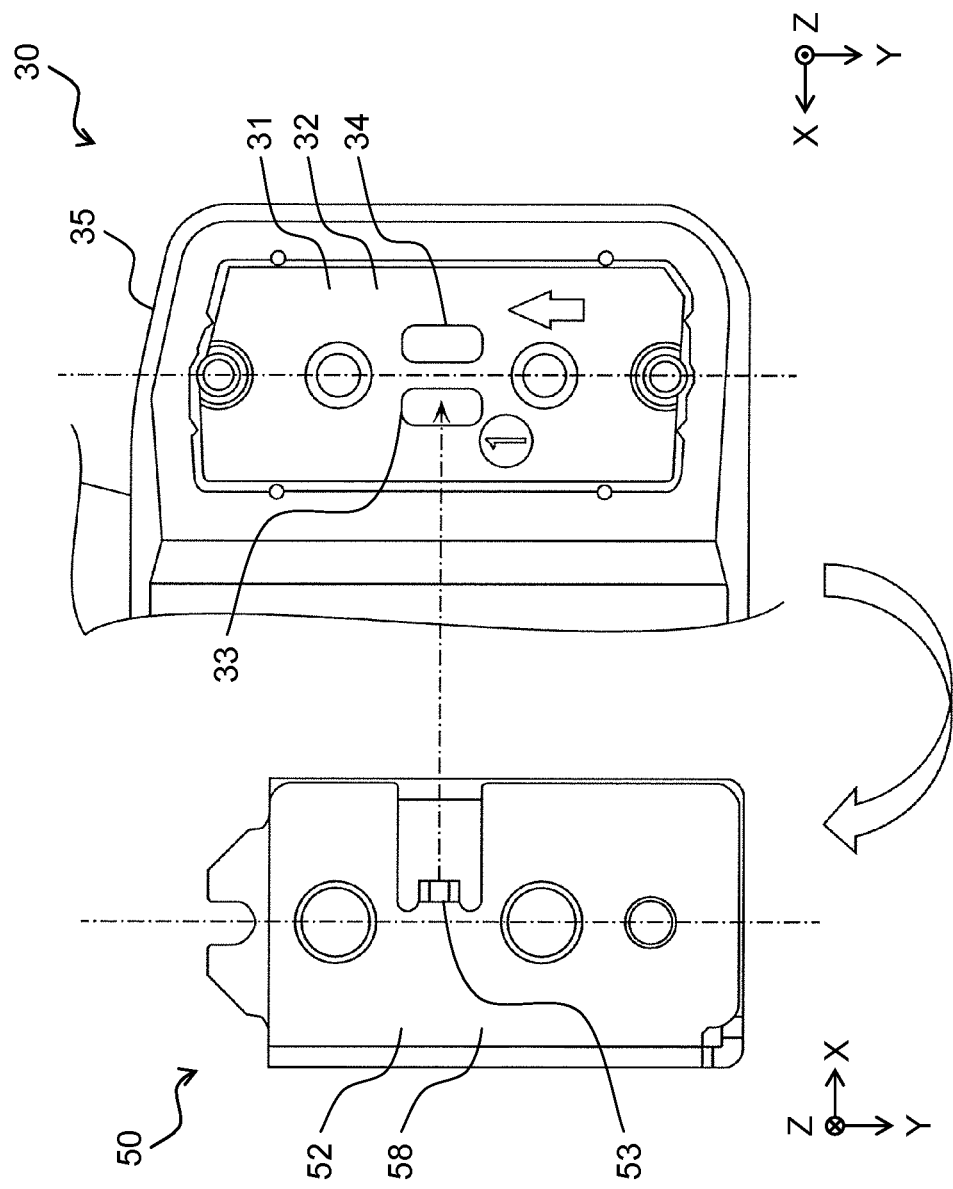
FIG. 11 is a view schematically showing one example of a direction in which a third fitting part is fitted to a first fitting part in the image display device according to the first exemplary embodiment.

FIG. 11 is a view schematically showing one example of a direction in which third fitting part 31 is fitted to first fitting part 52 in image display device 10 according to the first exemplary embodiment. FIG. 11 shows a partial enlarged view of first support member 30 and first mounting member 50. The partial enlarged view of first support member 30 is a top view showing by enlarging a region of first support member 30, to which first mounting member 50 is mounted (see FIG. 4). Third fitting part 31 is provided in this region. Further, the partial enlarged view of first mounting member 50 is a bottom view showing by enlarging a region of first mounting member 50 fitted to third fitting part 31 (see FIG. 4). First fitting part 52 is provided in this region. It should be noted that the X-axis, the Y-axis, and the Z-axis regarding first mounting member 50 shown in FIG. 11 show directions of the respective axes when first mounting member 50 is attached to first attachment part 70.

As shown in FIG. 7, first mounting member 50 has insertion part 51 at an upper part, and has first fitting part 52 at a lower part.

As shown in FIGS. 8 and 9, insertion part 51 is configured to include side wall 55, side wall 56, and bottom wall 57. A cross section of a horizontal plane (a plane parallel to an X-Y plane) of insertion part 51 is U-shaped. Insertion part 51 extends in the up and down direction (the Z-axis direction).

Specifically, bottom wall 57 is parallel to the width direction (the X-axis direction) of display panel 20, and is elongated in the up and down direction (the Z-axis direction). Side wall 55 extends along a side edge on the X-axis positive direction side of bottom wall 57, and is erected in a direction toward the back side of display panel 20 (the Y-axis positive direction). On the other hand, side wall 56 extends along a side edge on the X-axis negative direction side of bottom wall 57, and is erected in a direction toward the back side of display panel 20 (the Y-axis positive direction).

Moreover, as shown in FIG. 9, when first mounting member 50 is inserted in groove 71 of first attachment part 70, side wall 55 and side wall 56 of first mounting member 50 are formed in sizes so that an upper end (an end on the Y-axis positive direction side) of side wall 55 and an upper end (an end on the Y-axis positive direction side) of side wall 56 are in contact with or are not slightly in contact with an inner wall surface (a wall surface on the Y-axis negative direction side) of top wall 75 of first attachment part 70. In other words, the respective upper ends of side wall 55 and side wall 56 of first mounting member 50 are located more on the Y-axis negative direction side than the inner wall surface of top wall 75 of first attachment part 70. As a result, insertion part 51 of first mounting member 50 can be inserted in groove 71 without being blocked by top wall 75.

Further, insertion part 51 of first mounting member 50 is provided with screw holes 54 for fixing insertion part 51 to bottom wall 72 in a state in which insertion part 51 is fitted to groove 71 of first attachment part 70 (see FIGS. 7 and 8). Therefore, when first attachment part 70 and first mounting member 50 are fitted to each other, screw holes 76 and screw holes 54 are provided so that screw holes 76 of first attachment part 70 and screw holes 54 of first mounting member 50 communicate with each other.

Moreover, as shown in FIG. 7, a cutout is provided at a tip of insertion part 51 of first mounting member 50. Both sides of the cutout have an asymmetric shape with respect to a center line of the cutout (a center line parallel to the Z-axis, not shown) in the width direction (the X-axis direction).

It should be noted that, although not shown, a tip of an insertion part of second mounting member 60 may have an asymmetric shape with respect to a center line of a cutout so as to have a shape different from the shape of the tip of insertion part 51 included in first mounting member 50 (for example, mirror-image symmetry to the cutout of first mounting member 50). In this case, since it becomes easy to visually distinguish first mounting member 50 and second mounting member 60, convenience of the user can be improved.

Further, as shown in FIG. 7, first mounting member 50 has first fitting part 52 fitted to third fitting part 31 of first support member 30 (see FIG. 11) at an end on a side opposite to insertion part 51 in the up and down direction (the Z-axis direction). In other words, first fitting part 52 is provided at a lower part of first mounting member 50.

As shown in FIG. 11, first fitting part 52 is provided with contact surface 58 that contact with contact surface 32 of first support member 30. Contact surface 58 is provided on a bottom surface of first mounting member 50, and has a substantially rectangular shape.

Contact surface 58 is provided with protrusion 53. When first mounting member 50 is attached to first attachment part 70, protrusion 53 is provided so as to be localized more on the X-axis positive direction side than a center line (shown by a dashed line in FIG. 11) in a width direction (the X-axis direction) of contact surface 58. Protrusion 53 may be provided near a center in a longitudinal direction (the Y-axis direction) of contact surface 58. Further, when first mounting member 50 is attached to first attachment part 70, protrusion 53 is formed so as to protrude downward (the Z-axis negative direction). A cross-sectional shape of a horizontal plane (a plane parallel to the X-Y plane) of protrusion 53 is a rectangle having a long side that extends in the longitudinal direction (the Y-axis direction) of contact surface 58.

It should be noted that, in the first exemplary embodiment, a portion of second mounting member 60 fitted to second support member 40 is referred to as a second fitting part.

A material for first mounting member 50 and second mounting member 60 is not particularly limited. Any material may be used as long as the material has proper strength, such as metal or resin. First mounting member 50 and second mounting member 60 may be referred to as "stand metal" in a case where first mounting member 50 and second mounting member 60 are formed of metal as the material.

[1-4. Configurations of First Support Member and Second Support Member]

Next, configurations of first support member 30 and second support member 40 are described. It should be noted that the configuration of second support member 40 is substantially identical to the configuration of first support member 30. Accordingly, the configuration of first support member 30 is described herein, and a description of second support member 40 is omitted.

Further, as shown in FIGS. 10 and 11, a case where protrusion 53 of first mounting member 50 is fitted to recess 33 of first support member 30 is first described herein.

As shown in FIG. 10, first support member 30 is configured to include base 35 and leg 36. As shown in FIG. 11, base 35 is provided with third fitting part 31 fitted to first fitting part 52 of first mounting member 50. Leg 36 is a portion that contacts with the installation surface, on which image display device 10 is installed, and substantially supports image display device 10.

As shown in FIG. 11, third fitting part 31 located on a top surface of base 35 of first support member 30 is provided with contact surface 32 that contacts with contact surface 58 of first mounting member 50. A shape of contact surface 32 of first support member 30 is substantially a rectangle with a size almost equal to the size of contact surface 58 of first mounting member 50.

Contact surface 32 is provided with a pair of recess 33 and recess 34. Recess 33 and recess 34 are disposed so as to be located substantially in a center of contact surface 32 in a longitudinal direction (the Y-axis direction) of contact surface 32. Recess 33 and recess 34 are disposed so as to be in line symmetry to each other with respect to a center line (shown by a dashed line in FIG. 11) in a width direction (the X-axis direction) of contact surface 32. In other words, third fitting part 31 has the pair of recess 33 and recess 34 that are in point symmetry with respect to a center (not shown) of contact surface 32.

Recess 33 and recess 34 are depressed downward (the Z-axis negative direction). A depth of the depression is set so that protrusion 53 of first fitting part 52 of first mounting member 50 can be fitted. A cross-sectional shape of a horizontal plane (a plane parallel to the X-Y plane) of each of recess 33 and recess 34 corresponds to the cross-sectional shape of the horizontal plane of protrusion 53, and is a rectangle having a long side that extends in the longitudinal direction (the Y-axis direction) of contact surface 32. It should be noted that recess 33 and recess 34 may be holes formed so that protrusion 53 can be fitted.

Moreover, protrusion 53 fits to either one of recess 33 and recess 34 according to a direction in which first support member 30 is mounted to first mounting member 50. For example, when first mounting member 50 is mounted to first support member 30 in the state shown in FIGS. 1, 2, and 10, protrusion 53 is fitted to recess 33, as shown by a dashed line arrow in FIG. 11.

In other words, when the direction in which first support member 30 is mounted to first mounting member 50 is the direction shown in FIGS. 10 and 11, recess 33 is localized on the X-axis positive direction side in the width direction (the X-axis direction) of contact surface 32 so as to correspond to the localization of protrusion 53 in the width direction (the X-axis direction) of contact surface 58.

Meanwhile, recess 33 and recess 34 are provided so as to be in point symmetry with respect to the center of contact surface 32. Accordingly, even when first support member 30 is in a state reversed from the state shown in FIGS. 10 and 11 (a state in which first support member 30 is rotated with respect to first mounting member 50 by 180 degrees on the X-Y plane from the state shown in FIGS. 10 and 11), first support member 30 can be mounted to first mounting member 50. At this time, protrusion 53 is fitted to recess 34. Details of the fitting are described below with reference to FIG. 13.

Although a description is omitted because of overlapping, first mounting member 50 can also be mounted to second support member 40 in a same way as the mounting to first support member 30. Further, as with first mounting member 50, second mounting member 60 can be mounted to both of first support member 30 and second support member 40.

In this way, in image display device 10 of the first exemplary embodiment, first support member 30 and second support member 40 have structures that can be fitted to both of first mounting member 50 and second mounting member 60. Also, a direction of the fitting is not limited to one direction (for example, the direction shown in FIGS. 10 and 11). First support member 30 and second support member 40 have structures that can be fitted to first mounting member 50 or second mounting member 60, even in a state in which first support member 30 and second support member 40 are reversed from the one direction (a state in which first support member 30 and second support member 40 are reversed in the front and back direction (the Y-axis direction) of display panel 20).

In other words, even in a case where third fitting part 31 of first support member 30 is in the state in which first support member 30 is reversed in the front and back direction (the Y-axis direction) of display panel 20 from the state in which third fitting part 31 is fitted to first fitting part 52 of first mounting member 50 (for example, the state shown in FIGS. 10 and 11), since third fitting part 31 has the pair of recess 33 and recess 34 that are in point symmetry with respect to the center of contact surface 32, third fitting part 31 can be fitted to first fitting part 52 of first mounting member 50.

Next, a case where protrusion 53 of first mounting member 50 is fitted to recess 34 of first support member 30 is described.

Figure 12:
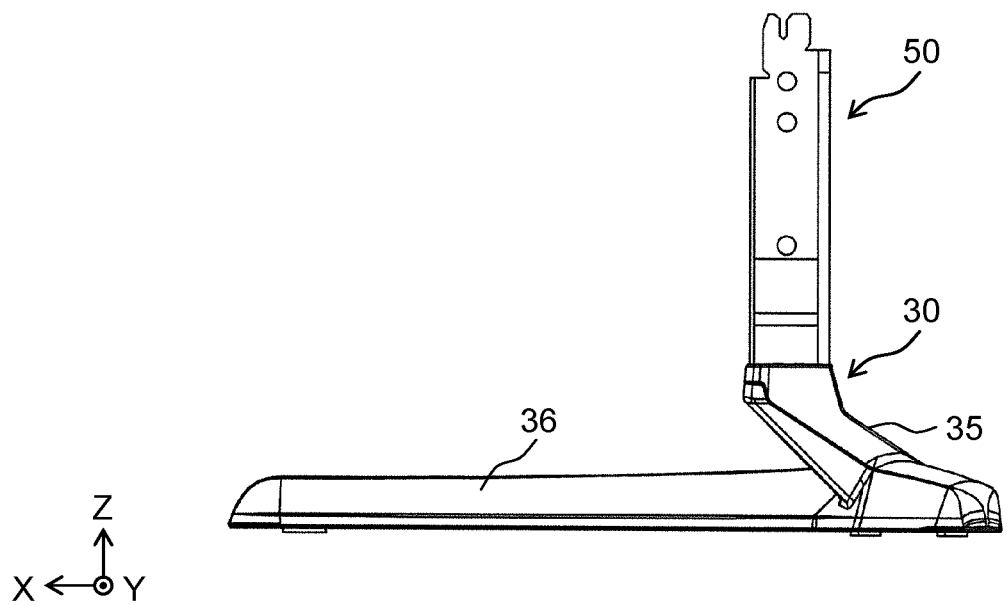
FIG. 12 is a back view schematically showing another example of a direction in which the first support member is combined with the first mounting member in the image display device according to the first exemplary embodiment.

FIG. 12 is a back view schematically showing another example of a direction in which first support member 30 is combined with first mounting member 50 in image display device 10 according to the first exemplary embodiment. FIG. 12 shows a state in which first support member 30 is reversed from the state shown in FIG. 10 (rotated by 180 degrees on the X-Y plane) and fitted to first mounting member 50.

Figure 13:
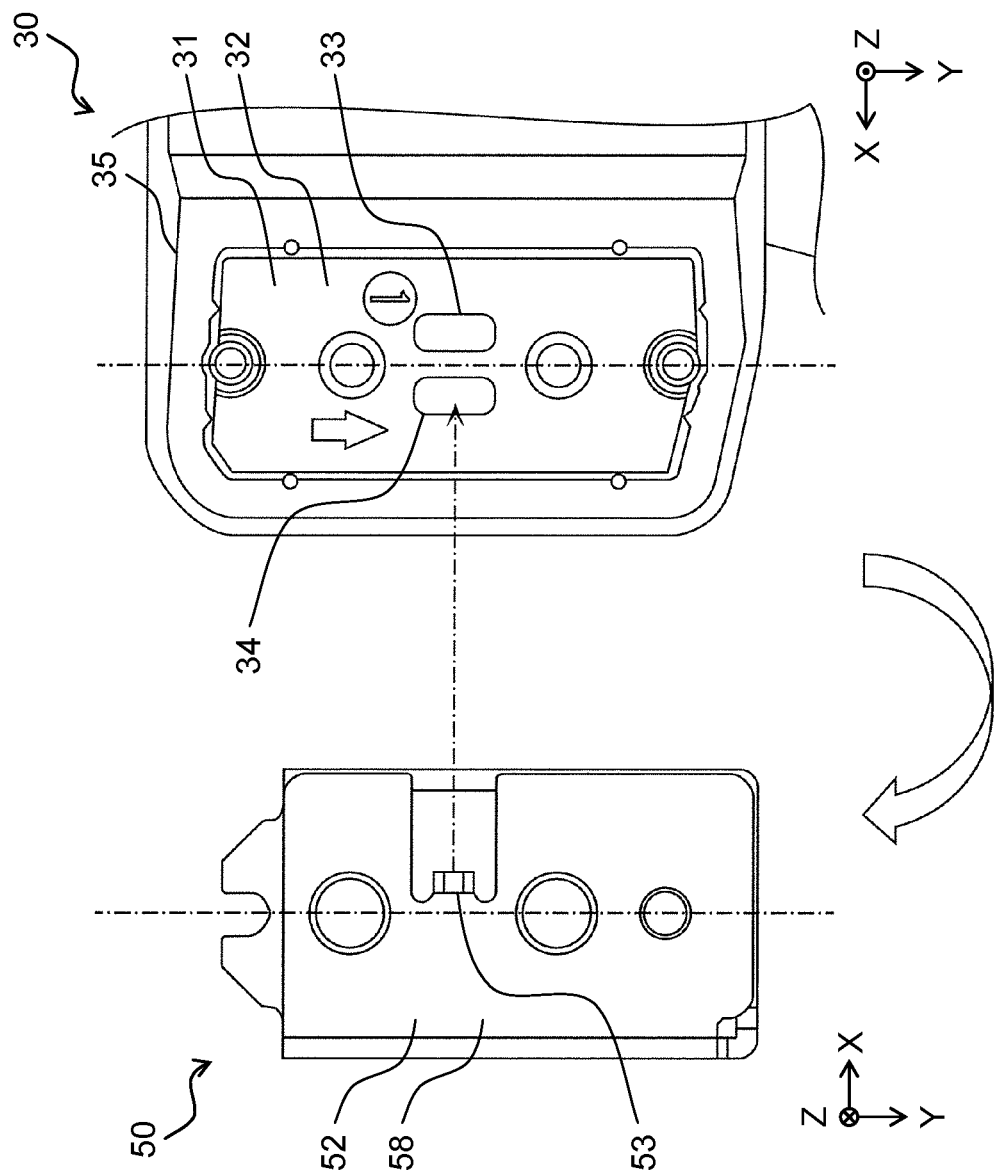
FIG. 13 is a view schematically showing another example of a direction in which the third fitting part is fitted to the first fitting part in the image display device according to the first exemplary embodiment.

FIG. 13 is a view schematically showing another example of a direction in which third fitting part 31 is fitted to first fitting part 52 in image display device 10 according to the first exemplary embodiment. FIG. 13 shows a state in which first support member 30 is reversed (rotated by 180 degrees on the X-Y plane) from the state shown in FIG. 11. It should be noted that the X-axis, the Y-axis, and the Z-axis regarding first mounting member 50 shown in FIG. 13 show directions of the respective axes when first mounting member 50 is attached to first attachment part 70.

In the example shown in FIG. 13, compared with the case shown in FIG. 11, first support member 30 is reversed on the X-Y plane. Accordingly, contact surface 32 of first support member 30 is also rotated by 180 degrees on the X-Y plane. Moreover, as mentioned above, in image display device 10, recess 33 and recess 34 are in point symmetry with respect to the center (not shown) of contact surface 32. Accordingly, protrusion 53 of first mounting member 50 fitted to recess 33 before the reverse (the state shown in FIG. 11) is fitted to recess 34 after contact surface 32 is reversed, as shown by a dashed line arrow in FIG. 13.

In other words, when the direction in which first support member 30 is mounted to first mounting member 50 is the direction shown in FIGS. 12 and 13, recess 34 is localized on the X-axis positive direction side in the width direction (the X-axis direction) of contact surface 32 so as to correspond to the localization of protrusion 53 in the width direction (the X-axis direction) of contact surface 58.

With this configuration, even in a case where first support member 30 is reversed, in a same manner as before first support member 30 is reversed, protrusion 53 is fitted to recess 34 in a state in which contact surface 58 and contact 32 are aligned and brought into contact with each other without shifting relative positions of contact surface 58 and contact surface 32 in the width direction (the X-axis direction). As a result, first mounting member 50 is stably supported by first support member 30 even after first support member 30 is reversed.

It should be noted that, in the first exemplary embodiment, a portion of second support member 40 fitted to second mounting member 60 is referred to as a fourth fitting part.

Next, a description is given of an external appearance of image display device 10 when first support member 30 is reversed as shown in FIGS. 12 and 13.

Figure 14:
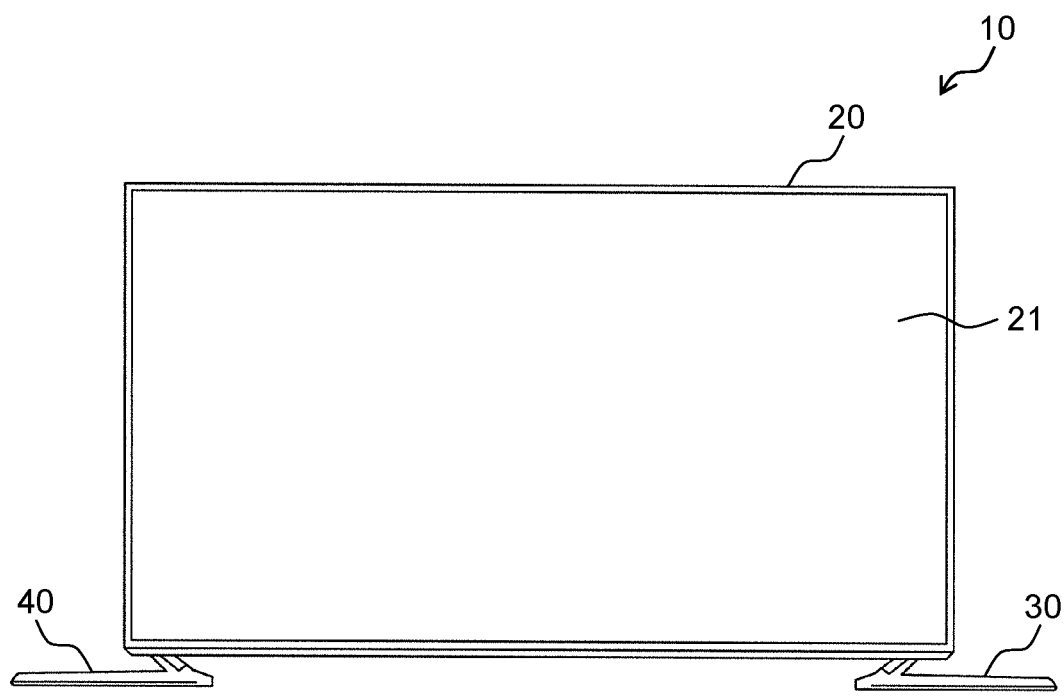
FIG. 14 is a front view schematically showing one example of an external appearance of the image display device after a design change according to the first exemplary embodiment.

FIG. 14 is a front view schematically showing one example of an external appearance of image display device 10 after a design change according to the first exemplary embodiment.

Figure 15:
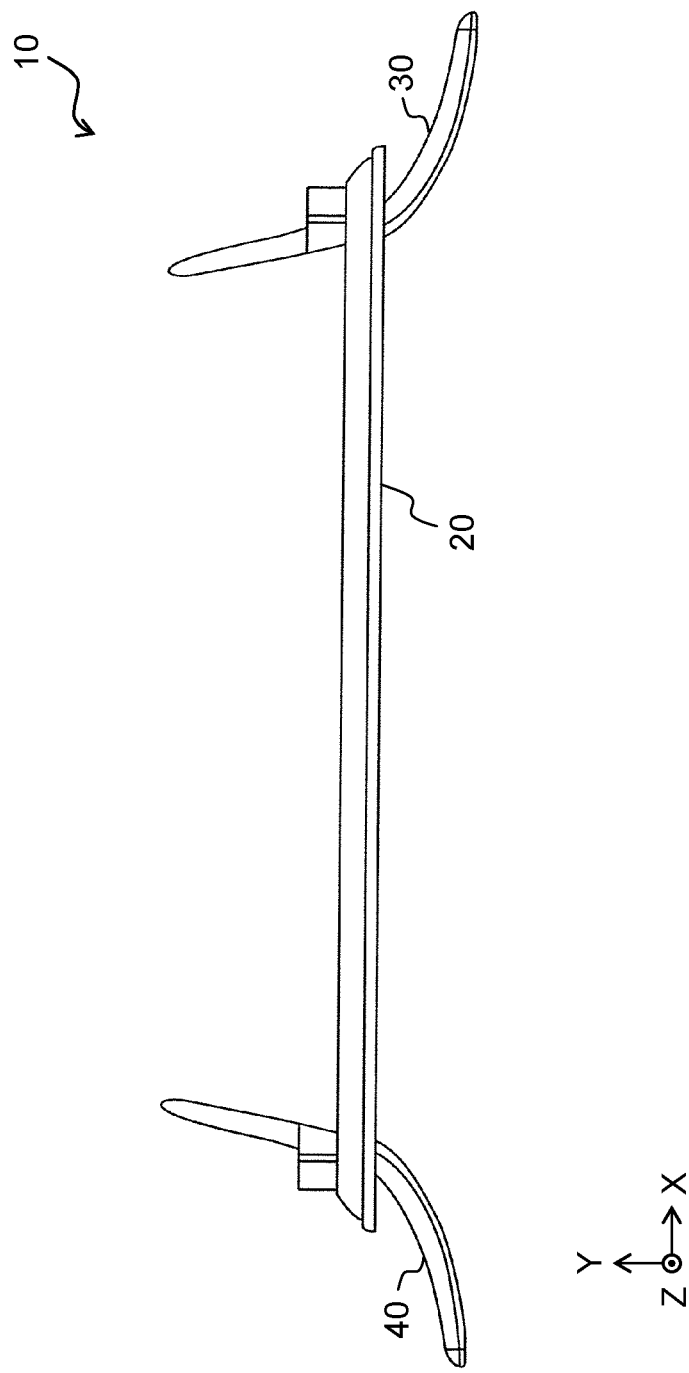
FIG. 15 is a top view schematically showing one example of an external appearance of the image display device after the design change according to the first exemplary embodiment.

FIG. 15 is a top view schematically showing one example of an external appearance of image display device 10 after the design change according to the first exemplary embodiment.

FIGS. 14 and 15 each show the one example of the external appearance of image display device 10 in a case where first support member 30 and second support member 40 are reversed (rotated by 180 degrees on the X-Y plane) from the state shown in FIGS. 1 and 2.

As can be seen from a comparison between FIGS. 1 and 14 and a comparison between FIGS. 2 and 15, the design (the external appearance) of image display device 10 is greatly changed before and after first support member 30 and second support member 40 are reversed. For example, image display device 10 having the external appearance shown in FIG. 14 can give a wide, broad foot, and flat impression to the user.

Each of FIGS. 16A to 16H is a top view showing an example of a design variation of image display device 10 according to the first exemplary embodiment. FIG. 16A is a top view schematically showing one example of an external appearance of image display device 10 according to the first exemplary embodiment. FIG. 16B is a top view schematically showing another example of an external appearance of image display device 10 according to the first exemplary embodiment. Each of FIGS. 16C to 16H is a top view schematically showing still another example of an external appearance of image display device 10 according to the first exemplary embodiment.

As mentioned above, in image display device 10 according to the present exemplary embodiment, first mounting member 50 can be mounted to any of first attachment part 70 to fourth attachment part 100, and second mounting member 60 can be mounted to any of the remaining attachment parts. Further, first mounting member 50 can be fitted to one of first support member 30 and second support member 40, and second mounting member 60 can be fitted to the other. Moreover, first support member 30 (or second support member 40) can also be reversed and fitted to first mounting member 50 (or second mounting member 60). With this configuration, the user can arbitrarily select the design (the external appearance) of image display device 10 from among, for example, eight combinations shown in FIGS. 16A to 16H. The user himself or herself can reattach first support member 30, second support member 40, and the like according to the design.

It should be noted that, in image display device 10 described in the first exemplary embodiment, first mounting member 50 and second mounting member 60 can also be mounted to first attachment part 70 to fourth attachment part 100 so as to be asymmetric with respect to the center line (shown by the broken line in FIG. 4) of display panel 20. Each of FIGS. 16A to 16H shows the example in which first mounting member 50 and second mounting member 60 are mounted to first attachment part 70 to fourth attachment part 100 so as to be symmetric with respect to the center line of display panel 20.

It should be noted that, as shown in FIGS. 16A to 16H, mounting positions of first mounting member 50 and second mounting member 60, combinations of first mounting member 50 and second mounting member 60 with first support member 30 and second support member 40, and mounting directions of first support member 30 and second support member 40 are respectively described specifically as follows:

(1) Two combinations in which first mounting member 50 and second mounting member 60 are mounted to two outward positions (relatively farther from the center line) or two inward positions (relatively closer to the center line) in the width direction of display panel 20;

(2) Two combinations in which first mounting member 50 and first support member 30 are fitted, and second mounting member 60 and second support member 40 are fitted, or first mounting member 50 and second support member 40 are fitted and second mounting member 60 and first support member 30 are fitted; and (3) Two combinations in which first support member 30 and second support member 40 are reversed or not reversed in the front and back direction (the Y-axis direction) of display panel 20.

With this configuration, in image display device 10, as shown in FIGS. 16A to 16H, for example, 8 (=2 cubed) combinations are possible regarding arrangement positions of first support member 30 and second support member 40.

It should be noted that a material for first support member 30 and second support member 40 is not particularly limited. Any material may be used as long as the material has proper strength, such as metal, resin, or glass. Further, the material may be selected according to the design of image display device 10, a texture desired to be felt by the user, or the like. For example, a metal framework coated with resin may be used for first support member 30 and second support member 40.

It should be noted that first support member 30 and second support member 40 may be referred to as "pedestals".

It should be noted that, in image display device 10, the protrusion/recess of protrusion 53 and recess 33 and recess 34 may be reversed each other. In other words, protrusions may be formed instead of recess 33 and recess 34, and a recess may be formed instead of protrusion 53. Alternatively, a structure of contact surface 58 and a structure of contact surface 32 may be exchanged with each other.

[1-5. Effects and Others]

As described above, according to the present exemplary embodiment, an image display device includes a display panel, a first support member, a second support member, a first mounting member, a second mounting member, a first attachment part, a second attachment part, a third attachment part, and a fourth attachment part. The display panel displays an image. The first support member and the second support member support the display panel in an erected state. The first mounting member is interposed by fitting between the display panel and one of the first support member and the second support member. The second mounting member is interposed by fitting between the display panel and the other of the first support member and the second support member. The first attachment part, the second attachment part, the third attachment part, and the fourth attachment part are provided on a back surface of the display panel and have structures fitted to at least one of the first mounting member and the second mounting member. The first attachment part, the second attachment part, the fourth attachment part, and the third attachment part are provided in this order from one end to the other end in a width direction of the back surface of the display panel.

It should be noted that image display device 10 is one example of the image display device. Display panel 20 is one example of the display panel. First support member 30 is one example of the first support member. Second support member 40 is one example of the second support member. First mounting member 50 is one example of the first mounting member. Second mounting member 60 is one example of the second mounting member. First attachment part 70 is one example of the first attachment part. Second attachment part 80 is one example of the second attachment part. Third attachment part 90 is one example of the third attachment part. Fourth attachment part 100 is one example of the fourth attachment part.

For example, in the example described in the first exemplary embodiment, image display device 10 includes display panel 20, first support member 30, second support member 40, first mounting member 50, second mounting member 60, first attachment part 70, second attachment part 80, third attachment part 90, and fourth attachment part 100. Display panel 20 displays the image. First support member 30 and second support member 40 support display panel 20 in the erected state. First mounting member 50 is interposed by fitting between display panel 20 and one of first support member 30 and second support member 40. Second mounting member 60 is interposed by fitting between display panel 20 and the other of first support member 30 and second support member 40. First attachment part 70, second attachment part 80, third attachment part 90, and fourth attachment part 100 are provided on the back surface of display panel 20 and have structures that are fitted to at least one of first mounting member 50 and second mounting member 60. Moreover, first attachment part 70, second attachment part 80, fourth attachment part 100, and third attachment part 90 are provided in this order from one end to the other end in the width direction of the back surface of display panel 20.

In image display device 10 configured as above, for example, as can be seen from the comparison between FIGS. 1 and 5 and the comparison between FIGS. 2 and 6, the user can reattach first mounting member 50 and second mounting member 60 to any of first attachment part 70 to fourth attachment part 100. As a result, the user can easily change the design (the external appearance) of image display device 10. For example, in a case where there is an ornament or the like around image display device 10, the user can change arrangement of first support member 30 and second support member 40 so that first support member 30 or second support member 40 is not in contact with the ornament. Further, the user can appropriately change the arrangement of first support member 30 and second support member 40 according to a size or a shape of an installation location of image display device 10.

In the image display device, the first support member and the second support member may be disposed so as to cross a lower part of the display panel in a front and back direction of the display panel. The first support member and the second support member may have an asymmetric shape in the front and back direction of the display panel.

For example, according to the example described in the first exemplary embodiment, in image display device 10, first support member 30 and second support member 40 are disposed so as to cross the lower part of display panel 20 in the front and back direction of display panel 20. First support member 30 and second support member 40 have the asymmetric shape in the front and back direction of display panel 20.

In image display device 10 configured as above, first support member 30 and second support member 40 have the asymmetric shape in the front and back direction (the Y-axis direction) of display panel 20. Accordingly, compared with a case where first support member and second support member are not asymmetric (that is, first support member and second support member are symmetric), the design variation of image display device 10 can be increased.

In the image display device, the first support member may have a structure that can be fitted to one mounting member of the first mounting member and the second mounting member, even after the first support member is reversed in the front and back direction of the display panel from a state in which the first support member is fitted to the one mounting member. The second support member may have a structure that can be fitted to the other mounting member of the first mounting member and the second mounting member, even after the second support member is reversed in the front and back direction of the display panel from a state in which the second support member is fitted to the other mounting member.

For example, according to the example described in the first exemplary embodiment, in image display device 10, first support member 30 has the structure that can be fitted to one mounting member of first mounting member 50 and second mounting member 60, even after first support member 30 is reversed in the front and back direction of display panel 20 from the state in which first support member 30 is fitted to the one mounting member. Second support member 40 has the structure that can be fitted to the other mounting member of first mounting member 50 and second mounting member 60, even after second support member 40 is reversed in the front and back direction of display panel 20 from the state in which second support member 40 is fitted to the other mounting member.

In image display device 10 configured as above, the user can reverse first support member 30 and second support member 40 from the original installation state (rotate by 180 degrees on the installation surface of image display device 10). With this configuration, the design variation of image display device 10 changed by the user can be increased in image display device 10.

In the image display device, the first mounting member may have a first fitting part, and the second mounting member may have a second fitting part. Each of the first fitting part and the second fitting part may have a protruded shape or a recessed shape localized in the width direction of the display panel. The first support member may have a third fitting part, and the second support member may have a fourth fitting part. Each of the third fitting part and the fourth fitting part may have a pair of recessed shapes or protruded shapes that can be fitted to the protruded shape or the recessed shape, even after the first support member or the second support member is reversed in the front and back direction of the display panel from a state in which the pair of recessed shapes or protruded shapes is fitted to the protruded shape or the recessed shape of the first mounting member or the second mounting member.

It should be noted that first fitting part 52 is one example of the first fitting part. Protrusion 53 is one example of the protruded shape or the recessed shape included in the first fitting part and the second fitting part. Third fitting part 31 is one example of the third fitting part. Recess 33 and recess 34 are one example of the pair of recessed shapes or protruded shapes included in the third fitting part and the fourth fitting part.

For example, according to the example described in the first exemplary embodiment, in image display device 10, first mounting member 50 has first fitting part 52, and second mounting member 60 has second fitting part (not shown) similar to first fitting part 52. Each of first fitting part 52 and second fitting part has protrusion 53 localized in the width direction of display panel 20. First support member 30 has third fitting part 31, and second support member 40 has the fourth fitting part (not shown) similar to third fitting part 31. Each of third fitting part 31 and the fourth fitting part has the pair of recess 33 and recess 34 that can be fitted to protrusion 53, even after first support member 30 or second support member 40 is reversed in the front and back direction of display panel 20 from the state in which the pair of recess 33 and recess 34 is fitted to protrusion 53 of first mounting member 50 or second mounting member 60.

In image display device 10 configured as above, it is possible to reverse first support member 30 and second support member 40 from the original installation states (rotate by 180 degrees on the installation surface of image display device 10) while first mounting member 50 and second mounting member 60 are attached to any of first attachment part 70 to fourth attachment part 100. With this configuration, as can be seen from the comparison between FIGS. 1 and 14 and the comparison between FIGS. 2 and 15, the user can easily change the design of image display device 10.

In the image display device, the first attachment part may have a first groove, the second attachment part may have a second groove, the third attachment part may have a third groove, and the fourth attachment part may have a fourth groove. Either of the first mounting member and the second mounting member may be configured so as to be inserted and fitted into each of the first groove, the second groove, the third groove, and the fourth groove.

It should be noted that groove 71 of first attachment part 70 is one example of the first groove. The groove of second attachment part 80 is one example of the second groove. The groove of third attachment part 90 is one example of the third groove. The groove of fourth attachment part 100 is one example of the fourth groove.

For example, according to the example described in the first exemplary embodiment, in image display device 10, first attachment part 70 has groove 71, second attachment part 80 has the second groove similar to groove 71, third attachment part 90 has the third groove similar to groove 71, and fourth attachment part 100 has the fourth groove similar to groove 71. Either of first mounting member 50 and second mounting member 60 is configured so as to be inserted and fitted into each of groove 71, the second groove, the third groove, and the fourth groove.

In image display device 10 configured as above, the user can attach first mounting member 50 and second mounting member 60 to any of first attachment part 70 to fourth attachment part 100 by inserting first mounting member 50 and second mounting member 60 in any of the first groove to the fourth groove. With this configuration, the user can change the design of image display device 10 by comparatively easy work, such as reinsertion of first mounting member 50 and second mounting member 60 from any of the first groove to the fourth groove to any of the others.

Modified Example of First Exemplary Embodiment

In the aforementioned first exemplary embodiment, a configuration example in which display panel 20 is erected perpendicular to the installation surface (the X-Y plane) of image display device 10 is described. However, the present disclosure is not limited at all to this configuration. An image display device may support display panel 20 in a state in which display panel 20 is inclined from a vertical direction so as to have an elevation angle with respect to an installation surface (an X-Y plane). In other words, a first support member and a second support member may support display panel 20 in an inclined state with respect to a Z-axis. In a modified example of the first exemplary embodiment, display panel 20 is disposed in the image display device so that display panel 20 has the elevation angle with respect to the installation surface (the X-Y plane). This configuration example is described with reference to FIGS. 17A to 17J.

It should be noted that image display device 110 described in the modified example of the first exemplary embodiment is substantially identical to image display device 10 described in the first exemplary embodiment, except that image display device 110 includes an inclination member and that a first mounting member and a second mounting member are not formed at right angles. Hereinafter, a description of matters described in the first exemplary embodiment is omitted as appropriate, and points different from the first exemplary embodiment are mainly described.

It should be noted that, in the following description, components that are substantially identical to the components included in image display device 10 described in the first exemplary embodiment have the same reference marks, and that descriptions of those components may be omitted.

[2-1. Configuration]

Figure 17A:
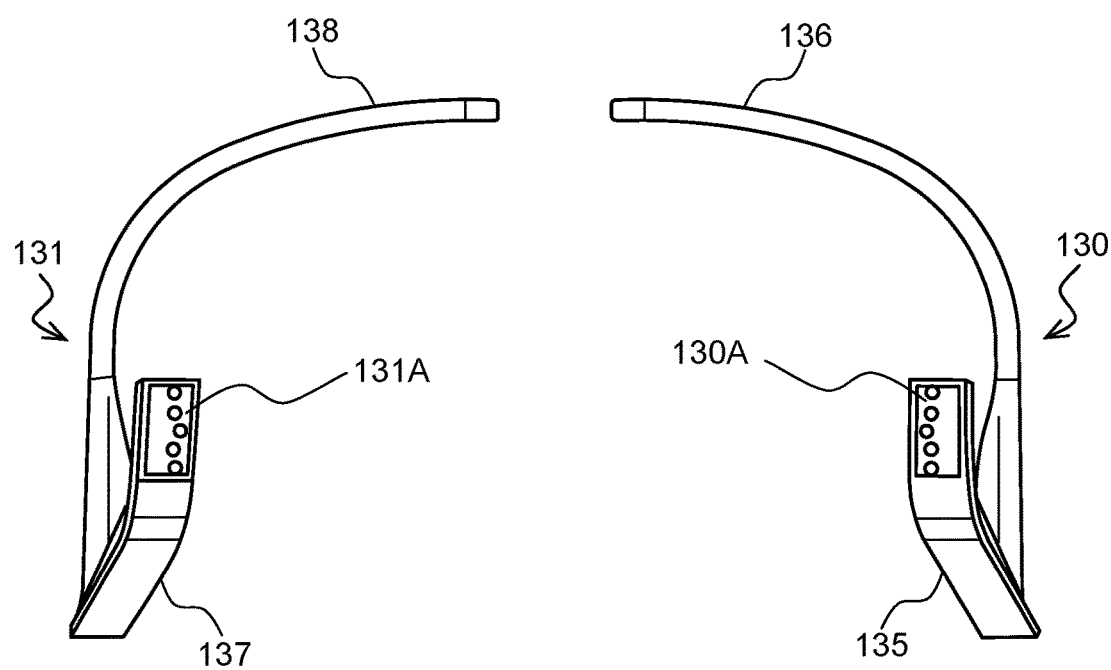
FIG. 17A is a top view schematically showing one example of an external appearance of a first support member and a second support member, to each of which an inclination member is mounted, according to a modified example of the first exemplary embodiment.

FIG. 17A is a top view schematically showing one example of an external appearance of first support member 130 and second support member 131, to which an inclination member is mounted, according to the modified example of the first exemplary embodiment.

Figure 17B:
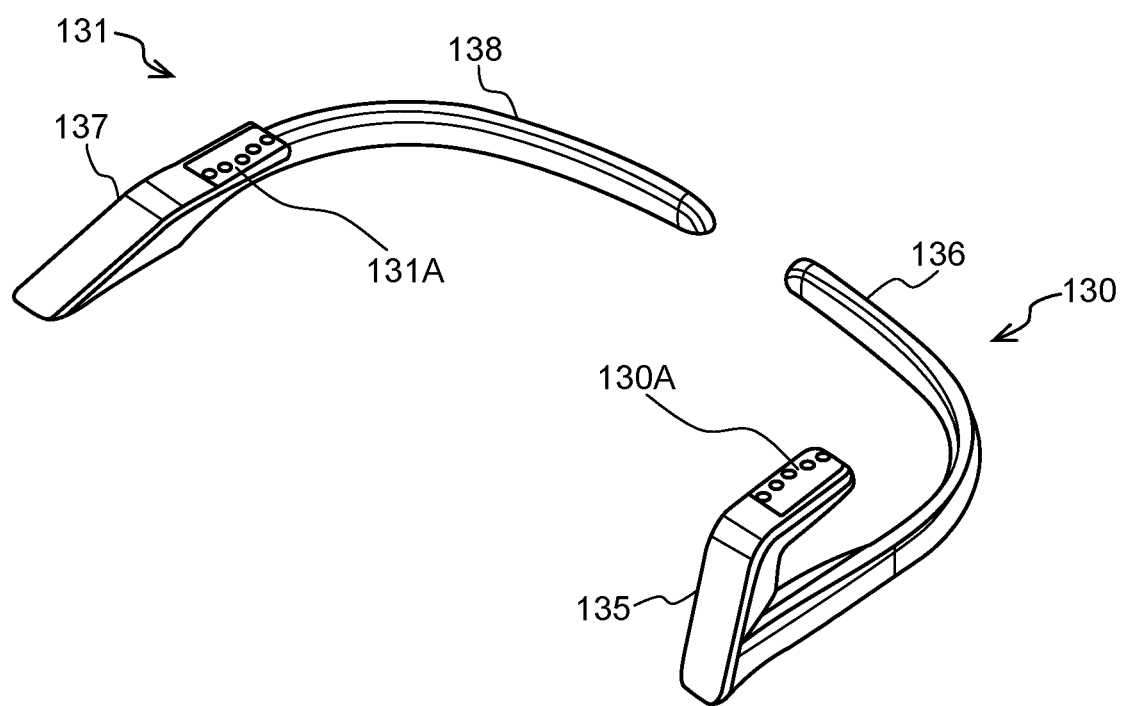
FIG. 17B is a perspective view schematically showing one example of an external appearance of the first support member and the second support member, to each of which the inclination member is mounted, according to the modified example of the first exemplary embodiment.

FIG. 17B is a perspective view schematically showing one example of an external appearance of first support member 130 and second support member 131, to which the inclination member is mounted, according to the modified example of the first exemplary embodiment.

As shown in FIGS. 17A and 17B, according to the modified example of the first exemplary embodiment, first support member 130 is configured to include leg 136 and base 135, and second support member 131 is configured to include leg 138 and base 137. Moreover, in the present modified example, first support member 130 includes inclination member 130A, and second support member 131 includes inclination member 131A.

Inclination member 130A is disposed on a top surface of base 135 of first support member 130, and inclination member 131A is disposed on a top surface of base 137 of second support member 131. Therefore, as described below, inclination member 130A is sandwiched between the top surface of base 135 of first support member 130 and contact surface 58 of first mounting member 120 (or second mounting member 121) (see FIG. 17C), and inclination member 131A is sandwiched between the top surface of base 137 of second support member 131 and contact surface 58 of second mounting member 121 (or first mounting member 120).

In the present modified example, inclination member 130A is a thin plate-shaped member with a substantially rectangular shape. A top surface of inclination member 130A (a surface that is in contact with contact surface 58 of first mounting member 120 or second mounting member 121) and a bottom surface of inclination member 130A (a surface that is in contact with the top surface of base 135) are not parallel to each other. The top surface of inclination member 130A has an inclination of, for example, 1.5 degrees with respect to the bottom surface of inclination member 130A so as to be inclined to leg 136 side of first support member 130. Therefore, in the present modified example, contact surface 58 of first mounting member 120 (or second mounting member 121) that is in contact with the top surface of inclination member 130A is not parallel to the installation surface (the X-Y plane), but is inclined to leg 136 side of first support member 130 by 1.5 degrees with respect to the installation surface (the X-Y plane).

Inclination member 131A has a shape substantially identical to the shape of inclination member 130A. Therefore, contact surface 58 of second mounting member 121 (or first mounting member 120) that is in contact with a top surface of inclination member 131A is also not parallel to the installation surface (the X-Y plane), but is inclined to leg 138 side of second support member 131 by 1.5 degrees with respect to the installation surface (the X-Y plane).

Figure 17C:
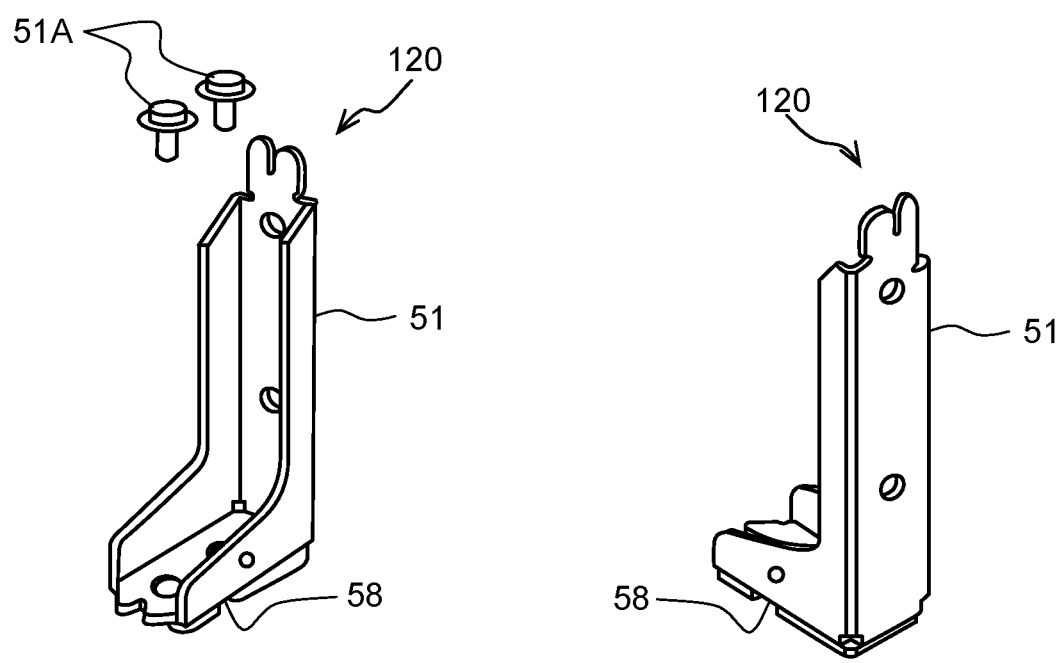
FIG. 17C is a perspective view schematically showing one example of an external appearance of a first mounting member according to the modified example of the first exemplary embodiment.

FIG. 17C is a perspective view schematically showing one example of an external appearance of first mounting member 120 according to the modified example of the first exemplary embodiment. It should be noted that FIG. 17C shows two perspective views of first mounting member 120 as seen from mutually different angles.

In the present modified example, insertion part 51 of first mounting member 120 is not perpendicular to contact surface 58, but is set at 88.5 degrees with respect to contact surface 58. In other words, insertion part 51 is inclined to contact surface 58 side from the vertical direction by 1.5 degrees in first mounting member 120. Moreover, first mounting member 120 is fixed to inclination member 130A by screws 51A. Although not shown, second mounting member 121 (see FIG. 17E) is also formed in a shape substantially identical to the shape of first mounting member 120.

Next, a description is given of a configuration example in which first support member 130 is mounted to first mounting member 120 and second support member 131 is mounted to second mounting member 121.

Figure 17D:
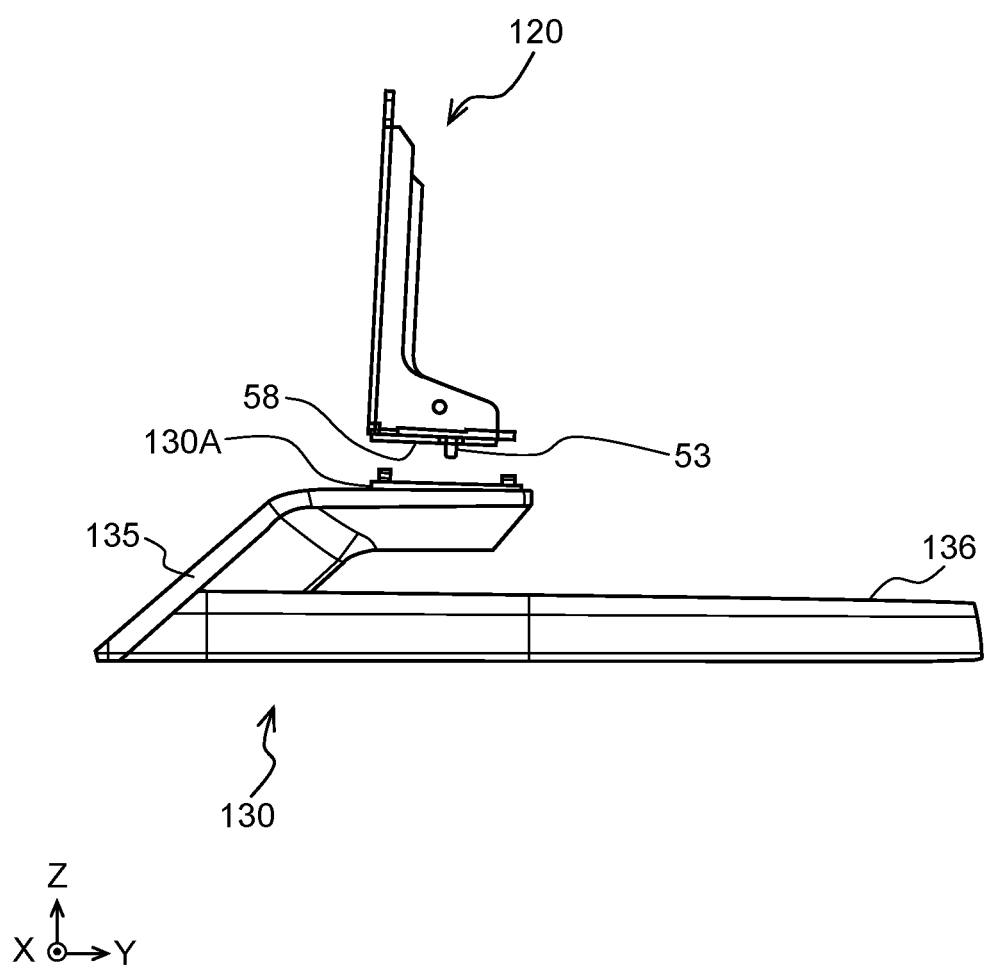
FIG. 17D is a side view when the first support member is mounted to the first mounting member according to the modified example of the first exemplary embodiment.

FIG. 17D is a side view when first support member 130 is mounted to first mounting member 120 according to the modified example of the first exemplary embodiment. It should be noted that, although not shown, inclination member 130A and inclination member 131A are each provided with a recess fitted to protrusion 53 provided on contact surface 58 of first mounting member 120 or second mounting member 121.

Figure 17E:
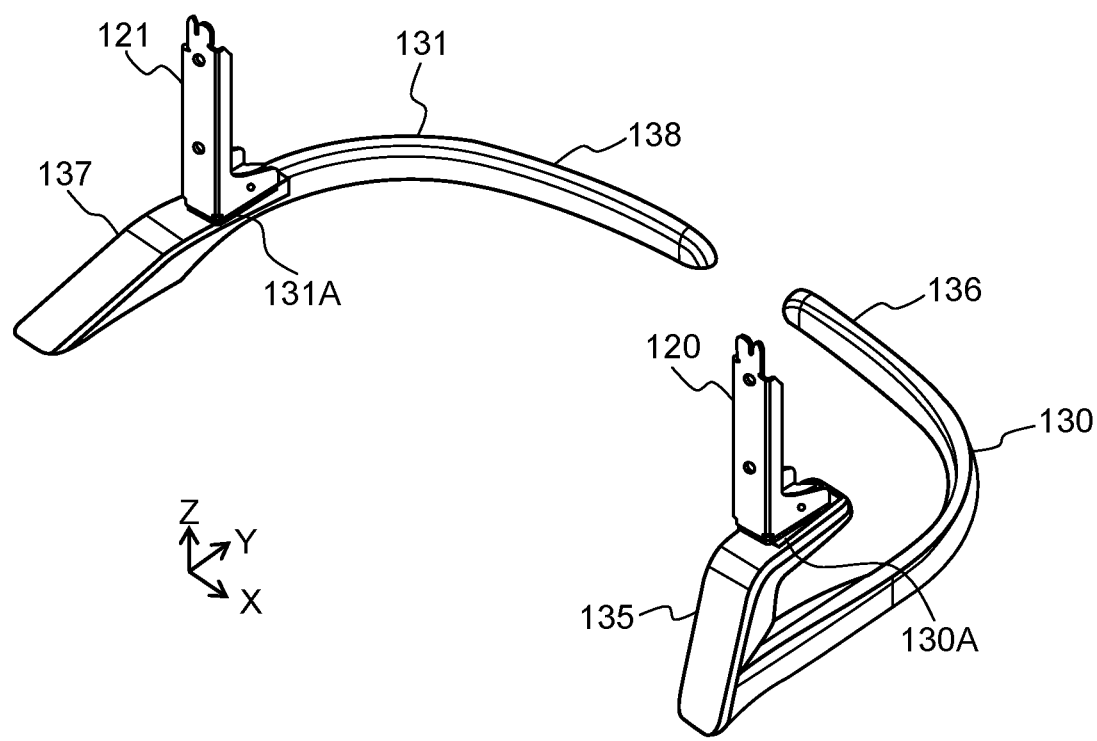
FIG. 17E is a perspective view schematically showing one example of an external appearance when the first support member has been mounted to the first mounting member and the second support member has been mounted to a second mounting member according to the modified example of the first exemplary embodiment.

FIG. 17E is a perspective view schematically showing one example of an external appearance when first support member 130 is mounted to first mounting member 120 and second support member 131 is mounted to second mounting member 121 according to the modified example of the first exemplary embodiment.

Figure 17F:
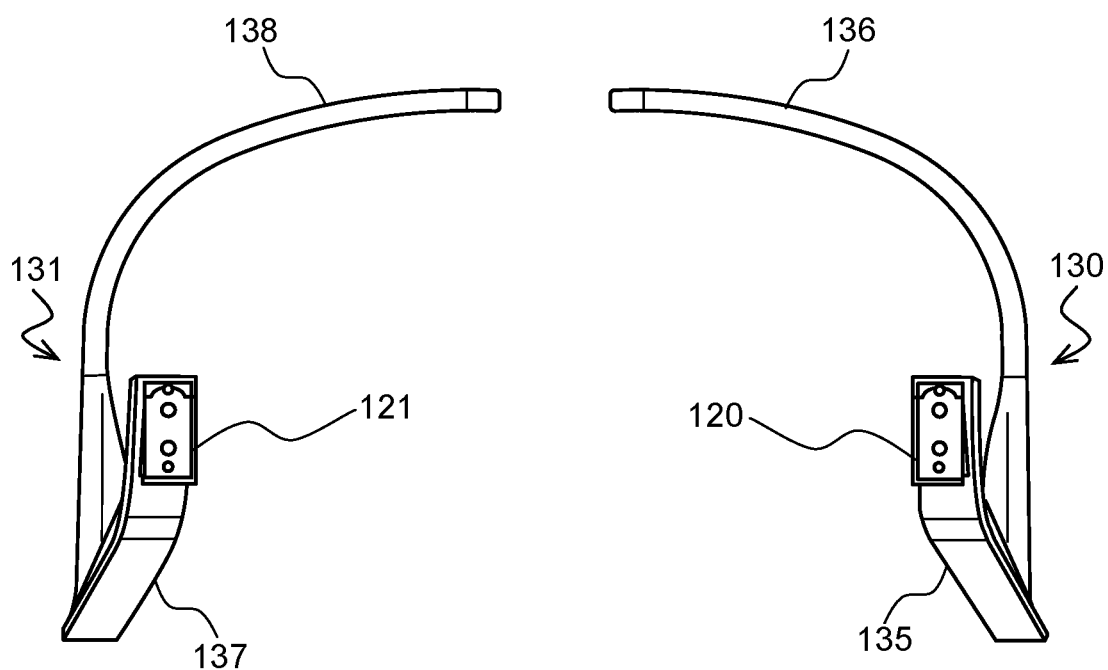
FIG. 17F is a top view schematically showing one example of an external appearance when the first support member has been mounted to the first mounting member and the second support member has been mounted to the second mounting member according to the modified example of the first exemplary embodiment.

FIG. 17F is a top view showing a state shown in FIG. 17E from a top. It should be noted that FIG. 17F shows only parts of first mounting member 120 and second mounting member 121.

FIG. 17G is a front view showing the state shown in FIG. 17E from a front.

Figure 17H:
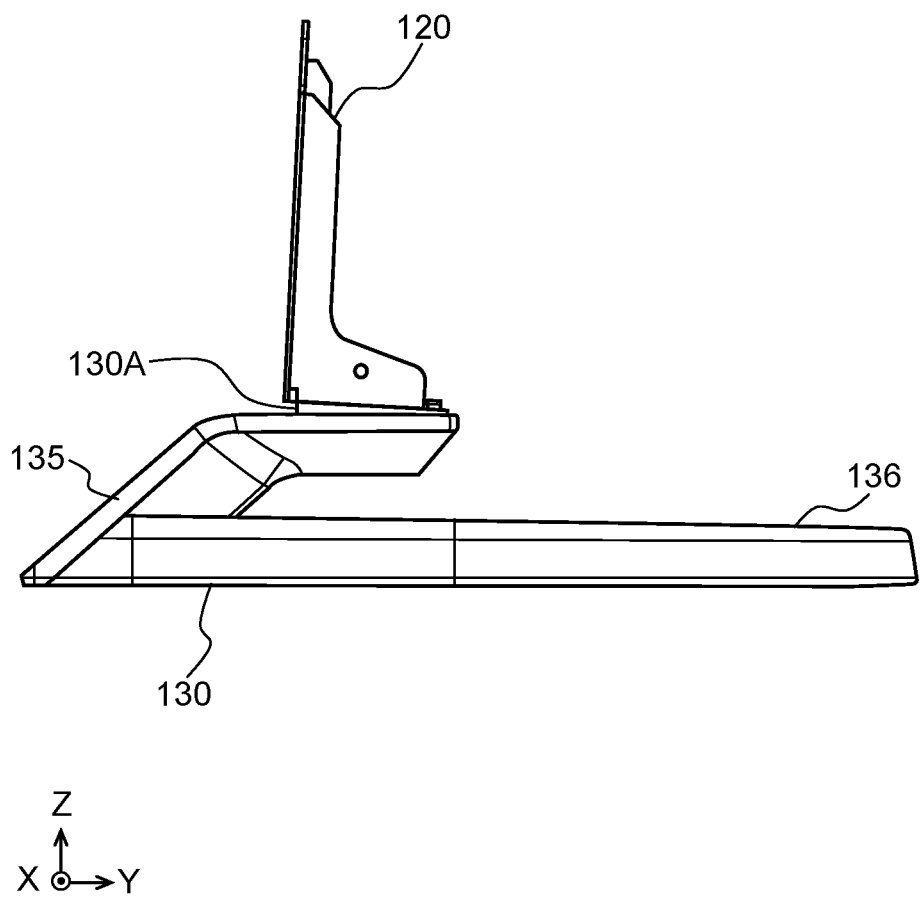
FIG. 17H is a side view schematically showing one example of an external appearance when the first support member has been mounted to the first mounting member and the second support member has been mounted to the second mounting member according to the modified example of the first exemplary embodiment.

FIG. 17H is a side view showing the state shown in FIG. 17E from a side surface.

Figure 17I:
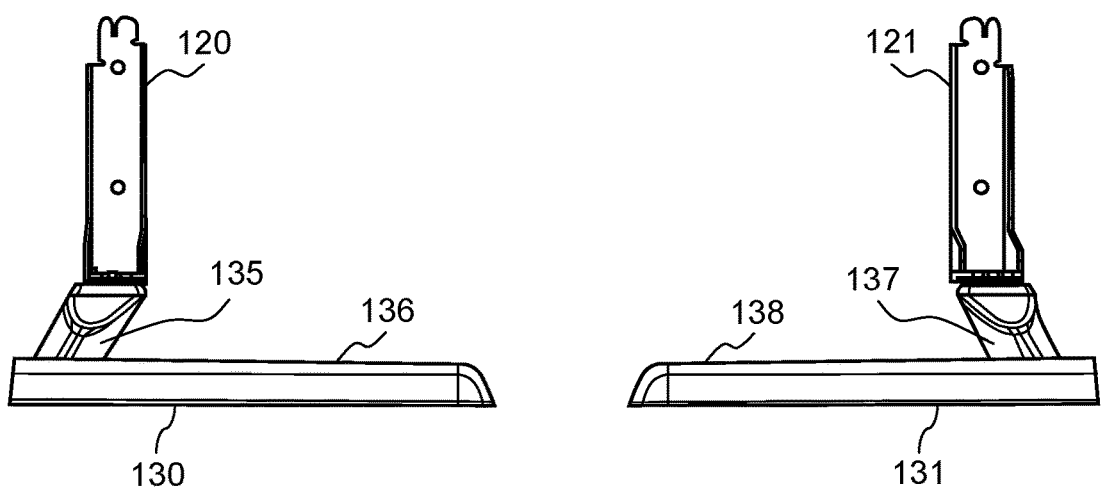
FIG. 17I is a back view schematically showing one example of an external appearance when the first support member has been mounted to the first mounting member and the second support member has been mounted to the second mounting member according to the modified example of the first exemplary embodiment.

FIG. 17I is a back view showing the state shown in FIG. 17E from a back surface.

Figure 17J:
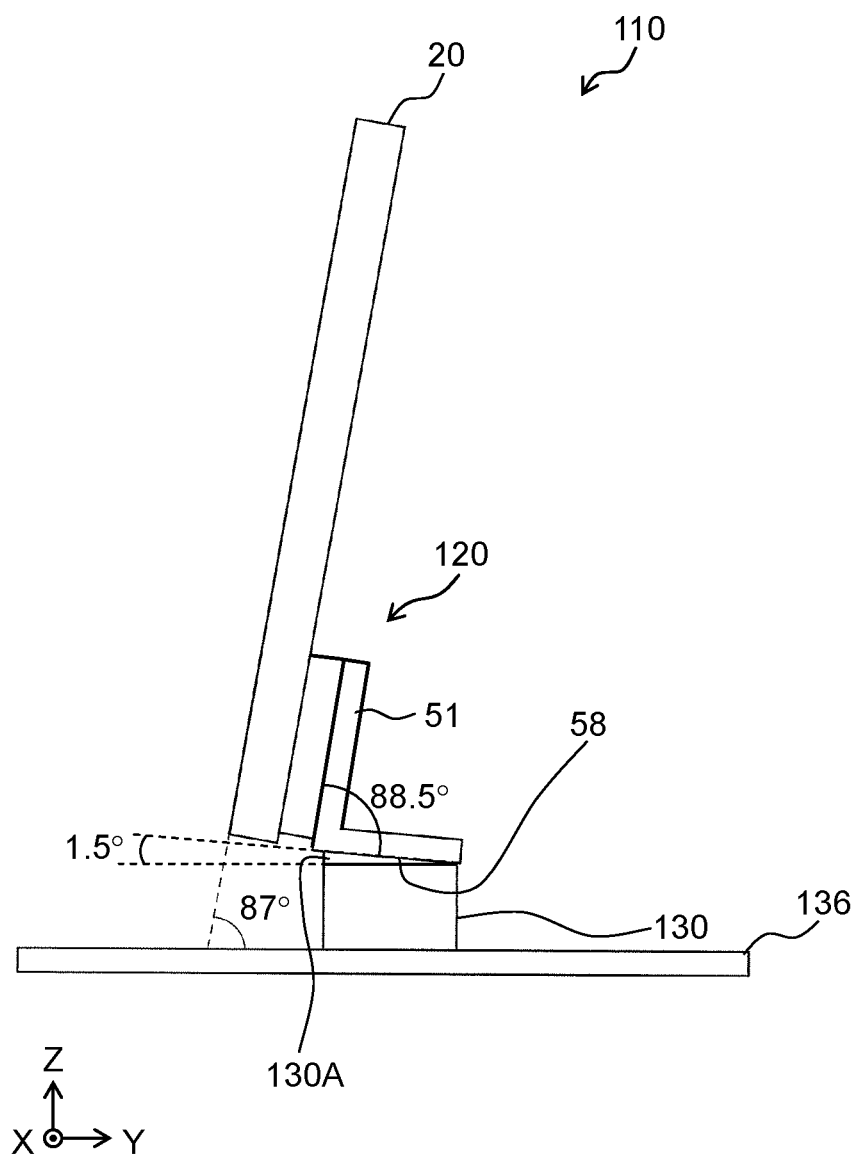
FIG. 17J is a side view schematically showing one example of an external appearance of an image display device according to the modified example of the first exemplary embodiment.

FIG. 17J is a side view schematically showing one example of an external appearance of image display device 110 according to the modified example of the first exemplary embodiment. FIG. 17J schematically shows an angle of display panel 20 when display panel 20 is supported by first mounting member 120 and second mounting member 121 shown in FIG. 17E.

As mentioned above, in the present modified example, inclination member 130A having the inclination of 1.5 degrees is sandwiched between the top surface of base 135 of first support member 130 and contact surface 58 of first mounting member 120, and inclination member 131A having the inclination of 1.5 degrees is sandwiched between the top surface of base 137 of second support member 131 and contact surface 58 of second mounting member 121 (see FIGS. 17D to 17I).

Therefore, as schematically shown in FIG. 17J, contact surface 58 of first mounting member 120 is not parallel to the installation surface (the X-Y plane) of image display device 110, but is inclined to a back side of image display device 110 by 1.5 degrees with respect to the installation surface (the X-Y plane). Similarly, contact surface 58 of second mounting member 121 is also inclined to the back side of image display device 110 by 1.5 degrees with respect to the installation surface (the X-Y plane) (not shown).

Moreover, as mentioned above, insertion part 51 of first mounting member 120 is not perpendicular to contact surface 58, but is set at 88.5 degrees with respect to contact surface 58. The same applies to second mounting member 121.

With this configuration, in image display device 110 shown in FIG. 17J, display panel 20 is not perpendicular to the installation surface (the X-Y plane), but is supported at an angle of 87 degrees with respect to the installation surface (the X-Y plane) by first mounting member 120 and second mounting member 121. In other words, display panel 20 shown in FIG. 17J is supported in a state in which display panel 20 is inclined to the back side of display panel 20 by 3 degrees from the vertical direction (a Z-axis direction). Therefore, in image display device 110, an image display surface of display panel 20 supported by first mounting member 120, to which first support member 130 is mounted, and second mounting member 121, to which second support member 131 is mounted, has an elevation angle of 3 degrees with respect to the installation surface (the X-Y plane).

It should be noted that, in image display device 110, second support member 131 may be mounted to first mounting member 120 and first support member 130 may be mounted to second mounting member 121.

Figure 17K:
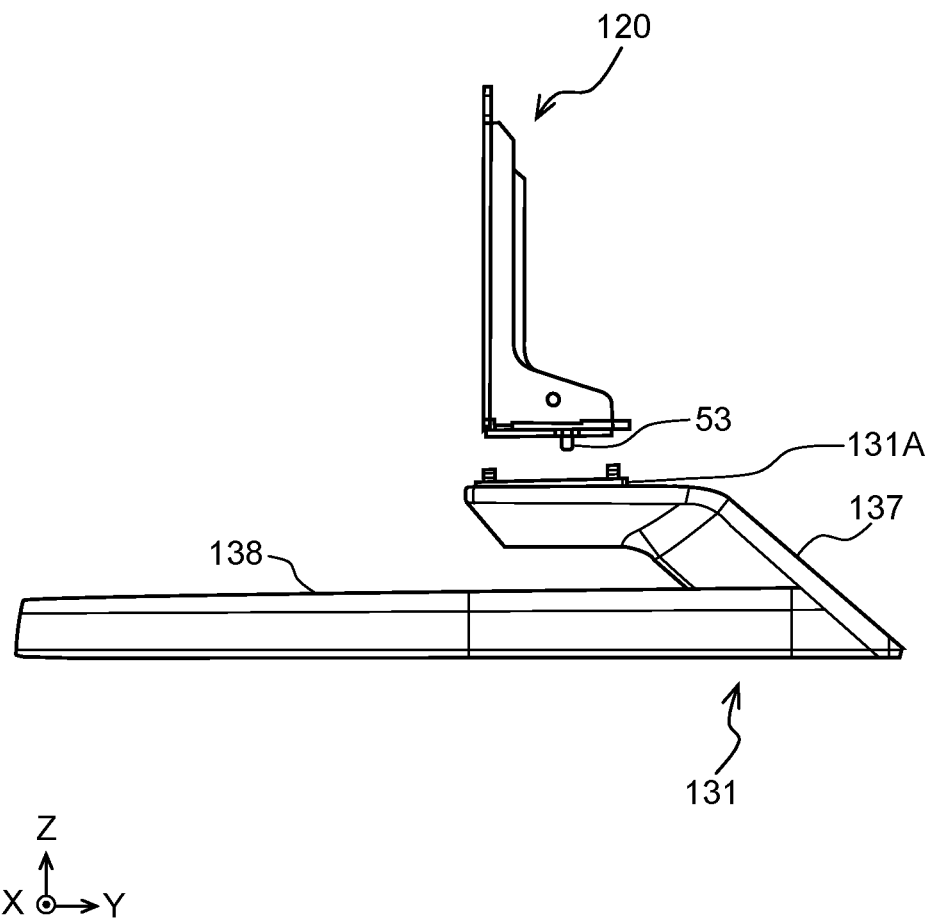
FIG. 17K is a side view when the second support member is mounted to the first mounting member according to the modified example of the first exemplary embodiment.

FIG. 17K is a side view when second support member 131 is mounted to first mounting member 120 according to the modified example of the first exemplary embodiment.

FIG. 17L is a side view schematically showing another example of an external appearance of image display device 110 according to the modified example of the first exemplary embodiment. FIG. 17L schematically shows an angle of display panel 20 when display panel 20 is supported by first mounting member 120, to which second support member 131 is mounted, and second mounting member 121, to which first support member 130 is mounted.

When second support member 131 is mounted to first mounting member 120 and first support member 130 is mounted to second mounting member 121, first support member 130 and second support member 131 may be reversed from the state shown in FIGS. 17D to 17I (rotated on the installation surface by 180 degrees). In this case, inclination member 130A and inclination member 131A are also reversed from the state shown in FIGS. 17D to 17I (rotated on the installation surface by 180 degrees).

With this configuration, as schematically shown in FIG. 17L, contact surface 58 of first mounting member 120 that is in contact with the top surface of inclination member 131A is inclined to the image display surface side of display panel 20 by 1.5 degrees with respect to the installation surface (the X-Y plane). Similarly, contact surface 58 of second mounting member 121 that is in contact with the top surface of inclination member 130A is also inclined to the image display surface side of display panel 20 by 1.5 degrees with respect to the installation surface (the X-Y plane) (not shown).

As mentioned above, insertion part 51 of first mounting member 120 is not perpendicular to contact surface 58, but is set at 88.5 degrees with respect to contact surface 58. The same applies to second mounting member 121.

Therefore, in a configuration example shown in FIGS. 17K and 17L, inclination of contact surface 58 with respect to the installation surface (the X-Y plane) (1.5 degrees) is added to an angle of insertion part 51 with respect to contact surface 58 (88.5 degrees). Accordingly, an angle formed by insertion part 51 of first mounting member 120 with respect to the installation surface (the X-Y plane) becomes 90 degrees. The same applies to an angle formed by insertion part 51 of second mounting member 121 with respect to the installation surface (the X-Y plane).

With this configuration, in image display device 110 shown in FIG. 17L, display panel 20 is supported perpendicularly to the installation surface (the X-Y plane) by first mounting member 120 and second mounting member 121. Therefore, in image display device 110 shown in FIG. 17L, display panel 20 supported by first mounting member 120, to which second support member 131 is mounted, and second mounting member 121, to which first support member 130 is mounted, is perpendicular to the installation surface (the X-Y plane).

It should be noted that inclination angles of inclination member 130A and inclination member 131A are not limited at all to 1.5 degrees. The inclination angles may be other angles. Further, instead of providing inclination member 130A and inclination member 131A, base 135 and base 137 may be formed so that the respective top surfaces of base 135 and base 137 are inclined with respect to the installation surface (the X-Y plane). Further, the angles of insertion parts 51 with respect to contact surfaces 58 in first mounting member 120 and second mounting member 121 are also not limited at all to 88.5 degrees. The angles may be other angles.

It should be noted that, as described in the present modified example as one example, the respective members may be formed so that a sum of the inclination angles of inclination member 130A and inclination member 131A (for example, 1.5 degrees) and the angles of insertion parts 51 with respect to contact surfaces 58 in first mounting member 120 and second mounting member 121 (for example, 88.5 degrees) is 90 degrees. With this configuration, a user using image display device 110 can arbitrarily set whether display panel 20 is perpendicular to the installation surface (the X-Y plane) or whether the display surface of display panel 20 is inclined from the vertical direction so as to have the elevation angle. The setting depends on the combination of first mounting member 120 and second mounting member 121 with first support member 130 and second support member 131.

[2-2. Effects and Others]

In the image display device, a contact surface of the first mounting member supported by one of the first support member and the second support member may be inclined with respect to an installation surface, on which the image display device is installed. A contact surface of the second mounting member supported by the other of the first support member and the second support member may be inclined with respect to the installation surface.

In the image display device, the first support member and the second support member may each have an inclination member on a surface that supports the first mounting member or the second mounting member.

In the image display device, the first mounting member may be formed so that a sum of an inclination angle of the contact surface of the first mounting member with respect to the installation surface and an angle formed by the contact surface of the first mounting member and a surface of the first mounting member that supports the display panel is 90 degrees. The second mounting member may be formed so that a sum of an inclination angle of the contact surface of the second mounting member with respect to the installation surface and an angle formed by the contact surface of the second mounting member and a surface of the second mounting member that supports the display panel is 90 degrees.

It should be noted that first mounting member 120 is one example of the first mounting member. Second mounting member 121 is one example of the second mounting member. First support member 130 is one example of the first support member. Second support member 131 is one example of the second support member. Contact surface 58 is one example of the contact surface of the first mounting member, and is one example of the contact surface of the second mounting member. The inclination angle of 1.5 degrees is one example of the inclination angle formed by the contact surface of the first mounting member with respect to the installation surface, and is one example of the inclination angle formed by the contact surface of the second mounting member with respect to the installation surface. The top surface of base 135 is one example of the surface of the first support member that supports the first mounting member or the second mounting member. The top surface of base 137 is one example of the surface of the second support member that supports the first mounting member or the second mounting member. Inclination member 130A is one example of the inclination member of the first support member. Inclination member 131A is one example of the inclination member of the second support member. The angle of 88.5 degrees is one example of the angle formed by the contact surface of the first mounting member and the surface of the first mounting member that supports the display panel, and is one example of the angle formed by the contact surface of the second mounting member and the surface of the second mounting member that supports the display panel. The surface of insertion part 51 on display panel 20 side is one example of the surface of the first mounting member that supports the display panel, and is one example of the surface of the second mounting member that supports the display panel.

For example, in the example described in the modified example of the first exemplary embodiment, in image display device 110, contact surface 58 of first mounting member 120 supported by one of first support member 130 and second support member 131 is inclined at the inclination angle of 1.5 degrees with respect to the installation surface (the X-Y plane), on which image display device 110 is installed. Contact surface 58 of second mounting member 121 supported by the other of first support member 130 and second support member 131 is inclined at the inclination angle of 1.5 degrees with respect to the installation surface.

Further, in the example described in the modified example of the first exemplary embodiment, in image display device 110, first support member 130 has inclination member 130A on the surface that supports first mounting member 120 or second mounting member 121 (the top surface of base 135). Second support member 131 has inclination member 131A on the surface that supports first mounting member 120 or second mounting member 121 (the top surface of base 137).

Further, in the example described in the modified example of the first exemplary embodiment, in image display device 110, first mounting member 120 is formed so that the sum of the inclination angle of contact surface 58 of first mounting member 120 with respect to the installation surface (the X-Y plane) (1.5 degrees) and the angle formed by contact surface 58 of first mounting member 120 and the surface of first mounting member 120 that supports display panel 20 (the surface of insertion part 51 on display panel 20 side) (88.5 degrees) is 90 degrees. Further, second mounting member 121 is formed so that the sum of the inclination angle of contact surface 58 of second mounting member 121 with respect to the installation surface (1.5 degrees) and the angle formed by contact surface 58 of second mounting member 121 and the surface of second mounting member 121 that supports display panel 20 (88.5 degrees) is 90 degrees.

In image display device 110 configured in this way, the user using image display device 110 can arbitrarily set whether display panel 20 is perpendicular to the installation surface (the X-Y plane) of image display device 110 or whether the display surface of display panel 20 is inclined from the vertical direction so as to have the elevation angle with respect to the installation surface. The setting depends on the combination of first mounting member 120 and second mounting member 121 with first support member 130 and second support member 131, and on whether or not first support member 130 and second support member 131 are reversed (rotated by 180 degrees on the installation surface). In other words, in image display device 110, the user can easily change the design of image display device 110 including the angle of display panel 20 with respect to the installation surface.

Second Exemplary Embodiment

Next, a second exemplary embodiment is described with reference to FIGS. 18 to 22.

In the first exemplary embodiment and the modified example of the first exemplary embodiment, descriptions are given of the configuration examples in which the first support member and the second support member can be mounted to the first mounting member or the second mounting member by reversing the first support member and the second support member from the original mounting direction. However, the present disclosure is not limited at all to these configuration examples. In the second exemplary embodiment, a description is given of a configuration example in which a mounting direction of a first support member and a second support member with respect to a first mounting member or a second mounting member is limited. It should be noted that an image display device described in the second exemplary embodiment is substantially identical to image display device 10 described in the first exemplary embodiment, except that configurations of contact surfaces of the first support member and the second support member (contact surfaces with respect to the first mounting member or the second mounting member) are different. Hereinafter, a description of matters described in the first exemplary embodiment is omitted as appropriate, and points different from the first exemplary embodiment are mainly described.

It should be noted that, in the following description, components that are substantially identical to the components included in image display device 10 described in the first exemplary embodiment have the same reference marks, and that descriptions of those components may be omitted.

[3-1. First Support Member and Second Support Member]

Figure 18:
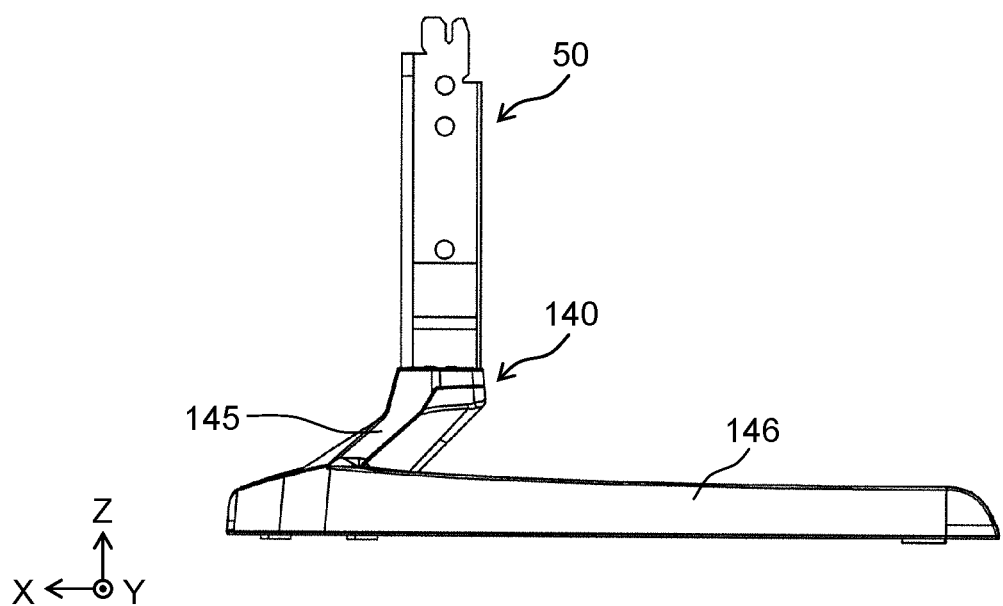
FIG. 18 is a back view schematically showing one example of an external appearance of a first mounting member and a first support member in an image display device according to a second exemplary embodiment.

FIG. 18 is a back view schematically showing one example of an external appearance of first mounting member 50 and first support member 140 in the image display device according to the second exemplary embodiment.

Figure 19:
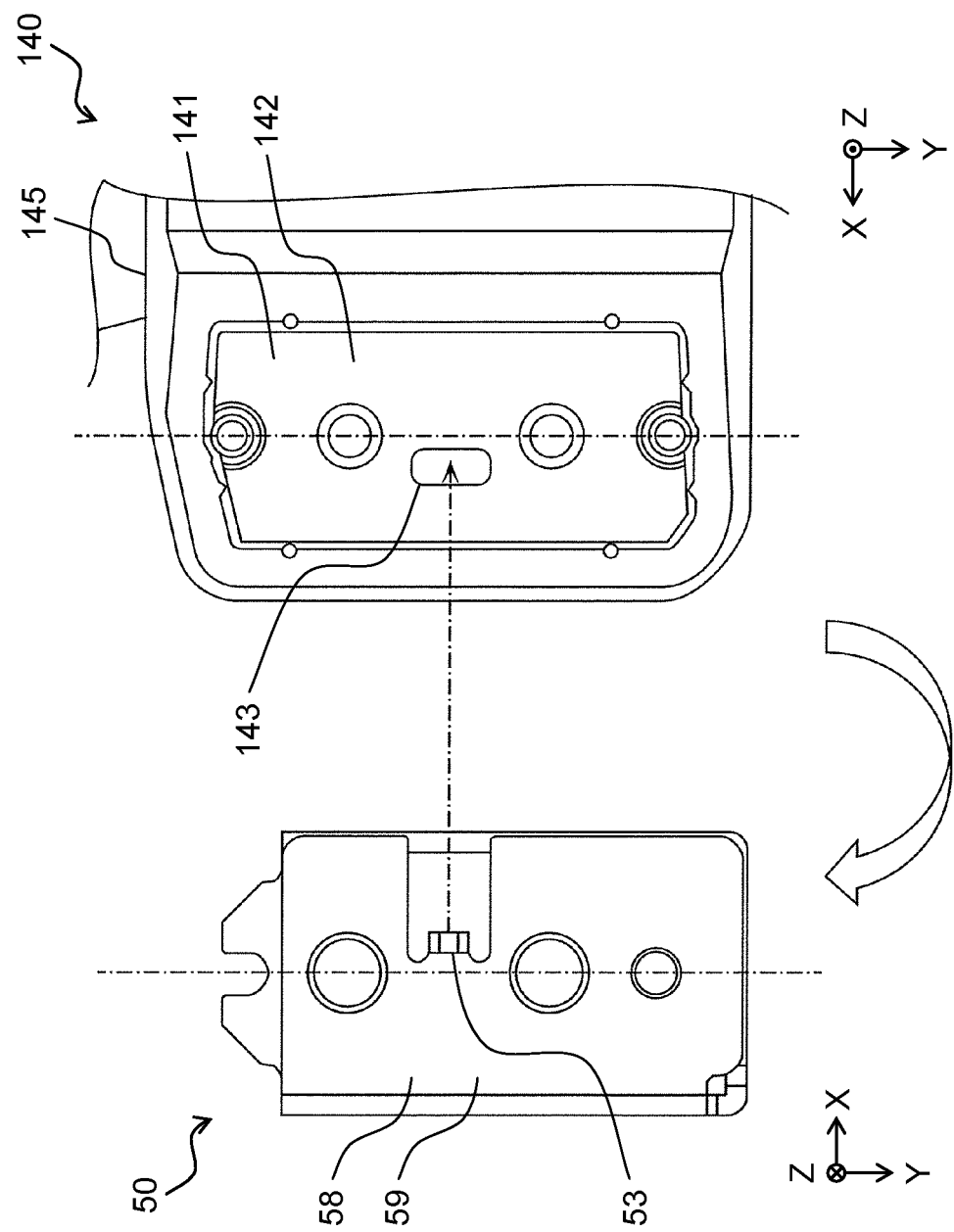
FIG. 19 is a view schematically showing one example of a direction in which a seventh fitting part is fitted to a fifth fitting part in the image display device according to the second exemplary embodiment.

FIG. 19 is a view schematically showing one example of a direction in which seventh fitting part 141 is fitted to fifth fitting part 59 in the image display device according to the second exemplary embodiment. As with FIG. 11, FIG. 19 shows a partial enlarged view of first support member 140 and first mounting member 50. The partial enlarged view of first support member 140 is a top view showing by enlarging a region of first support member 140, to which first mounting member 50 is mounted. Seventh fitting part 141 is provided in this region. The partial enlarged view of first mounting member 50 is a bottom view showing by enlarging a region of first mounting member 50 fitted to seventh fitting part 141. Fifth fitting part 59 is provided in this region. It should be noted that a structure of fifth fitting part 59 of first mounting member 50 is substantially identical to the structure of first fitting part 52 of first mounting member 50 described in the first exemplary embodiment.

As with first support member 30, first support member 140 is configured to include base 145 and leg 146. Moreover, as shown in FIG. 19, seventh fitting part 141 is provided on a top surface of base 145.

As shown in FIG. 19, seventh fitting part 141 located on the top surface of base 145 of first support member 140 is provided with contact surface 142 that contacts with contact surface 58 of first mounting member 50. A shape of contact surface 142 is substantially a rectangle with a size almost equal to the size of contact surface 58 of first mounting member 50.

Contact surface 142 is provided with recess 143. Recess 143 is disposed so as to be located substantially in a center of contact surface 142 in a longitudinal direction (a Y-axis direction) of contact surface 142. Recess 143 is localized more on an X-axis positive direction side than a center line (shown by a dashed line in FIG. 19) in a width direction (an X-axis direction) of contact surface 142. In order to correspond to this recess 143, on contact surface 58 (fifth fitting part 59), protrusion 53 of first mounting member 50 is localized more on an X-axis positive direction side than a center line (shown by a dashed line in FIG. 19) in a width direction (an X-axis direction) of contact surface 58.

Recess 143 is depressed downward (a Z-axis negative direction). A depth of the depression is set so that protrusion 53 of fifth fitting part 59 of first mounting member 50 can be fitted. A cross-sectional shape of a horizontal plane (a plane parallel to an X-Y plane) of recess 143 corresponds to a cross-sectional shape of a horizontal plane of protrusion 53, and is a rectangle having a long side that extends in the longitudinal direction (the Y-axis direction) of contact surface 142. It should be noted that recess 143 may be a hole formed so that protrusion 53 can be fitted.

With this configuration, when contact surface 58 and contact surface 142 are aligned and brought into contact with each other, as shown by a dashed line arrow in FIG. 19, protrusion 53 of fifth fitting part 59 of first mounting member 50 and recess 143 of seventh fitting part 141 of first support member 140 are fitted to each other. In this way, since contact surface 58 and contact surface 142 are fitted to each other in the aligned state without deviation, first support member 140 can stably support first mounting member 50.

Figure 20:
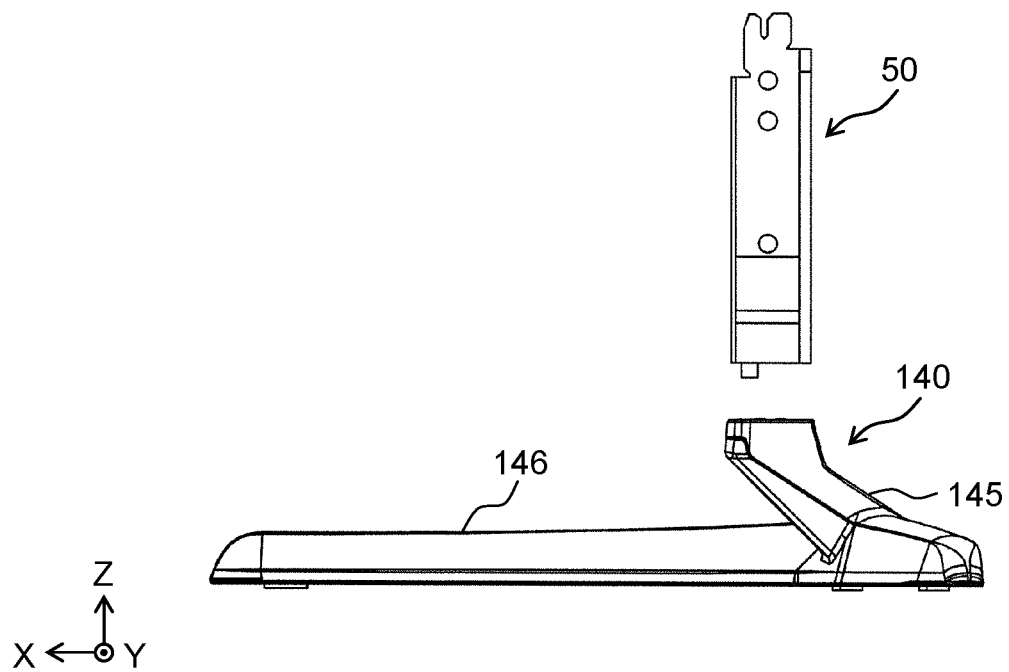
FIG. 20 is a view showing a state in which the first support member is reversed from a state shown in FIG. 18.

FIG. 20 is a view showing a state in which first support member 140 is reversed from a state shown in FIG. 18.

Figure 21:
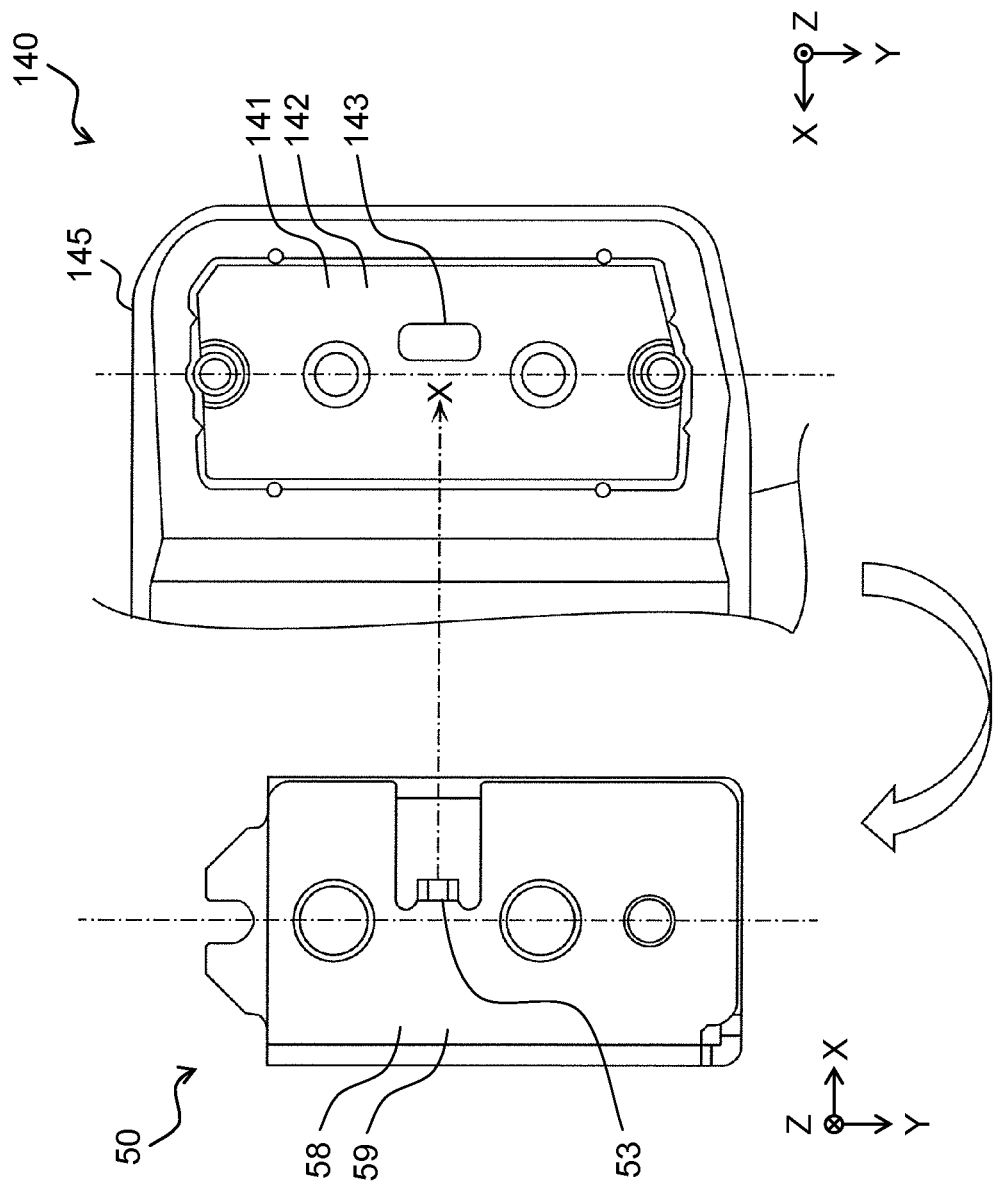
FIG. 21 is a view showing a state in which the first support member is reversed from a state shown in FIG. 19.

FIG. 21 is a view showing a state in which first support member 140 is reversed from a state shown in FIG. 19.

As shown in FIG. 21, when first support member 140 is reversed in a front and back direction of display panel 20 (rotated by 180 degrees on the X-Y plane), recess 143, which has been localized more on the X-axis positive direction side than the center line on contact surface 142 before the reverse, is localized more on an X-axis negative direction side than the center line. As a result, protrusion 53 of fifth fitting part 59 of first mounting member 50 cannot be fitted to recess 143 of first support member 140 in a state in which contact surface 58 and contact surface 142 are aligned with each other. In other words, in the image display device described in the second exemplary embodiment, first mounting member 50 cannot be mounted to first support member 140 in the state shown in FIG. 20.

It should be noted that it is also possible that first support member 140 is reversed from the state shown in FIG. 19 and protrusion 53 is forcibly fitted to recess 143. However, in that case, contact surface 58 of first mounting member 50 and contact surface 142 of first support member 140 are relatively deviated in the width direction (the X-axis direction), and contact surface 58 and contact surface 142 are in contact with each other without alignment. In other words, first support member 140 and first mounting member 50 are not normally fitted in this state. With this configuration, a user can visually understand that such a combination is not allowed in the image display device described in the second exemplary embodiment.

For example, depending on the configuration of the image display device, as shown in FIG. 14, first support member 30 and second support member 40 are disposed so as to protrude more outward than display panel 20 (outward in the width direction of display panel 20). In this case, stability regarding installation of the image display device may be lowered. In such an image display device, it is not desirable that first support member 30 and second support member 40 be disposed so as to protrude more outward than display panel 20 (outward in the width direction of display panel 20). Therefore, in order to avoid such arrangement, it is effective to apply, for example, seventh fitting part 141 with the configuration shown in FIG. 19 to first support member 140.

It should be noted that, although not shown, in the second exemplary embodiment, a portion of second mounting member 60 (see FIG. 4) fitted to the second support member is referred to as a sixth fitting part. Further, a portion of the second support member fitted to second mounting member 60 is referred to as an eighth fitting part.

FIG. 22 is a view schematically showing variations (mirror-image symmetry and point symmetry) of a relation between fifth fitting part 59 of first mounting member 50 and the sixth fitting part of second mounting member 60, and of a relation between seventh fitting part 141 of first support member 140 and the eighth fitting part of the second support member in the second exemplary embodiment.

As shown in FIG. 22, in the image display device according to the second exemplary embodiment, a shape of fifth fitting part 59 of first mounting member 50 (schematically shown in part (a) of FIG. 22) and a shape of the sixth fitting part of second mounting member 60 (schematically shown in part (b) of FIG. 22) are in mirror-image symmetry to each other in the width direction (the X-axis direction) of display panel 20. Moreover, a shape of seventh fitting part 141 of first support member 140 (schematically shown in part (a) of FIG. 22) and a shape of the eighth fitting part of the second support member (schematically shown in part (b) of FIG. 22) are in mirror-image symmetry to each other in the width direction (the X-axis direction) of display panel 20.

With this configuration, in the image display device described in the second exemplary embodiment, in a case where first support member 140 is reversed in the front and back direction of display panel 20 (rotated by 180 degrees on the X-Y plane) from the state in which first support member 140 is fitted to first mounting member 50, first support member 140 is not normally fitted to first mounting member 50, but can be fitted to second mounting member 60. Similarly, in a case where the second support member (not shown) is reversed in the front and back direction of display panel 20 (rotated by 180 degrees on the X-Y plane) from the state in which the second support member is fitted to second mounting member 60, the second support member is not normally fitted to second mounting member 60, but can be fitted to first mounting member 50. With this configuration, when first mounting member 50 is mounted to first attachment part 70 or second attachment part 80 and second mounting member 60 is mounted to third attachment part 90 or fourth attachment part 100 (see FIG. 4), in the image display device, first support member 30 and second support member 40 can be prevented from being disposed so as to protrude more outward than display panel 20 (outward in the width direction of display panel 20).

It should be noted that the shape of fifth fitting part 59 of first mounting member 50 (schematically shown in part (c) of FIG. 22) and the shape of the sixth fitting part of second mounting member 60 (schematically shown in part (d) of FIG. 22) may be in point symmetry with respect to a center of the contact surface. Further, the shape of seventh fitting part 141 of first support member 140 (schematically shown in part (c) of FIG. 22) and the shape of the eighth fitting part of the second support member (schematically shown in part (d) of FIG. 22) may be in point symmetry with respect to the center of the contact surface. Even in this configuration, an effect similar to the aforementioned effect can be obtained.

It should be noted that, in image display device 10 described in the second exemplary embodiment, the protrusion/recess of protrusion 53 and recess 143 may be reversed each other. In other words, a protrusion may be formed instead of recess 143, and a recess may be formed instead of protrusion 53.

[3-2. Effects and Others]

In the image display device, the first support member may have the structure fitted to the second mounting member without being normally fitted to the first mounting member, after the first support member is reversed in the front and back direction of the display panel from the state in which the first support member is fitted to the first mounting member. The second support member may have the structure fitted to the first mounting member without being normally fitted to the second mounting member, after the second support member is reversed in the front and back direction of the display panel from the state in which the second support member is fitted to the second mounting member.

It should be noted that first support member 140 is one example of the first support member.

For example, according to the example described in the second exemplary embodiment, in the image display device, first support member 140 has the structure fitted to second mounting member 60 without being normally fitted to first mounting member 50, after first support member 140 is reversed in the front and back direction of display panel 20 from the state in which first support member 140 is fitted to first mounting member 50. The second support member (not shown) has the structure fitted to first mounting member 50 without being normally fitted to second mounting member 60, after the second support member is reversed in the front and back direction of display panel 20 from the state in which the second support member is fitted to second mounting member 60.

In the image display device, the first mounting member may have a fifth fitting part equipped with a protruded shape or a recessed shape localized in the width direction of the display panel. The second mounting member may have a sixth fitting part equipped with a protruded shape or a recessed shape localized in the width direction of the display panel. The first support member may have a seventh fitting part equipped with a recessed shape or a protruded shape localized in the width direction of the display panel so as to correspond to the localization of the protruded shape or the recessed shape of the fifth fitting part. The second support member may have an eighth fitting part equipped with a recessed shape or a protruded shape localized in the width direction of the display panel so as to correspond to the localization of the protruded shape or the recessed shape of the sixth fitting part.

It should be noted that protrusion 53 is one example of the protruded shape or the recessed shape included in the fifth fitting part. Fifth fitting part 59 is one example of the fifth fitting part. Recess 143 is one example of the recessed shape or the protruded shape of the seventh fitting part. Seventh fitting part 141 is one example of the seventh fitting part.

For example, according to the example described in the second exemplary embodiment, in the image display device, first mounting member 50 has fifth fitting part 59 equipped with protrusion 53 localized in the width direction of display panel 20. Second mounting member 60 has the sixth fitting part (not shown) equipped with the protrusion (not shown) localized in the width direction of display panel 20. First support member 140 has seventh fitting part 141 equipped with recess 143 localized in the width direction of display panel 20 so as to correspond to the localization of protrusion 53 of fifth fitting part 59. The second support member (not shown) has the eighth fitting part (not shown) equipped with the recess (not shown) localized in the width direction of display panel 20 so as to correspond to the localization of the protrusion of the sixth fitting part.

In the image display device configured as above, specific combinations of the first mounting member and the second mounting member with the first support member and the second support member are prevented. With this configuration, the image display device can prevent the user from changing a design of the image display device into a specific design.

Modified Example of Second Exemplary Embodiment

In a modified example of the second exemplary embodiment, a description is given of a configuration in which shapes of side walls of a first mounting member and a second mounting member are different from the shapes of the side walls of the first mounting member and the second mounting member mentioned above. It should be noted that, since a configuration of an image display device in the modified example of the second exemplary embodiment other than the side walls is substantially identical to the configuration of the above-described image display device, the description is omitted.

Hereinafter, the first mounting member, a first attachment part, and a second attachment part are described by way of examples.

[4-1. Configuration]

Figure 23A:
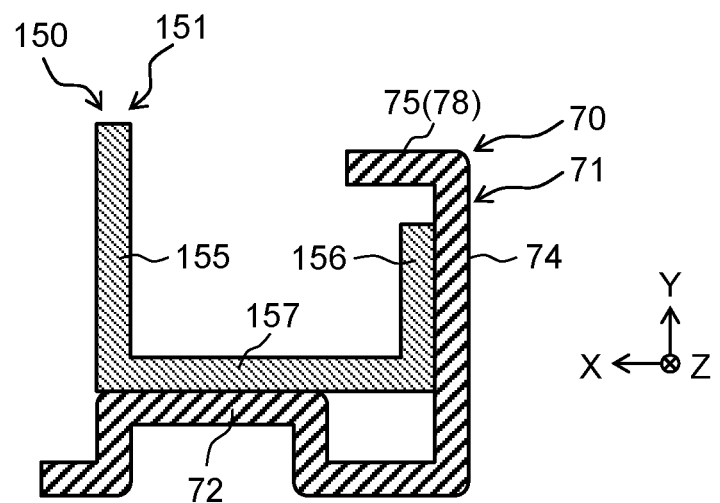
FIG. 23A is a horizontal sectional view schematically showing one example of a fit state between a first attachment part and a first mounting member in an image display device according to a modified example of the second exemplary embodiment.

FIG. 23A is a horizontal sectional view schematically showing one example of a fit state between first attachment part 70 and first mounting member 150 in the image display device according to the modified example of the second exemplary embodiment.

Figure 23B:
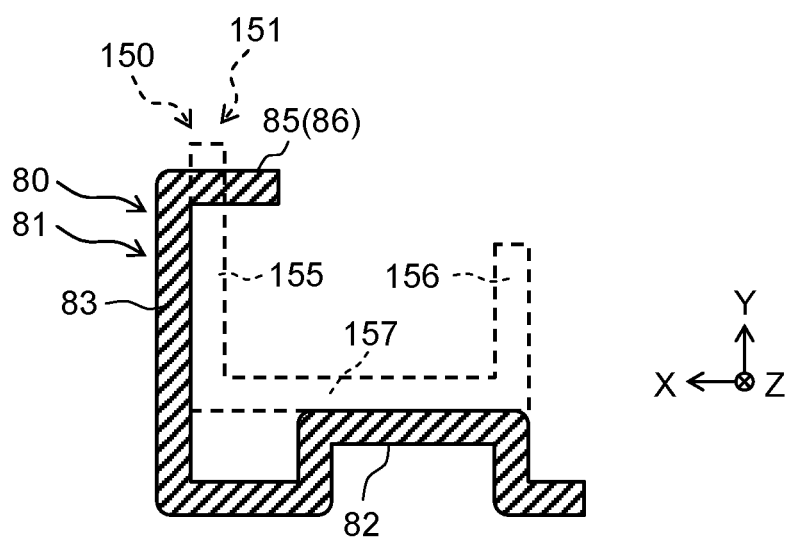
FIG. 23B is a horizontal sectional view schematically showing one configuration example of a second attachment part in the image display device according to the modified example of the second exemplary embodiment.

FIG. 23B is a horizontal sectional view schematically showing one configuration example of second attachment part 80 in the image display device according to the modified example of the second exemplary embodiment.

First mounting member 150 shown in FIG. 23A has a structure substantially identical to the structure of first mounting member 50 shown in FIGS. 8, 9, and the like, except for a shape of side wall 155. However, a size in a Y-axis direction of side wall 155 of first mounting member 150 is greater than the size in the Y-axis direction of side wall 55 of first mounting member 50.

As shown in FIG. 23A, in first mounting member 150, insertion part 151 is configured to include side wall 155, side wall 156, and bottom wall 157. A cross section of a horizontal plane (a surface parallel to an X-Y plane) of insertion part 151 is J-shaped. Insertion part 151 extends in an up and down direction (a Z-axis direction).

Specifically, bottom wall 157 is parallel to a width direction (an X-axis direction) of display panel 20, and is elongated in the up and down direction (the Z-axis direction). Side wall 155 extends along a side edge on an X-axis positive direction side of bottom wall 157, and is erected in a direction toward a back side of display panel 20 (a Y-axis positive direction). On the other hand, side wall 156 extends along a side edge on an X-axis negative direction side of bottom wall 157, and is erected in a direction toward the back side of display panel 20 (the Y-axis positive direction).

Moreover, as shown in FIG. 23A, when first mounting member 150 is inserted in groove 71 of first attachment part 70, side wall 156 of first mounting member 150 is formed in a size so that an upper end (an end on the Y-axis positive direction side) of side wall 156 is in contact with or is not slightly in contact with an inner wall surface (a wall surface on a Y-axis negative direction side) of top wall 75 of first attachment part 70. On the other hand, when first mounting member 150 is inserted in groove 71 of first attachment part 70, side wall 155 of first mounting member 150 is formed so that an upper end (an end on the Y-axis positive direction side) of side wall 155 is located more on the Y-axis positive direction side (becomes greater in the Y-axis direction) than the inner wall surface of top wall 75 of first attachment part 70.

As shown in FIG. 23A, first attachment part 70 is not provided with a structure that abuts on side wall 155. As a result, a user using the image display device described in the present modified example can insert insertion part 151 of first mounting member 150 into groove 71 of first attachment part 70, and can fit first mounting member 150 and first attachment part 70 to each other.

Although not shown, in the present modified example, a structure of fourth attachment part 100 is substantially identical to the structure of above-described first attachment part 70. In other words, the user using the image display device described in the present modified example can also insert insertion part 151 of first mounting member 150 into a groove of fourth attachment part 100, and can fit first mounting member 150 and fourth attachment part 100 to each other.

As shown in FIG. 23B, second attachment part 80 is provided with groove 81. Groove 81 is configured to include bottom wall 82, side wall 83, and top wall 85. Bottom wall 82 is parallel to the width direction (the X-axis direction) of display panel 20, and is elongated in the up and down direction (the Z-axis direction). Side wall 83 extends along a side edge on the X-axis negative direction side of bottom wall 82, and is erected in a direction toward the back side of display panel 20 (the Y-axis positive direction). Top wall 85 extends along an upper edge of side wall 83, and is erected toward inside of side wall 83 (in the X-axis negative direction).

It should be noted that, as can be seen from a comparison between FIGS. 23A and 23B, a cross-sectional shape of a horizontal plane (a surface parallel to an X-Y plane) of groove 81 of second attachment part 80 is in mirror-image symmetry to a cross-sectional shape of a horizontal plane of groove 71 of first attachment part 70 in the width direction (the X-axis direction).

In FIG. 23B, the cross section of the horizontal plane of insertion part 151 of first mounting member 150 is shown by a broken line. As shown in FIG. 23B, the upper end of side wall 155 of first mounting member 150 is located more on the Y-axis positive direction side than an inner wall surface (a wall surface of a Y-axis negative direction side) of top wall 85 of second attachment part 80. In other words, side wall 155 of first mounting member 150 is greater in the Y-axis positive direction than the inner wall surface of top wall 85 of second attachment part 80. As a result, even when the user tries to insert insertion part 151 of first mounting member 150 into groove 81 of second attachment part 80, the user cannot insert insertion part 151 into groove 81 due to abutment of side wall 155 of first mounting member 150 on top wall 85 of second attachment part 80. In other words, in the image display device of the present modified example, top wall 85 of groove 81 of second attachment part 80 functions as a regulation part for regulating insertion of insertion part 151 of first mounting member 150. Hereinafter, the regulation part for regulating the insertion of insertion part 151 of first mounting member 150 is referred to as a second regulation part (shown as second regulation part 86 in FIG. 23B). With this configuration, the user using the image display device described in the present modified example cannot insert and fit insertion part 151 of first mounting member 150 into groove 81 of second attachment part 80.

Although not shown, in the present modified example, a structure of third attachment part 90 is substantially identical to the structure of above-described second attachment part 80. Therefore, a top wall of a groove of third attachment part 90 also functions as the second regulation part for regulating the insertion of insertion part 151 of first mounting member 150. With this configuration, the user using the image display device described in the present modified example cannot insert insertion part 151 of first mounting member 150 into the groove of third attachment part 90, and cannot fit first mounting member 150 and third attachment part 90 to each other.

It should be noted that, although not shown, in the present modified example, a horizontal cross-sectional shape of an insertion part of the second mounting member is in mirror-image symmetry to a horizontal cross-sectional shape of the insertion part of the above-described first mounting member 150 in the width direction (the X-axis direction), and that the insertion part has an inverted J shape. As a result, even when the user tries to insert the insertion part of the second mounting member into groove 71 of first attachment part 70, he or she cannot insert the insertion part of the second mounting member into groove 71 of first attachment part 70 due to abutment of a side wall of the second mounting member on top wall 75 of first attachment part 70. In other words, top wall 75 of groove 71 of first attachment part 70 functions as a regulation part for the insertion part of the second mounting member. Hereinafter, the regulation part for regulating the insertion of the insertion part of the second mounting member is referred to as a first regulation part (shown as first regulation part 78 in FIG. 23A).

As mentioned above, in the present modified example, the structure of fourth attachment part 100 is substantially identical to the structure of first attachment part 70. Therefore, a top wall of a groove of fourth attachment part 100 also functions as the first regulation part for regulating insertion of the insertion part of the second mounting member. With this configuration, the user also cannot insert the insertion part of the second mounting member into the groove of fourth attachment part 100.

On the other hand, as mentioned above, in the present modified example, a horizontal cross-sectional shape of groove 81 of second attachment part 80 and a horizontal cross-sectional shape of the groove of third attachment part 90 are in mirror-image symmetry to a horizontal cross-sectional shape of groove 71 of first attachment part 70 in the width direction (the X-axis direction). Therefore, the user can insert the insertion part of the second mounting member into both of groove 81 of second attachment part 80 and the groove of third attachment part 90, and can fit the second mounting member and second attachment part 80 or third attachment part 90 to each other.

Next, a design (an external appearance) of the image display device according to the modified example of the second exemplary embodiment is described.

Figure 24A:
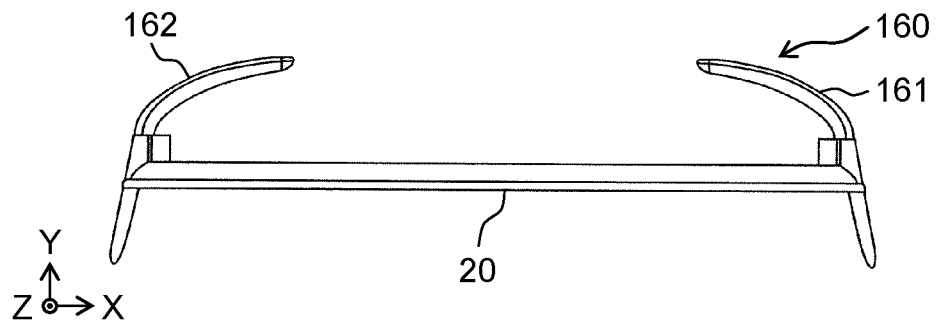
FIG. 24A is a top view schematically showing one example of an external appearance of the image display device according to the modified example of the second exemplary embodiment.
Figure 24B:
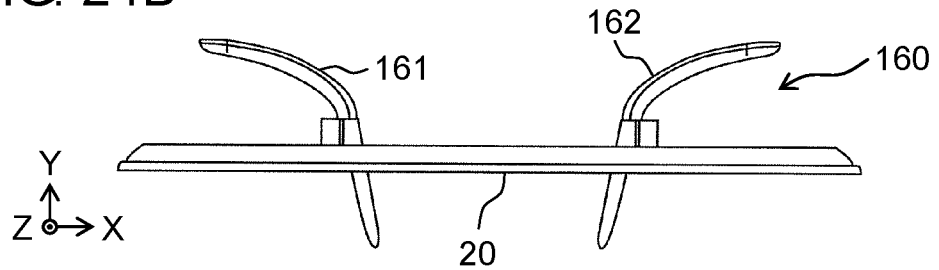
FIG. 24B is a top view schematically showing another example of an external appearance of the image display device according to the modified example of the second exemplary embodiment.
Figure 24C:
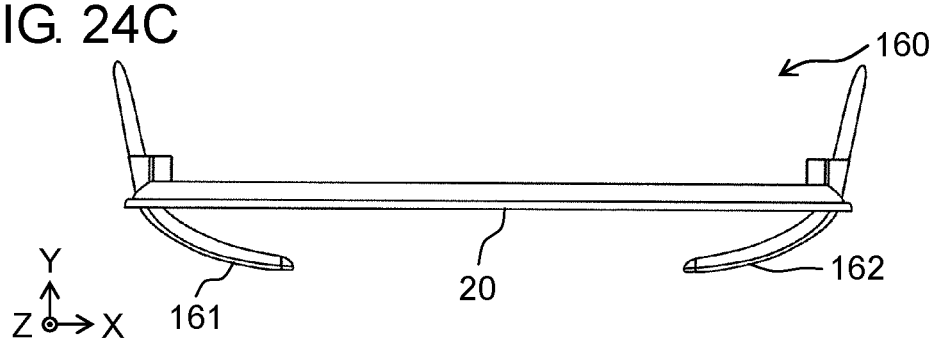
FIG. 24C is a top view schematically showing still another example of an external appearance of the image display device according to the modified example of the second exemplary embodiment.
Figure 24D:
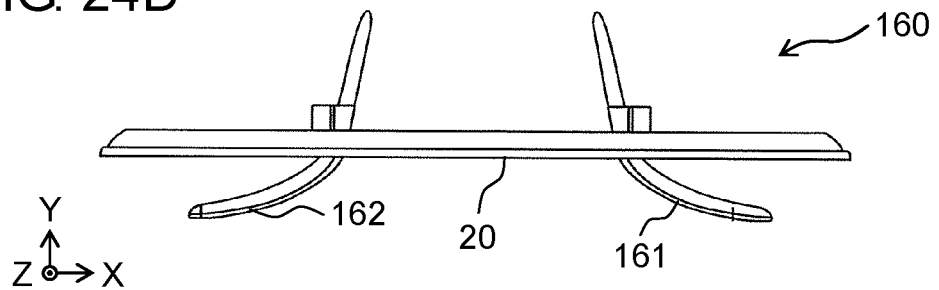
FIG. 24D is a top view schematically showing still another example of an external appearance of the image display device according to the modified example of the second exemplary embodiment.

FIG. 24A is a top view schematically showing one example of an external appearance of image display device 160 according to the modified example of the second exemplary embodiment. FIG. 24B is a top view schematically showing another example of an external appearance of image display device 160 according to the modified example of the second exemplary embodiment. FIGS. 24C and 24D are top views schematically showing still other examples of an external appearance of image display device 160 according to the modified example of the second exemplary embodiment.

In image display device 160 exemplified in the present modified example, it is assumed that a shape of a fifth fitting part of first mounting member 150 and a shape of a sixth fitting part of the second mounting member are in mirror-image symmetry in the width direction (the X-axis direction), and that a shape of a seventh fitting part of the first support member and a shape of an eighth fitting part of the second support member are in mirror-image symmetry in the width direction (the X-axis direction). In this case, the design (the external appearance) of image display device 160 is limited to four patterns illustrated in FIGS. 24A to 24D.

In image display device 160 shown in FIG. 24A, first mounting member 150 is interposed between first attachment part 70 and first support member 161, and the second mounting member is interposed between third attachment part 90 and second support member 162. In image display device 160 shown in FIG. 24B, first mounting member 150 is interposed between fourth attachment part 100 and first support member 161, and the second mounting member is interposed between second attachment part 80 and second support member 162. In image display device 160 shown in FIG. 24C, first mounting member 150 is interposed between first attachment part 70 and second support member 162, and the second mounting member is interposed between third attachment part 90 and first support member 161. In image display device 160 shown in FIG. 24D, first mounting member 150 is interposed between fourth attachment part 100 and second support member 162, and the second mounting member is interposed between second attachment part 80 and first support member 161.

As described above, in image display device 160 described in the present modified example, first mounting member 150 can be attached to first attachment part 70 or fourth attachment part 100, but cannot be attached to second attachment part 80 and third attachment part 90. Further, the second mounting member can be attached to second attachment part 80 or third attachment part 90, but cannot be attached to first attachment part 70 and fourth attachment part 100. Further, when second support member 162 is mounted to first mounting member 150, unless a direction of second support member 162 is reversed in the front and back direction of display panel 20 (rotated by 180 degrees on the X-Y plane) to a direction when second support member 162 is mounted to the second mounting member, second support member 162 is not normally fitted to first mounting member 150. Similarly, when first support member 161 is mounted to the second mounting member, unless a direction of first support member 161 is reversed in the front and back direction of display panel 20 (rotated by 180 degrees on the X-Y plane) to a direction when first support member 161 is mounted to first mounting member 150, first support member 161 is not normally fitted to the second mounting member.

With this configuration, as shown in FIGS. 24A and 24C, in image display device 160, in a case where first support member 161 and second support member 162 are disposed outward in the width direction (the X-axis direction) of display panel 20 (that is, attached to first attachment part 70, third attachment part 90), first support member 161 and second support member 162 are disposed so as to curve toward inside of display panel 20 (inside in the width direction of display panel 20). On the other hand, as shown in FIGS. 24B and 24D, in image display device 160, in a case where first support member 161 and second support member 162 are disposed inward in the width direction (the X-axis direction) of display panel 20 (that is, attached to second attachment part 80, fourth attachment part 100), first support member 161 and second support member 162 are disposed so as to curve toward outside of display panel 20 (outside in the width direction of display panel 20). Moreover, in a case where image display device 160 employs one of the four designs shown in FIGS. 24A to 24D, display panel 20 is supported more stably.

It should be noted that, in a case where the shape of the fifth fitting part of first mounting member 150 and the shape of the sixth fitting part of the second mounting member are in mirror-image asymmetry in the width direction (the X-axis direction), and the shape of the seventh fitting part of first support member 161 and the shape of the eighth fitting part of second support member 162 are in mirror-image asymmetry in the width direction (the X-axis direction), the design (the external appearance) of image display device 160 is limited only to the two patterns shown in FIGS. 24A and 24B or the two patterns shown in FIGS. 24C and 24D. This is due to the following reasons. When first support member 161 is reversed in the front and back direction of display panel 20, first support member 161 cannot be normally fitted to both of first mounting member 150 and the second mounting member. Similarly, when second support member 162 is reversed in the front and back direction of display panel 20, second support member 162 cannot be normally fitted to both of the second mounting member and first mounting member 150.

It should be noted that, in image display device 160 according to the present modified example, the design (the external appearance) of image display device 160 can also be limited to four patterns illustrated in FIGS. 24E to 24H by applying changes to the aforementioned regulation parts (the first regulation part and the second regulation part).

Figure 24E:
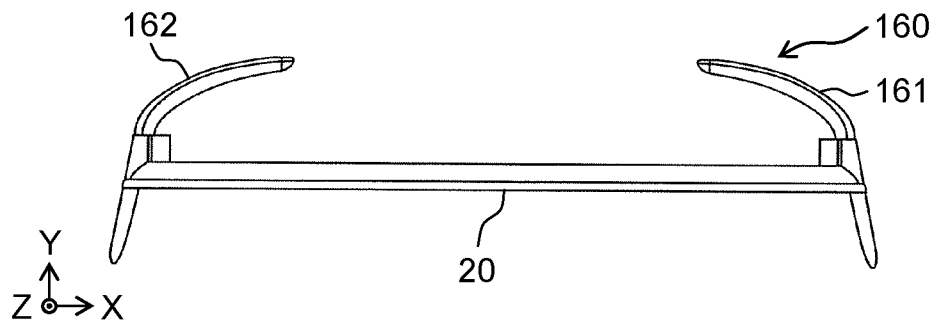
FIG. 24E is a top view schematically showing one example of an external appearance of the image display device according to another modified example of the second exemplary embodiment.
Figure 24F:
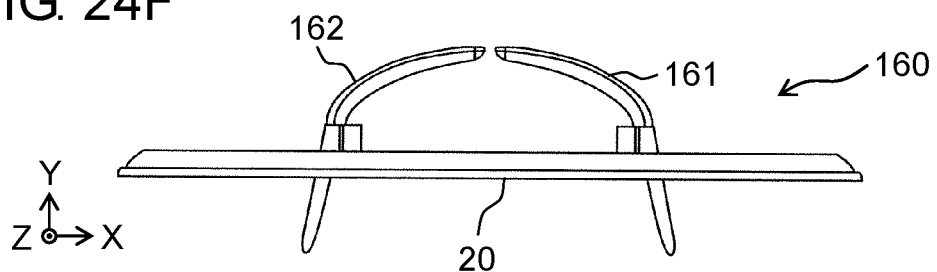
FIG. 24F is a top view schematically showing another example of an external appearance of the image display device according to the other modified example of the second exemplary embodiment.
Figure 24G:
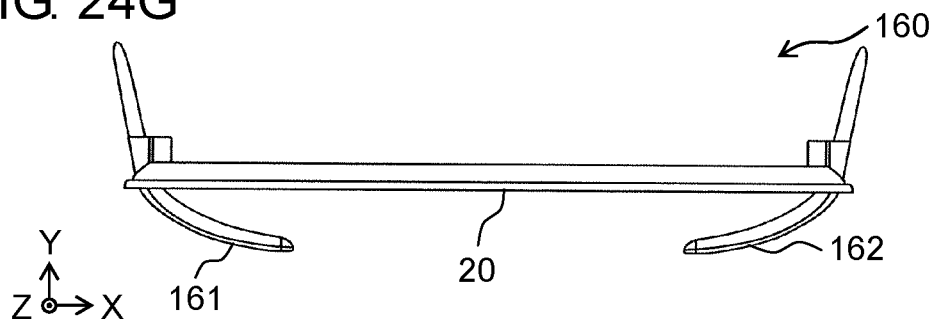
FIG. 24G is a top view schematically showing still another example of an external appearance of the image display device according to the other modified example of the second exemplary embodiment.
Figure 24H:
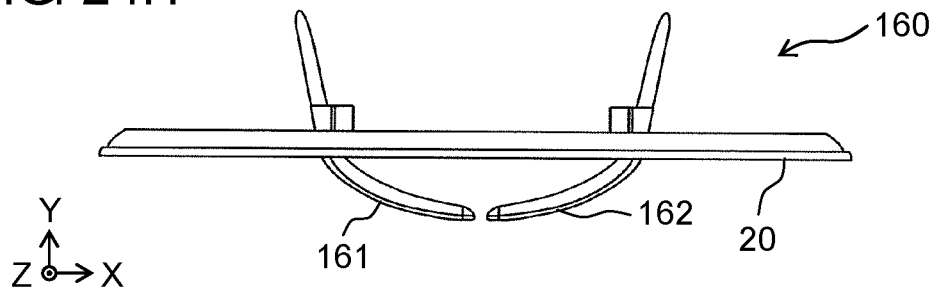
FIG. 24H is a top view schematically showing still another example of an external appearance of the image display device according to the other modified example of the second exemplary embodiment.

FIG. 24E is a top view schematically showing one example of an external appearance of image display device 160 according to another modified example of the second exemplary embodiment. FIG. 24F is a top view schematically showing another example of an external appearance of image display device 160 according to the other modified example of the second exemplary embodiment. FIGS. 24G are 24H are top views schematically showing still other examples of an external appearance of image display device 160 according to the other modified example of the second exemplary embodiment.

For example, in image display device 160, the regulation parts (the first regulation part and the second regulation part) may be changed so that first mounting member 150 can be inserted and fitted into only either one of first attachment part 70 and second attachment part 80 and that the second mounting member can be inserted and fitted into only either one of third attachment part 90 and fourth attachment part 100. In this case, the design (the external appearance) of image display device 160 is limited to the four patterns illustrated in FIGS. 24E to 24H. In this image display device 160, as illustrated in FIGS. 24E to 24H, first support member 161 and second support member 162 are disposed so as to always curve toward the inside of display panel 20 (the inside in the with direction of display panel 20).

It should be noted that, although not shown, the regulation parts (the first regulation part and the second regulation part) can also be changed so that first support member 161 and second support member 162 are disposed so as to always curve toward the outside of display panel 20 (the outside in the with direction of display panel 20).

It should be noted that, in the modified example of the second exemplary embodiment, the configuration example in which the top walls and the side walls are abut on each other, thereby realizing the regulation parts (the first regulation part and the second regulation part). However, the present disclosure is not limited at all to this configuration. For example, it is possible to provide a regulation part that utilizes asymmetry of the cutout provided at the tip of the insertion part of each of the first mounting member and the second mounting member shown in FIG. 7. For example, a structure that is only suitable for the cutout of either one of the first mounting member and the second mounting member may be provided at the first groove, the second groove, the third groove, and the fourth groove. Accordingly, the regulation part that functions in a same manner as the regulation parts (the first regulation part and the second regulation part) can be realized.

[4-2. Effects and Others]

In the image display device, two grooves of the first groove, the second groove, the third groove, and the fourth groove may each have a first regulation part that regulates insertion of the second mounting member, and the other two grooves of the first groove, the second groove, the third groove, and the fourth groove may each have a second regulation part that regulates insertion of the first mounting member.

It should be noted that first regulation part 78 is one example of the first regulation part. Second regulation part 86 is one example of the second regulation part. Groove 71 of first attachment part 70 is one example of the first groove. Groove 81 of second attachment part 80 is one example of the second groove. The groove of third attachment part 90 is one example of the third groove. The groove of fourth attachment part 100 is one example of the fourth groove.

For example, according to the examples described in the modified example of the second exemplary embodiment, in the image display device, groove 71 of first attachment part 70 and the groove of fourth attachment part 100 each have first regulation part 78 that regulates insertion of the second mounting member, and groove 81 of second attachment part 80 and the groove of third attachment part 90 each have second regulation part 86 that regulates insertion of first mounting member 150.

In the image display device configured as above, specific combinations of the first mounting member and the second mounting member with the first support member and the second support member are prevented. With this configuration, a user using the image display device can change the design only within a limited range, such as a design capable of supporting the display panel more stably. The user is prevented from changing the design of the image display device into the other specific design.

Other Exemplary Embodiments

The first and second exemplary embodiments and the modified examples of the respective exemplary embodiments have been described above as illustrations of the technique disclosed in the present application. However, the technique in the present disclosure is not limited to these, and can also be applied to an exemplary embodiment in which modification, replacement, addition, omission, or the like is performed. In addition, a new exemplary embodiment can be made by combining the components described in the above first and second exemplary embodiments and the modified examples of the respective exemplary embodiments.

Therefore, other exemplary embodiments are described below.

In the first exemplary embodiment, the example in which first support member 30 and second support member 40 are configured with mutually separate members. However, the present disclosure is not limited to this configuration. For example, as shown in FIG. 25, a first support member and a second support member may be integrated to provide integrated support member 170.

Figure 25:
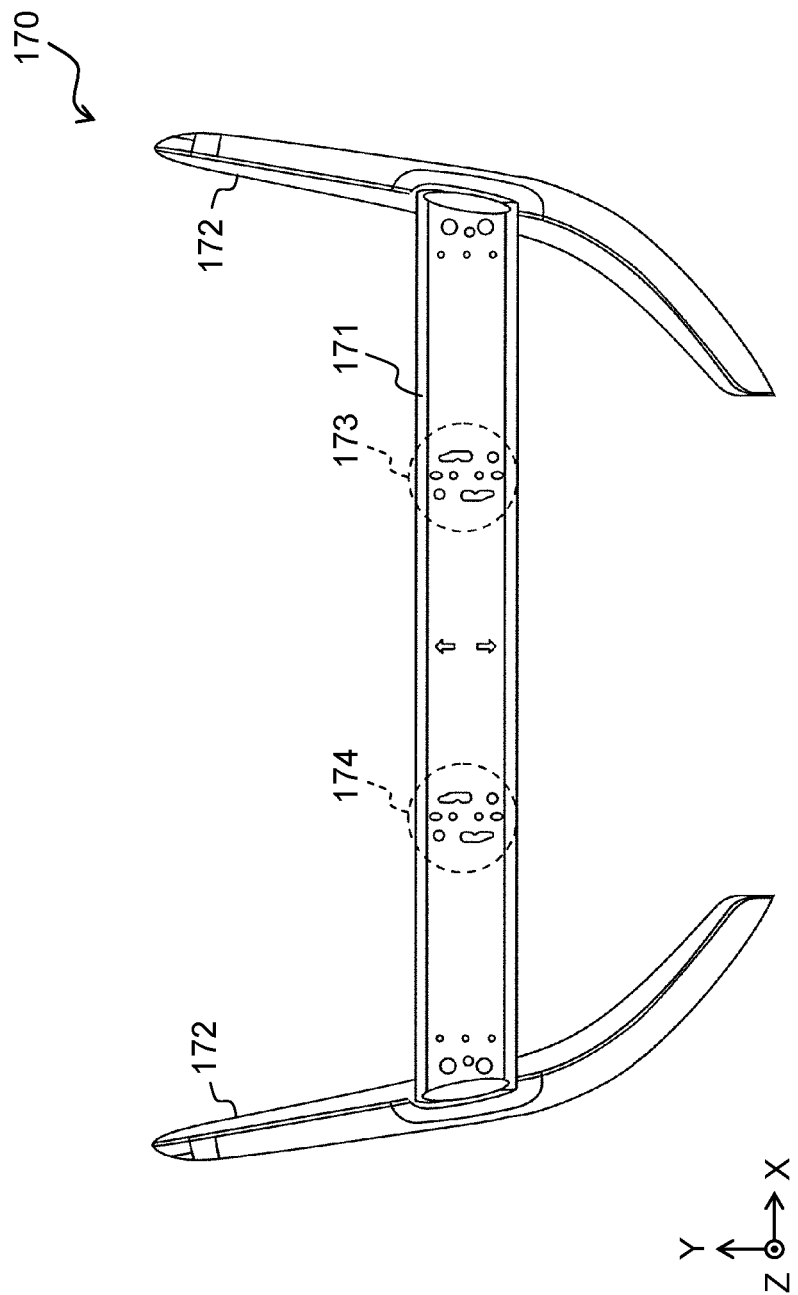
FIG. 25 is a top view schematically showing one example of an external appearance of an integrated support member in another exemplary embodiment.

FIG. 25 is a top view schematically showing one example of an external appearance of integrated support member 170 in the other exemplary embodiment. Integrated support member 170 includes base 171 and a pair of legs 172. Integrated support member 170, as a whole, has a shape of mirror-image symmetry with respect to a center line (not shown) in a width direction (an X-axis direction). Also, base 171 is provided with a pair of recess collections (recess groups). These pair of recess collections each have a shape of point symmetry, and function as third fitting part 173 and fourth fitting part 174.

A first support member and a second support member have a large effect on an external appearance of an image display device. Various forms of the first support member and the second support member are exemplified below.

Figure 26A:
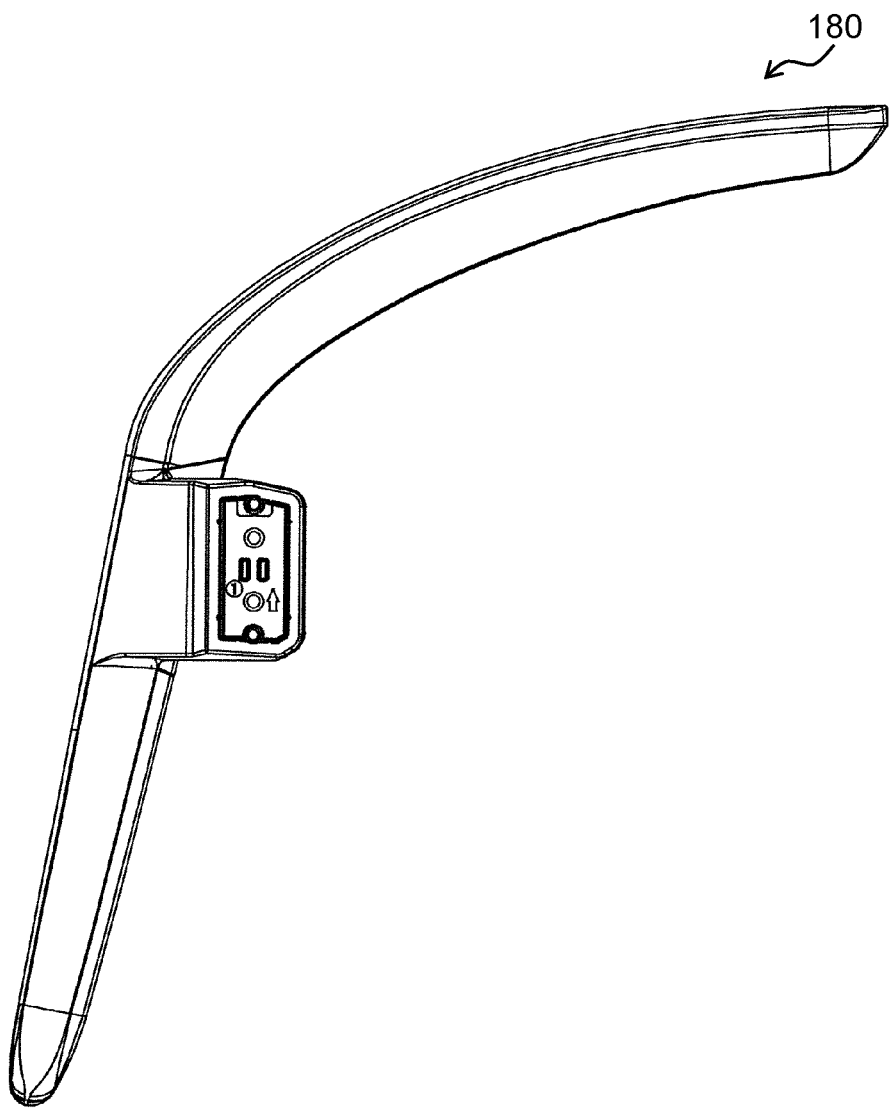
FIG. 26A is a top view schematically showing one example of an external appearance of a first support member in the other exemplary embodiment.
Figure 26B:
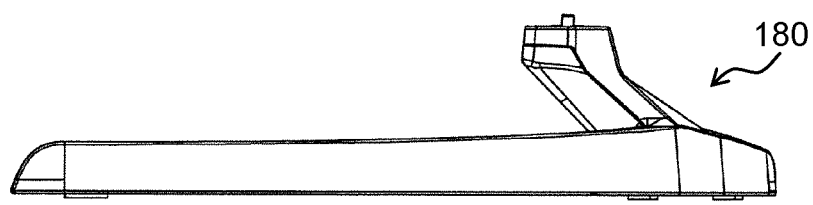
FIG. 26B is a back view schematically showing one example of an external appearance on a back side of the first support member shown in FIG. 26A.
Figure 26C:
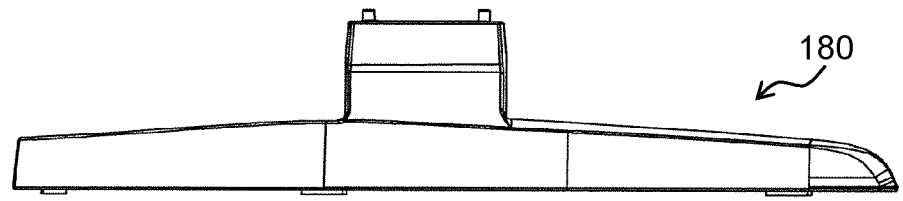
FIG. 26C is a side view schematically showing one example of an external appearance on a left side of the first support member shown in FIG. 26A.
Figure 26D:
FIG. 26D is a front view schematically showing one example of an external appearance on a front side of the first support member shown in FIG. 26A.
Figure 26E:
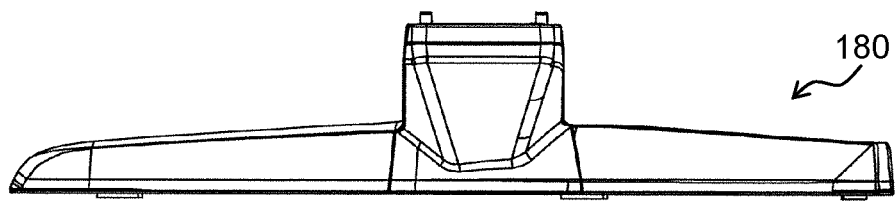
FIG. 26E is a side view schematically showing one example of an external appearance on a right side of the first support member shown in FIG. 26A.
Figure 26F:
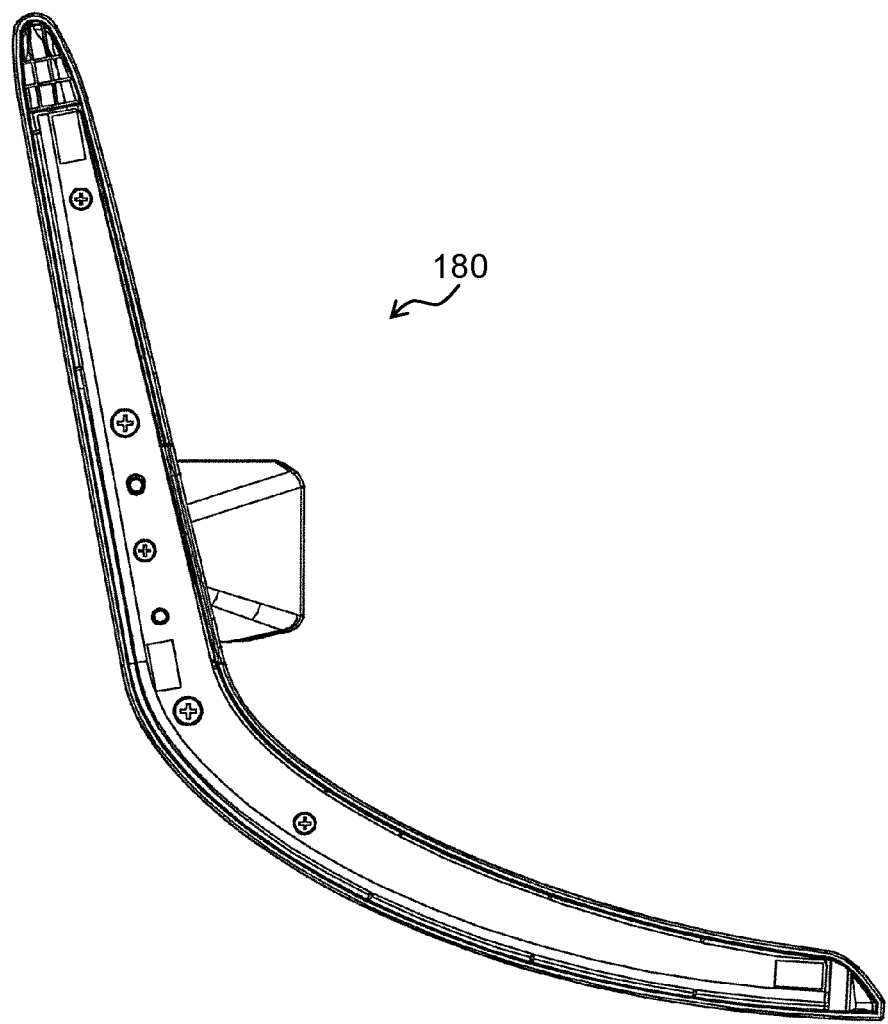
FIG. 26F is a bottom view schematically showing one example of an external appearance on a bottom side of the first support member shown in FIG. 26A.
Figure 26H:
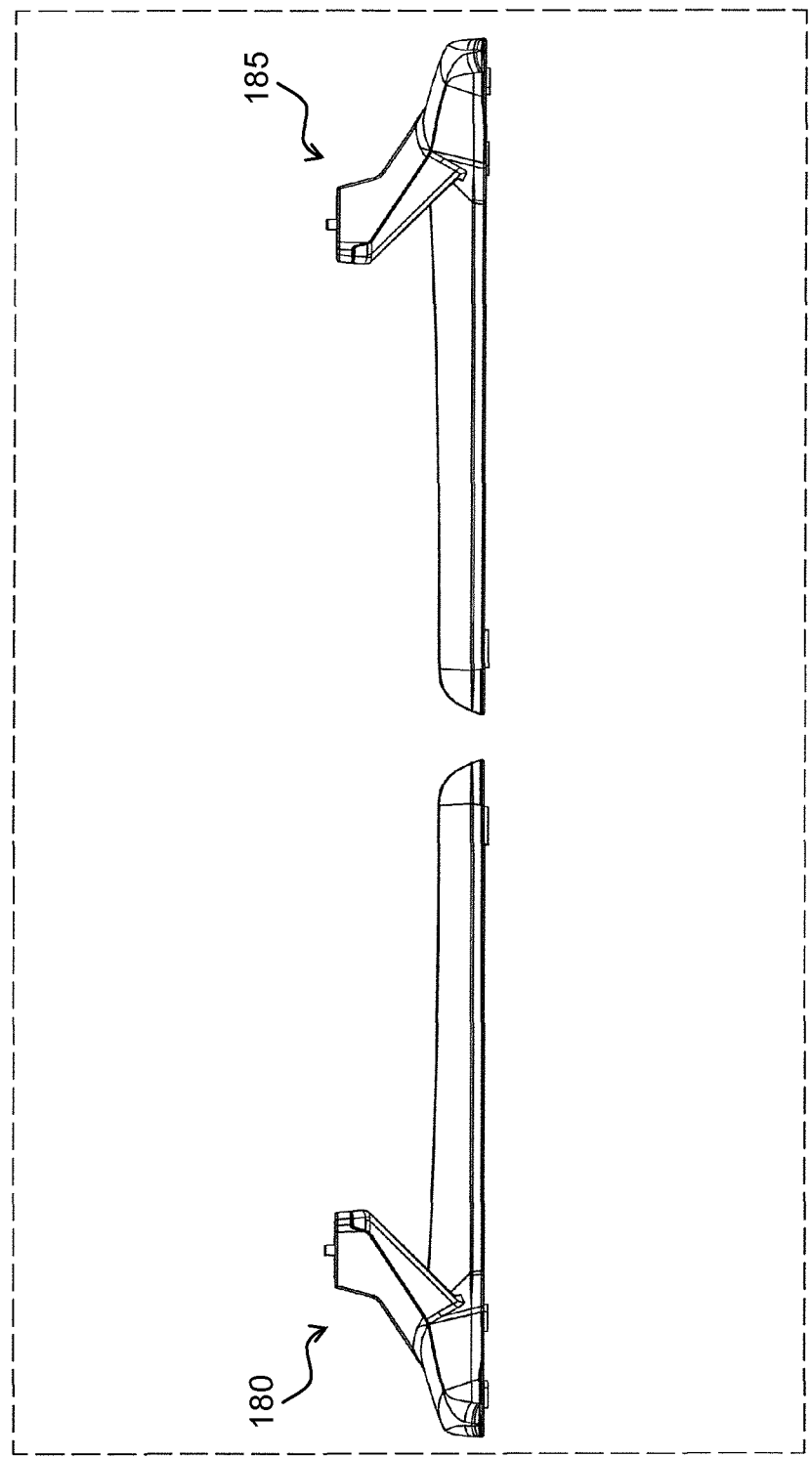
FIG. 26H is a front view schematically showing one example of an external appearance on a front side of the first support member and the second support member shown in FIG. 26G.

FIG. 26A is a top view schematically showing one example of an external appearance of first support member 180 in another exemplary embodiment. FIG. 26B is a back view schematically showing one example of an external appearance on a back side of first support member 180 shown in FIG. 26A. FIG. 26C is a side view schematically showing one example of an external appearance on a left side of first support member 180 shown in FIG. 26A. FIG. 26D is a front view schematically showing one example of an external appearance on a front side of first support member 180 shown in FIG. 26A. FIG. 26E is a side view schematically showing one example of an external appearance on a right side of first support member 180 shown in FIG. 26A. FIG. 26F is a bottom view schematically showing one example of an external appearance on a bottom side of first support member 180 shown in FIG. 26A. FIG. 26G is a perspective view schematically showing one example of an external appearance of first support member 180 shown in FIG. 26A and second support member 185. FIG. 26H is a front view schematically showing one example of an external appearance on a front side of first support member 180 and second support member 185 shown in FIG. 26G.

First support member 180 and second support member 185 illustrated in FIGS. 26A to 26H have shapes of boomerang-shaped gentle curves. Accordingly, a calm texture can be given to a user.

Figure 27A:
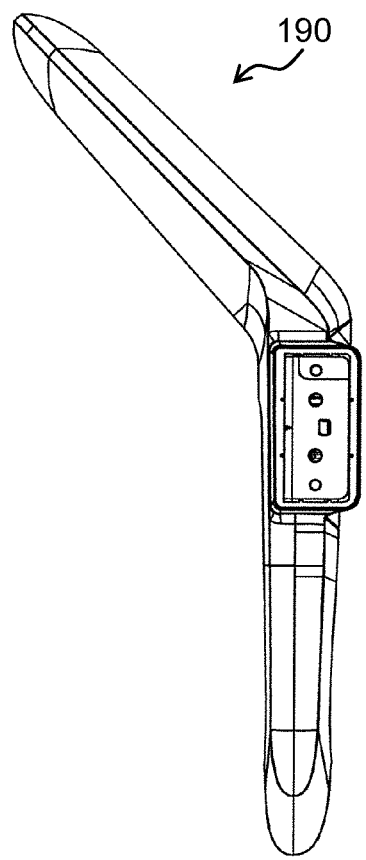
FIG. 27A is a top view schematically showing one example of an external appearance of a first support member in another exemplary embodiment.
Figure 27B:
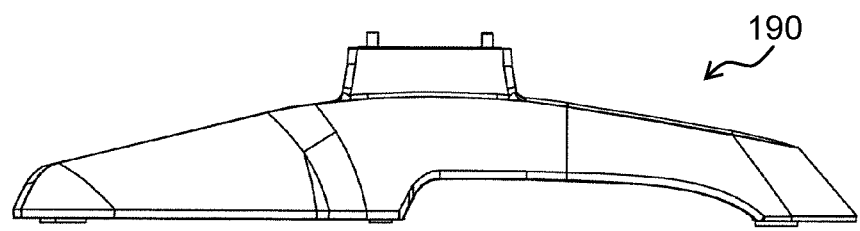
FIG. 27B is a side view schematically showing one example of an external appearance on a left side of the first support member shown in FIG. 27A.
Figure 27C:
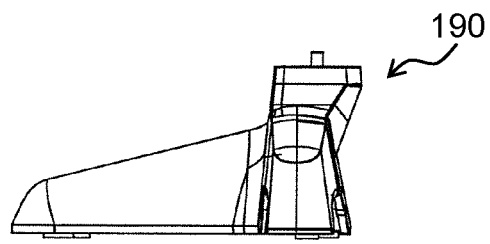
FIG. 27C is a front view schematically showing one example of an external appearance on a front side of the first support member shown in FIG. 27A.
Figure 27D:
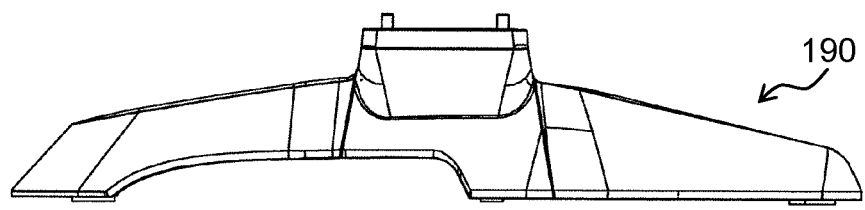
FIG. 27D is a side view schematically showing one example of an external appearance on a right side of the first support member shown in FIG. 27A.
Figure 27E:
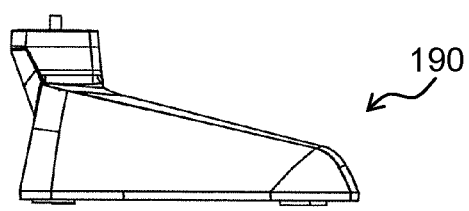
FIG. 27E is a back view schematically showing one example of an external appearance on a back side of the first support member shown in FIG. 27A.
Figure 27F:
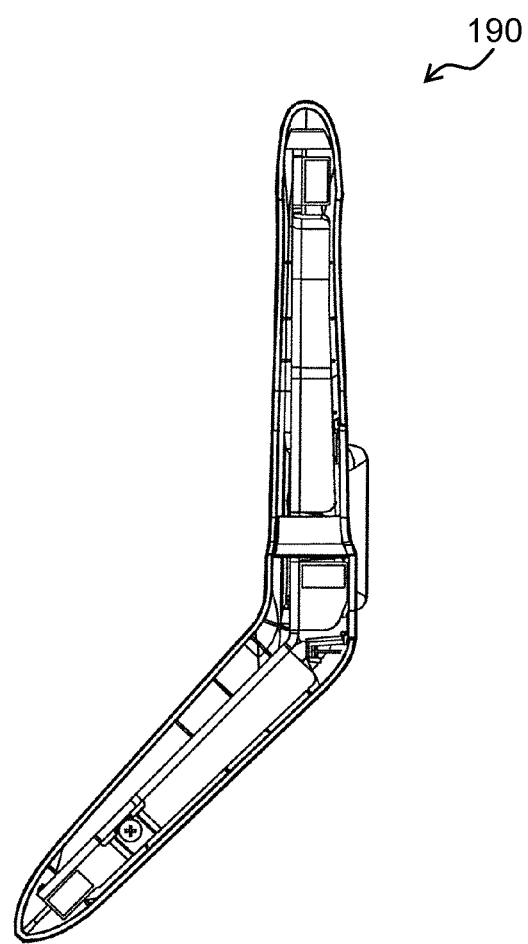
FIG. 27F is a bottom view schematically showing one example of an external appearance on a bottom side of the first support member shown in FIG. 27A.
Figure 27H:
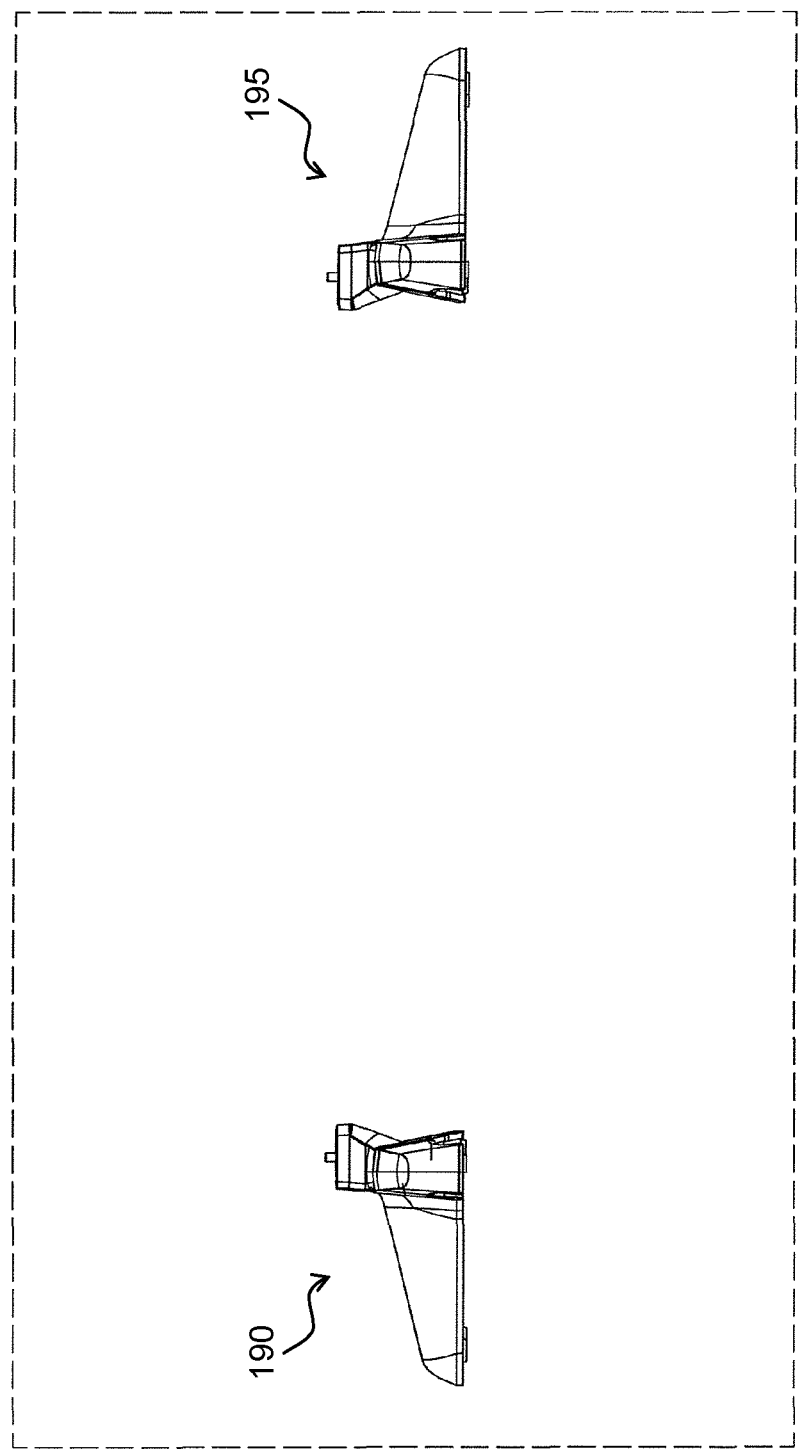
FIG. 27H is a front view schematically showing one example of an external appearance on a front side of the first support member and the second support member shown in FIG. 27G.

FIG. 27A is a top view schematically showing one example of an external appearance of first support member 190 in another exemplary embodiment. FIG. 27B is a side view schematically showing one example of an external appearance on a left side of first support member 190 shown in FIG. 27A. FIG. 27C is a front view schematically showing one example of an external appearance on a front side of first support member 190 shown in FIG. 27A. FIG. 27D is a side view schematically showing one example of an external appearance on a right side of first support member 190 shown in FIG. 27A. FIG. 27E is a back view schematically showing one example of an external appearance on a back side of first support member 190 shown in FIG. 27A. FIG. 27F is a bottom view schematically showing one example of an external appearance on a bottom side of first support member 190 shown in FIG. 27A. FIG. 27G is a perspective view schematically showing one example of an external appearance of first support member 190 shown in FIG. 27A and second support member 195. FIG. 27H is a front view schematically showing one example of an external appearance on a front side of first support member 190 and second support member 195 shown in FIG. 27G.

First support member 190 and second support member 195 illustrated in FIGS. 27A to 27H each have a shape in which a leg extends straight and is bent near a center. Accordingly, a sharp texture can be given to a user. Further, for example, as shown in FIGS. 27D and 27G, first support member 190 and second support member 195 are each provided with a depression at a bottom of the leg. With this configuration, a void is created between the leg and an installation surface. Accordingly, a floating feeling as if display panel 20 were floating can be given to the user.

Figure 28A:
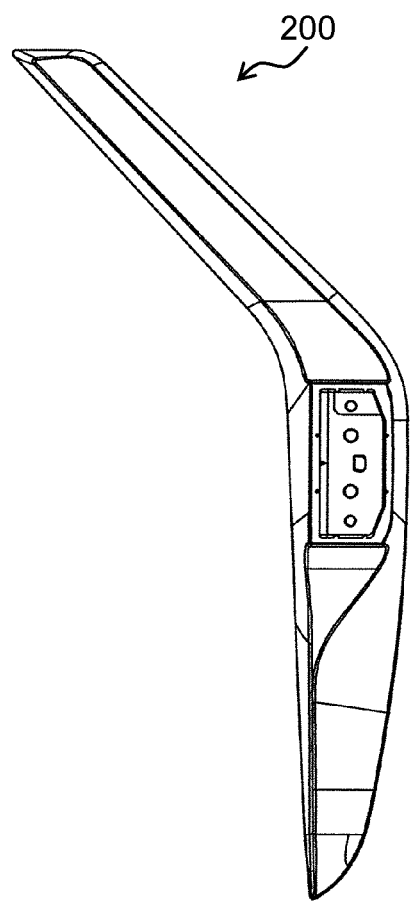
FIG. 28A is a top view schematically showing one example of an external appearance of a first support member in another exemplary embodiment.
Figure 28B:
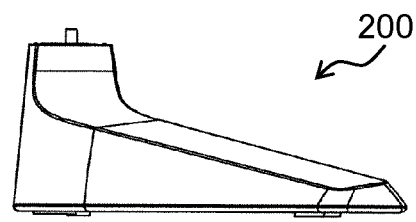
FIG. 28B is a back view schematically showing one example of an external appearance on a back side of the first support member shown in FIG. 28A.
Figure 28C:
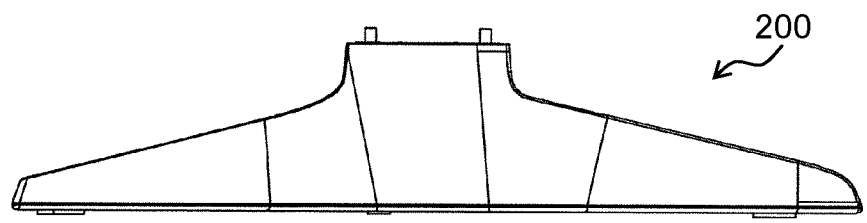
FIG. 28C is a side view schematically showing one example of an external appearance on a left side of the first support member shown in FIG. 28A.
Figure 28D:
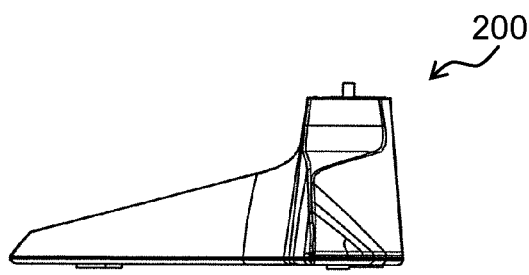
FIG. 28D is a front view schematically showing one example of an external appearance on a front side of the first support member shown in FIG. 28A.
Figure 28E:
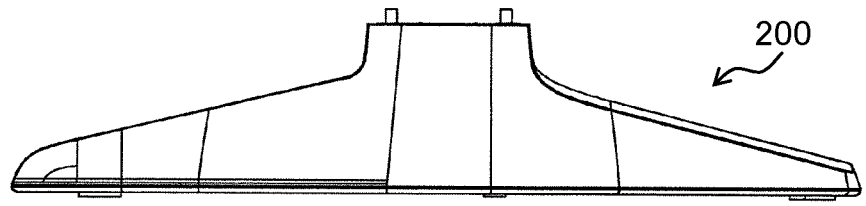
FIG. 28E is a side view schematically showing one example of an external appearance on a right side of the first support member shown in FIG. 28A.
Figure 28F:
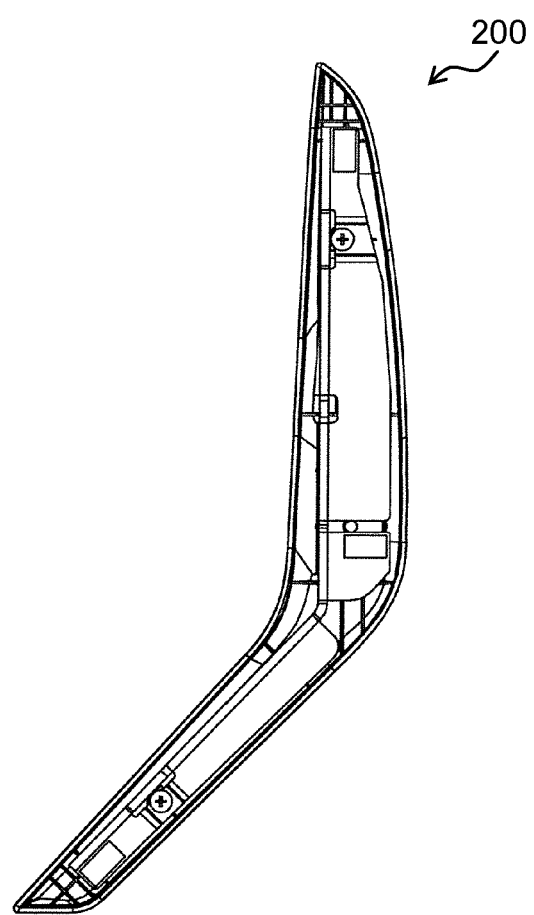
FIG. 28F is a bottom view schematically showing one example of an external appearance on a bottom side of the first support member shown in FIG. 28A.
Figure 28G:
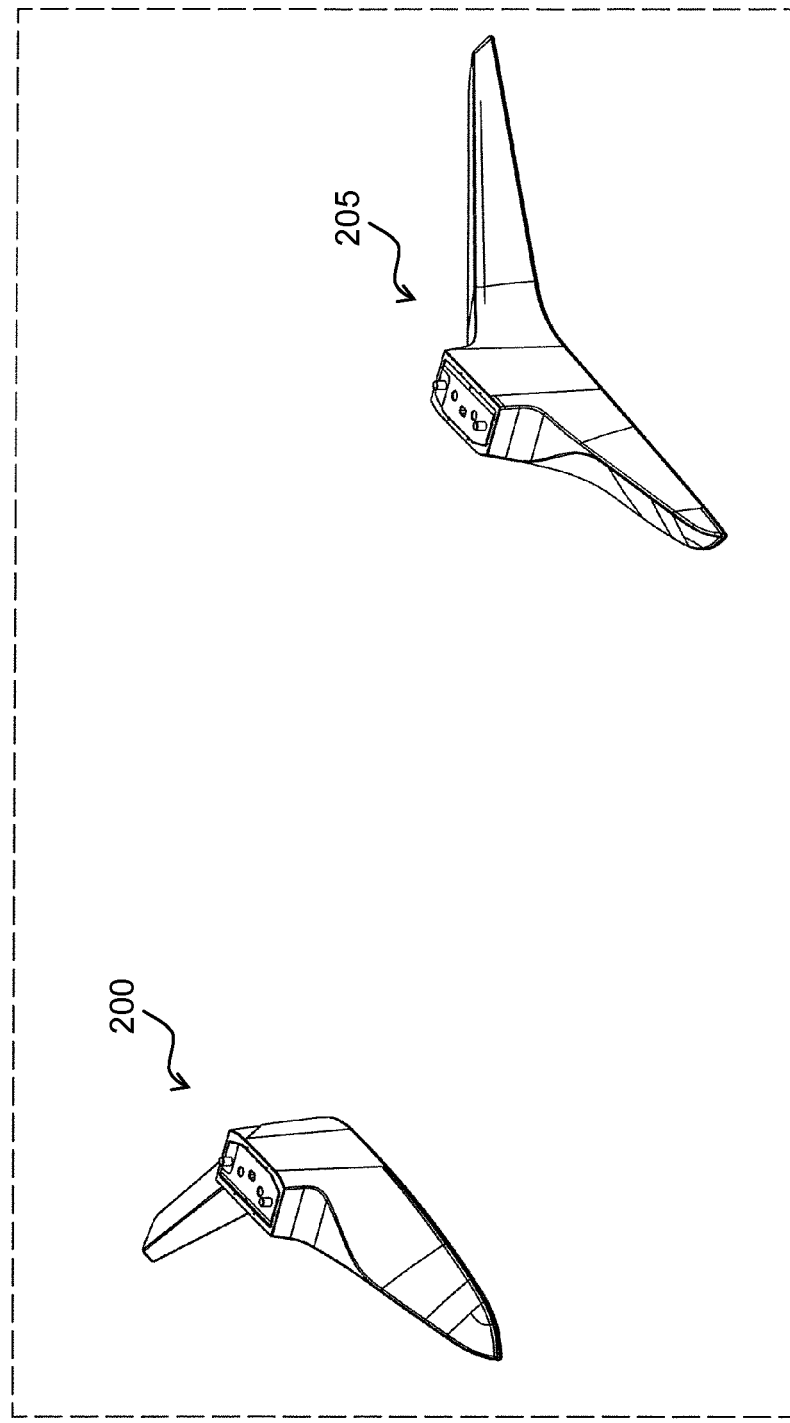
FIG. 28G is a perspective view schematically showing one example of an external appearance of the first support member shown in FIG. 28A and a second support member.
Figure 28H:
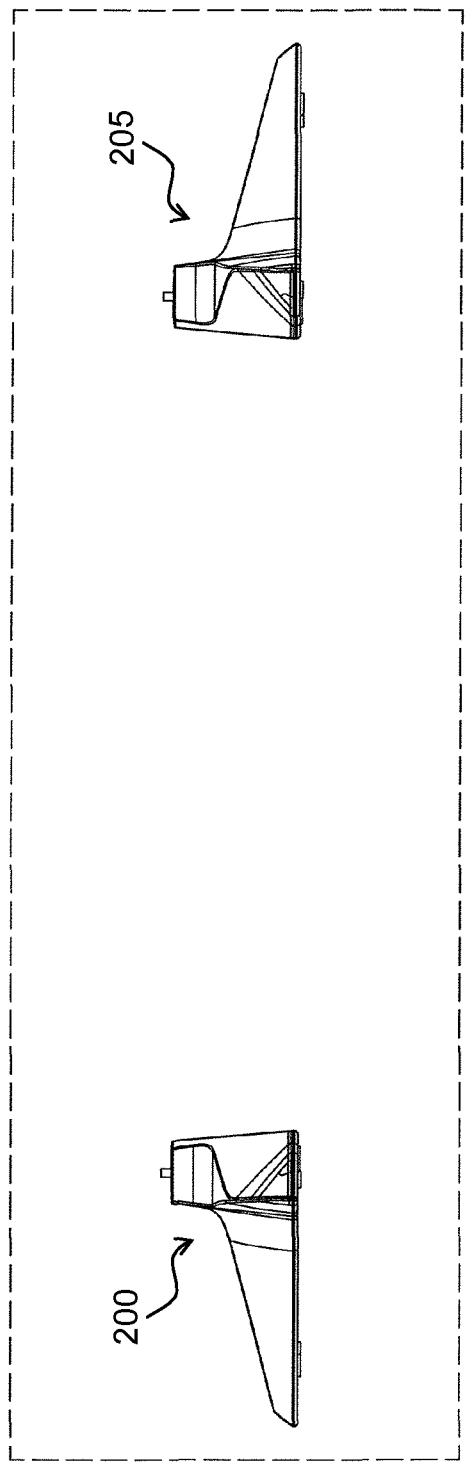
FIG. 28H is a front view schematically showing one example of an external appearance on a front side of the first support member and the second support member shown in FIG. 28G.

FIG. 28A is a top view schematically showing one example of an external appearance of first support member 200 in another exemplary embodiment. FIG. 28B is a back view schematically showing one example of an external appearance on a back side of first support member 200 shown in FIG. 28A. FIG. 28C is a side view schematically showing one example of an external appearance on a left side of first support member 200 shown in FIG. 28A. FIG. 28D is a front view schematically showing one example of an external appearance on a front side of first support member 200 shown in FIG. 28A. FIG. 28E is a side view schematically showing one example of an external appearance on a right side of first support member 200 shown in FIG. 28A. FIG. 28F is a bottom view schematically showing one example of an external appearance on a bottom side of first support member 200 shown in FIG. 28A. FIG. 28G is a perspective view schematically showing one example of an external appearance of first support member 200 shown in FIG. 28A and second support member 205. FIG. 28H is a front view schematically showing one example of an external appearance on a front side of first support member 200 and second support member 205 shown in FIG. 28G.

First support member 200 and second support member 205 illustrated in FIGS. 28A to 28H have wide and thick shapes. Accordingly, a massive feeling can be given to a user.

Figure 29A:
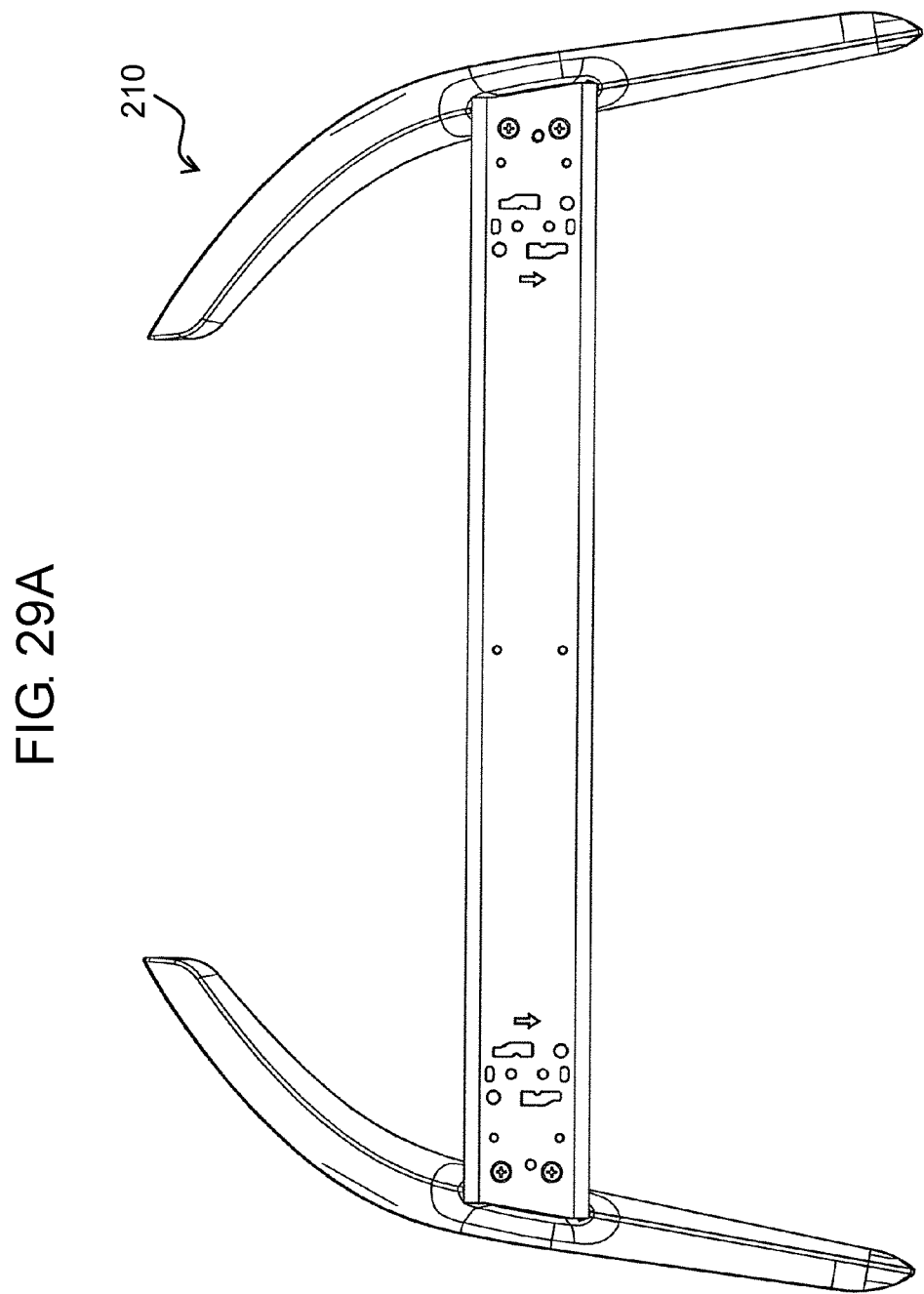
FIG. 29A is a top view schematically showing one example of an external appearance of an integrated support member in another exemplary embodiment.
Figure 29B:
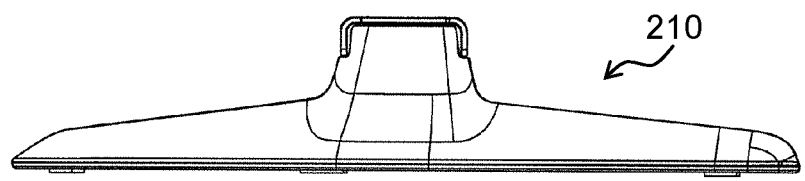
FIG. 29B is a side view schematically showing one example of an external appearance on a left side of the integrated support member shown in FIG. 29A.
Figure 29C:
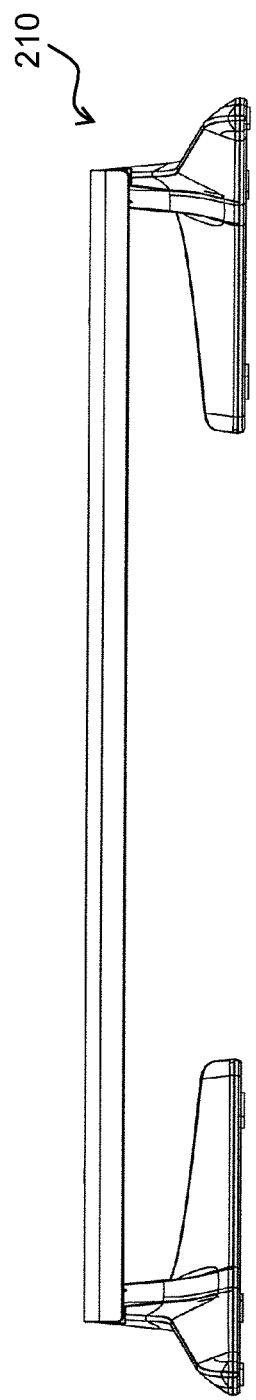
FIG. 29C is a front view schematically showing one example of an external appearance on a front side of the integrated support member shown in FIG. 29A.
Figure 29D:
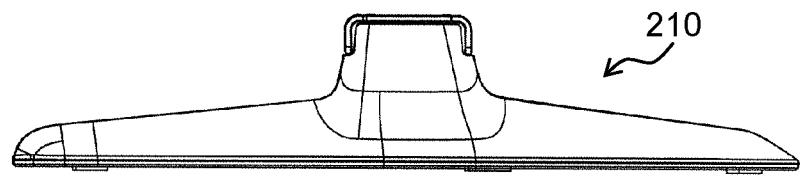
FIG. 29D is a side view schematically showing one example of an external appearance on a right side of the integrated support member shown in FIG. 29A.
Figure 29E:
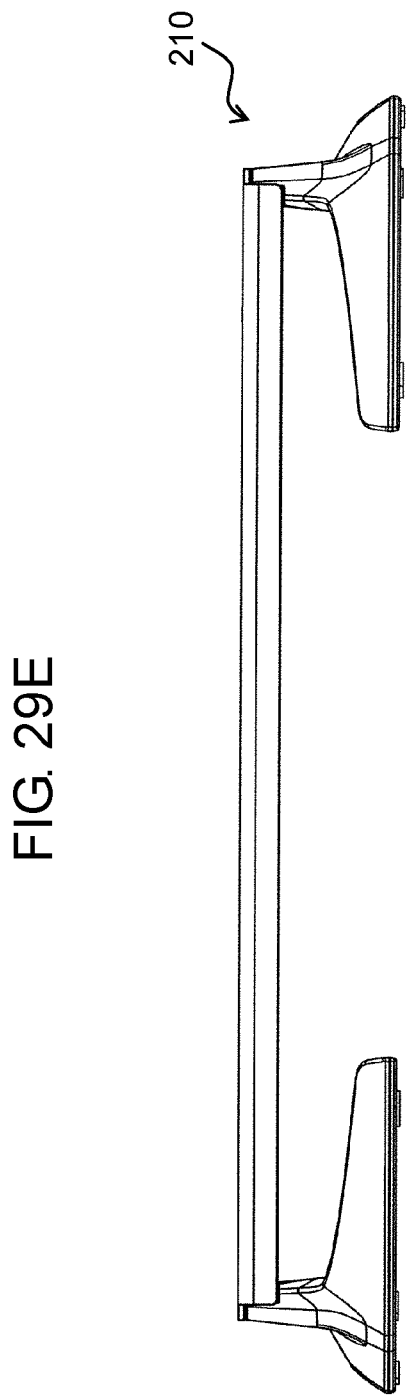
FIG. 29E is a back view schematically showing one example of an external appearance on a back side of the integrated support member shown in FIG. 29A.
Figure 29F:
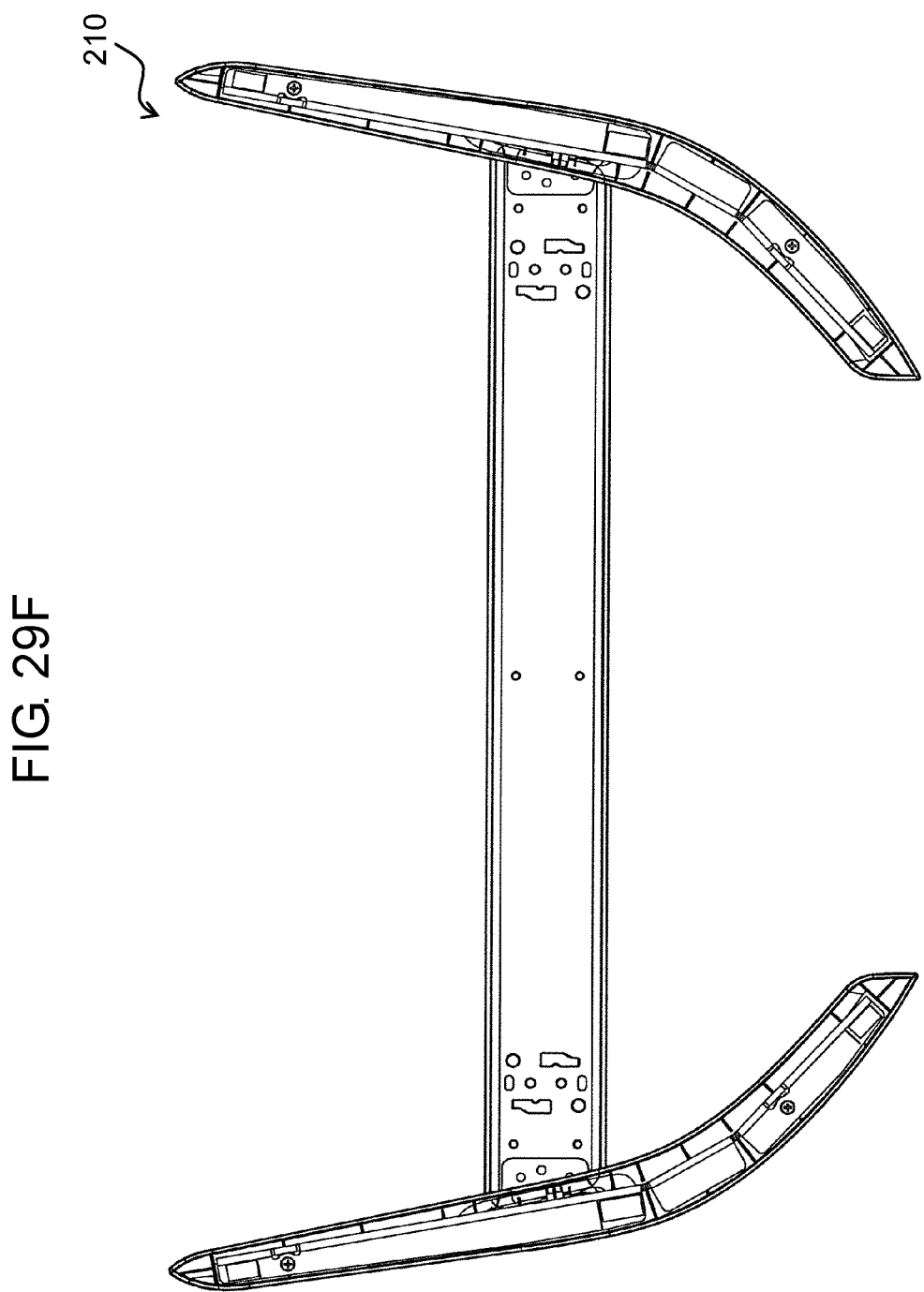
FIG. 29F is a bottom view schematically showing one example of an external appearance on a bottom side of the integrated support member shown in FIG. 29A.
Figure 29G:
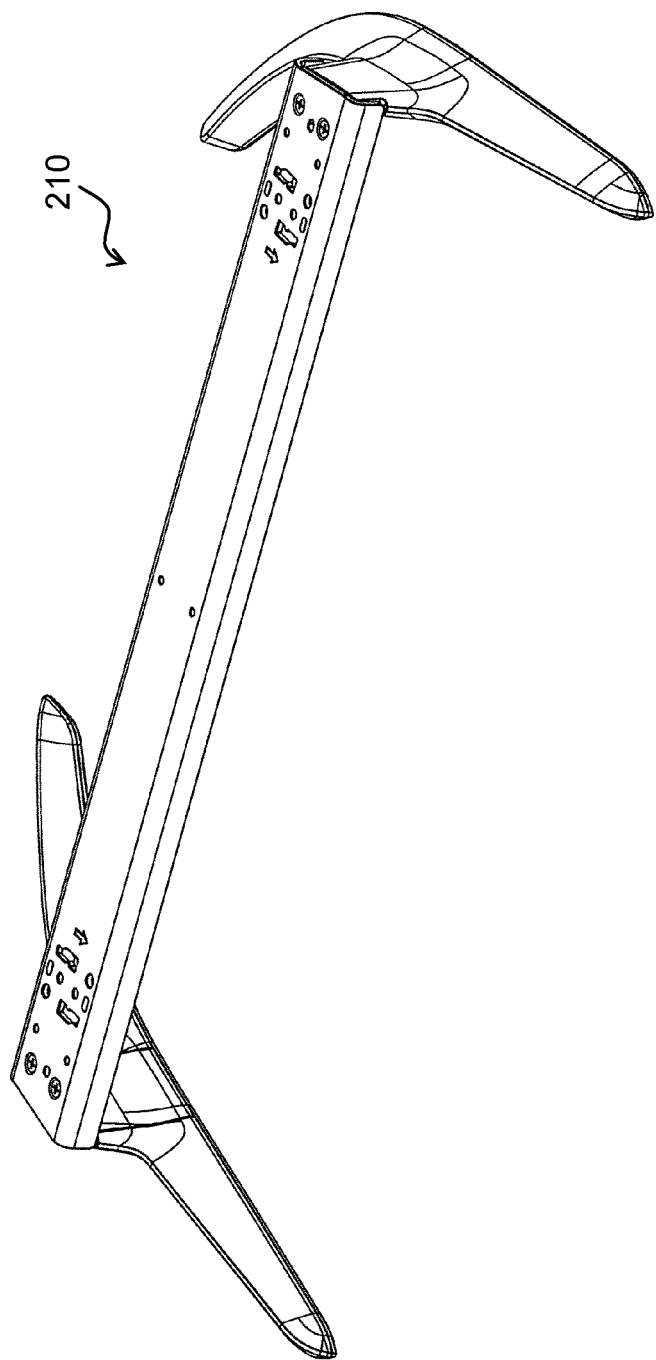
FIG. 29G is a perspective view schematically showing one example of an external appearance of the integrated support member shown in FIG. 29A.

FIG. 29A is a top view schematically showing one example of an external appearance of integrated support member 210 in another exemplary embodiment. FIG. 29B is a side view schematically showing one example of an external appearance on a left side of integrated support member 210 shown in FIG. 29A. FIG. 29C is a front view schematically showing one example of an external appearance on a front side of integrated support member 210 shown in FIG. 29A. FIG. 29D is a side view schematically showing one example of an external appearance on a right side of integrated support member 210 shown in FIG. 29A. FIG. 29E is a back view schematically showing one example of an external appearance on a back side of integrated support member 210 shown in FIG. 29A. FIG. 29F is a bottom view schematically showing one example of an external appearance on a bottom side of integrated support member 210 shown in FIG. 29A. FIG. 29G is a perspective view schematically showing one example of an external appearance of integrated support member 210 shown in FIG. 29A.

Integrated support member 210 illustrated in FIGS. 29A to 29G is structurally stable compared with a case where a support member is separated into a first support member and a second support member. Accordingly, a stable feeling can be given to a user.

Although not described in the first exemplary embodiment, for example, a sound bar (a speaker) (not shown) may be provided between first support member 30 and second support member 40 so as to have a design in which an integrated feeling of first support member 30 and second support member 40 in the image display device is given to the user.

Surfaces of first support member 30 and second support member 40 may be subjected to emboss processing, mirror-like finishing, or blasting. At this time, at least one of a color, a texture, and a material may be different between the front side and the rear side of first support member 30 and second support member 40.

In the first exemplary embodiment, the description is given of the configuration in which first fitting part 52 of first mounting member 50 has protrusion 53, and third fitting part 31 of first support member 30 has recess 33 and recess 34. However, the present disclosure is not limited to this configuration. For example, first fitting part 52 may have a recess, and third fitting part 31 may have a protrusion. Further, each of first fitting part 52 and third fitting part 31 may have a compound of a protrusion and a recess as long as first fitting part 52 and third fitting part 31 are configured to be fitted to each other. Alternatively, the shape of each fitting part is not limited to the protrusion/recess. The fitting part may have a fitting structure in another form besides the protrusion/recess. The same applies to the other fitting parts (the second fitting part, the fourth fitting part to the eighth fitting part).

In the first exemplary embodiment, the description is given of the configuration in which the positions in the up and down direction (the Z-axis direction) of respective first attachment part 70 to fourth attachment part 100 are mutually aligned at the same positions. However, the present disclosure is not limited at all to this configuration. For example, the positions in the up and down direction of second attachment part 80 and fourth attachment part 100 may be located on a lower side (that is, positions relatively close to the installation surface) than the positions in the up and down direction of first attachment part 70 and third attachment part 90. In the image display device configured in this way, for example, in a case where first attachment part 70 and third attachment part 90 are used, the position of display panel 20 is relatively close to the installation surface. Accordingly, a stable feeling can be given to the user. Further, in a case where second attachment part 80 and fourth attachment part 100 are used in this image display device, the position of display panel 20 is relatively separated upward from the installation surface. Accordingly, a floating feeling of display panel 20 can be given to the user.

In the first exemplary embodiment, the description is mainly given of the configuration example in which first mounting member 50 and first support member 30 are fitted to each other, and the configuration example in which second mounting member 60 and second support member 40 are fitted to each other. However, first mounting member 50 and second support member 40 may be fitted to each other, and second mounting member 60 and first support member 30 may be fitted to each other.

It should be noted that the numerical values, such as the angles, described in the exemplary embodiments are simply one example. The present disclosure is not limited at all to these numerical values.

As described above, the exemplary embodiments have been described to exemplify the technique in the present disclosure. The accompanying drawings and detailed description are provided for the description.

Therefore, the components described in the accompanying drawings and the detailed description may include not only the components essential for solving the problem but also components that are not essential for solving the problem in order to illustrate the techniques. For this reason, those nonessential components that are illustrated in the accompanying drawings and are described in the detailed description should not be immediately acknowledged as essential.

Further, since the above exemplary embodiments illustrate the technique in the present disclosure, various modifications, substitutions, additions and omissions can be performed within the scope of claims and equivalent scope of claims.

INDUSTRIAL APPLICABILITY

The present disclosure is applicable to an image display device. Specifically, for example, the present disclosure is applicable to a television receiver equipped with a liquid crystal panel, an EL panel, or the like, and a display for a personal computer.

REFERENCE MARKS IN THE DRAWINGS 10 image display device
20 display panel
21 liquid crystal panel
30 first support member
31 third fitting part
32 contact surface
33 recess
34 recess
35 base
36 leg
40 second support member
50 first mounting member
51 insertion part
51A screw
52 first fitting part
53 protrusion
54 screw hole
55 side wall
56 side wall
57 bottom wall
58 contact surface
59 fifth fitting part
60 second mounting member
70 first attachment part
71 groove
72 bottom wall
74 side wall
75 top wall
76 screw hole
78 first regulation part
79 guide plate
80 second attachment part
81 groove
82 bottom wall
83 side wall
85 top wall
86 second regulation part
90 third attachment part
100 fourth attachment part
110 image display device
120 first mounting member
121 second mounting member
130 first support member
130A, 131A inclination member
131 second support member
135, 137 base
136, 138 leg
140 first support member
141 seventh fitting part
142 contact surface
143 recess
145 base
146 leg
150 first mounting member
151 insertion part
155 side wall
156 side wall
157 bottom wall
160 image display device
161 first support member
162 second support member
170 integrated support member
171 base
172 leg
173 third fitting part
174 fourth fitting part
180 first support member
185 second support member
190 first support member
195 second support member
200 first support member
205 second support member
210 integrated support member

The invention claimed is:

1. An image display device comprising:
a display panel configured to display an image;
a first support member and a second support member that support the display panel in an erected state;
a first mounting member interposed by fitting between the display panel and one of the first support member and the second support member;
a second mounting member interposed by fitting between the display panel and another of the first support member and the second support member; and
a first attachment part, a second attachment part, a third attachment part, and a fourth attachment part provided on a back surface of the display panel and having first structures fitted to at least one of the first mounting member and the second mounting member, wherein:
the first attachment part, the second attachment part, the fourth attachment part, and the third attachment part are provided in this order from one end to another end in a width direction of the back surface of the display panel,
the first support member has a second structure that can be fitted to one mounting member of the first mounting member and the second mounting member, even after the first support member is reversed in a front and back direction of the display panel from a state in which the first support member is fitted to the one mounting member,
the second support member has a third structure that can be fitted to another mounting member of the first mounting member and the second mounting member, even after the second support member is reversed in the front and back direction of the display panel from a state in which the second support member is fitted to the another mounting member,
a contact surface of the first mounting member supported by one of the first support member and the second support member is inclined with respect to an installation surface, on which the image display device is installed, and
a contact surface of the second mounting member supported by another of the first support member and the second support member is inclined with respect to the installation surface.

2. The image display device according to claim 1, wherein the first support member and the second support member each have an inclination member on a surface that supports the first mounting member or the second mounting member.

3. The image display device according to claim 1, wherein the first mounting member is formed so that a sum of an inclination angle of the contact surface of the first mounting member with respect to the installation surface and an angle formed by the contact surface of the first mounting member and a surface of the first mounting member that supports the display panel is 90 degrees, and
the second mounting member is formed so that a sum of an inclination angle of the contact surface of the second mounting member with respect to the installation surface and an angle formed by the contact surface of the second mounting member and a surface of the second mounting member that supports the display panel is 90 degrees.

4. An image display device comprising:
a display panel configured to display an image;
a first support member and a second support member that support the display panel in an erected state;
a first mounting member interposed by fitting between the display panel and one of the first support member and the second support member;
a second mounting member interposed by fitting between the display panel and another of the first support member and the second support member; and
a first attachment part, a second attachment part, a third attachment part, and a fourth attachment part provided on a back surface of the display panel and having structures fitted to at least one of the first mounting member and the second mounting member, wherein:
the first attachment part, the second attachment part, the fourth attachment part, and the third attachment part are provided in this order from one end to another end in a width direction of the back surface of the display panel,
the first attachment part has a first groove, the second attachment part has a second groove, the third attachment part has a third groove, and the fourth attachment part has a fourth groove,
either of the first mounting member and the second mounting member is inserted and fitted into each of the first groove, the second groove, the third groove, and the fourth groove,
two grooves of the first groove, the second groove, the third groove, and the fourth groove each have a first regulation part that regulates insertion of the second mounting member, and
other two grooves of the first groove, the second groove, the third groove, and the fourth groove each have a second regulation part that regulates insertion of the first mounting member.

* * * * *